(12) United States Patent
Wu et al.

(10) Patent No.: US 11,630,127 B2
(45) Date of Patent: Apr. 18, 2023

(54) MULTI-LAYER, MULTI-MATERIAL MICRO-SCALE AND MILLIMETER-SCALE DEVICES WITH ENHANCED ELECTRICAL AND/OR MECHANICAL PROPERTIES

(71) Applicant: University of Southern California, Los Angeles, CA (US)

(72) Inventors: Ming Ting Wu, San Jose, CA (US); Rulon J. Larsen, III, Colorado Springs, CO (US); Young Kim, Sherman Oaks, CA (US); Kieun Kim, Los Angeles, CA (US); Adam L. Cohen, Dallas, TX (US); Ananda H. Kumar, Fremont, CA (US); Michael S. Lockard, Lake Elizabeth, CA (US); Dennis R. Smalley, Newhall, CA (US)

(73) Assignee: University of Southern California, Los Angeles, CA (US)

( * ) Notice: Subject to any disclaimer, the term of this patent is extended or adjusted under 35 U.S.C. 154(b) by 416 days.

(21) Appl. No.: 16/839,888

(22) Filed: Apr. 3, 2020

(65) Prior Publication Data
US 2020/0292579 A1    Sep. 17, 2020

Related U.S. Application Data

(60) Continuation of application No. 16/236,221, filed on Dec. 28, 2018, now Pat. No. 10,641,792, which is a
(Continued)

(51) Int. Cl.
*G01R 31/20* (2006.01)
*G01R 1/067* (2006.01)
*B32B 15/01* (2006.01)

(52) U.S. Cl.
CPC .......... *G01R 1/06761* (2013.01); *B32B 15/01* (2013.01); *Y10T 428/12486* (2015.01)

(58) Field of Classification Search
CPC ................ G01R 1/06761; B32B 15/01; Y10T 428/12486
See application file for complete search history.

(56) References Cited

U.S. PATENT DOCUMENTS 2,306,082 A    12/1942 Prest
3,240,685 A     3/1966 Maissel
(Continued)

OTHER PUBLICATIONS

Cohen, et al., "EFAB: Batch Production of Functional, Fully-Dense Metal Parts with Micron-Scale Features", Proc. 9th Solid Freeform Fabrication, The University of Texas at Austin, Aug. 1998, pp. 161-168.
(Continued)

*Primary Examiner* — Thang X Le
(74) *Attorney, Agent, or Firm* — Dennis R. Smalley

(57) ABSTRACT

Some embodiments of the invention are directed to electrochemical fabrication methods for forming structures or devices (e.g. microprobes for use in die level testing of semiconductor devices) from a core material and a shell or coating material that partially coats the surface of the structure. Other embodiments are directed to electrochemical fabrication methods for producing structures or devices (e.g. microprobes) from a core material and a shell or coating material that completely coats the surface of each layer from which the probe is formed including interlayer regions. Additional embodiments of the invention are directed to electrochemical fabrication methods for forming structures or devices (e.g. microprobes) from a core material and a shell or coating material wherein the coating material is located around each layer of the structure without locating the coating material in inter-layer regions.

18 Claims, 17 Drawing Sheets

Related U.S. Application Data division of application No. 14/986,500, filed on Dec. 31, 2015, now Pat. No. 10,215,775, which is a continuation of application No. 14/017,535, filed on Sep. 4, 2013, now Pat. No. 9,671,429, which is a continuation of application No. 12/906,970, filed on Oct. 18, 2010, now Pat. No. 8,613,846.

(60) Provisional application No. 61/252,633, filed on Oct. 16, 2009.

(56) References Cited

U.S. PATENT DOCUMENTS

| | | | |
|---|---|---|---|
| 3,697,401 | A | 10/1972 | Lucas et al. |
| 3,723,197 | A | 3/1973 | Buschow et al. |
| 3,745,105 | A | 7/1973 | Kosowsky et al. |
| 3,832,632 | A | 8/1974 | Ardezzone |
| 3,835,017 | A | 9/1974 | Mentone et al. |
| 3,874,855 | A | 4/1975 | Legrand |
| 3,926,916 | A | 12/1975 | Mastrangelo |
| 4,043,891 | A | 8/1977 | Alkire et al. |
| 4,080,267 | A | 3/1978 | Castellani et al. |
| 4,126,533 | A | 11/1978 | Lukyanchikov et al. |
| 4,155,815 | A | 5/1979 | Francis et al. |
| 4,187,553 | A | 2/1980 | Ahn et al. |
| 4,294,669 | A | 10/1981 | Lincoln et al. |
| 4,298,436 | A | 11/1981 | Thomas |
| 4,370,941 | A | 2/1983 | Belton |
| 4,376,017 | A | 3/1983 | Urion |
| 4,404,080 | A | 9/1983 | Jahani |
| 4,452,684 | A | 6/1984 | Palnik |
| 4,537,647 | A | 8/1985 | Foster |
| 4,575,330 | A | 3/1986 | Hull |
| 4,600,555 | A | 7/1986 | Shimizu |
| 4,752,352 | A | 6/1988 | Feygin |
| 4,764,449 | A | 8/1988 | Vanlseghem |
| 4,770,754 | A | 9/1988 | Meuldijk et al. |
| 4,920,639 | A | 5/1990 | Yee |
| 4,921,583 | A | 5/1990 | Sewell et al. |
| 4,954,192 | A | 9/1990 | Dziekan |
| 4,961,052 | A | 10/1990 | Tada et al. |
| 4,961,154 | A | 10/1990 | Pomerantz et al. |
| 4,985,116 | A | 1/1991 | Mettler et al. |
| 5,011,580 | A | 4/1991 | Pan et al. |
| 5,020,219 | A | 6/1991 | Leedy |
| 5,059,359 | A | 10/1991 | Hull et al. |
| 5,070,297 | A * | 12/1991 | Kwon ............ G01R 31/31905 324/754.03 |
| 5,177,438 | A | 1/1993 | Littlebury et al. |
| 5,190,637 | A | 3/1993 | Guckel |
| 5,209,817 | A | 5/1993 | Ahmad et al. |
| 5,209,878 | A | 5/1993 | Smalley et al. |
| 5,271,822 | A | 12/1993 | Nolan et al. |
| 5,273,691 | A | 12/1993 | Hull et al. |
| 5,301,415 | A | 4/1994 | Prinz et al. |
| 5,321,685 | A | 6/1994 | Nose et al. |
| 5,369,881 | A | 12/1994 | Inaba et al. |
| 5,378,583 | A | 1/1995 | Guckel et al. |
| 5,395,508 | A | 3/1995 | Jolly et al. |
| 5,413,668 | A | 5/1995 | Aslam et al. |
| 5,435,902 | A | 7/1995 | Andre |
| 5,436,412 | A | 7/1995 | Ahmad et al. |
| 5,472,539 | A | 12/1995 | Saia et al. |
| 5,478,699 | A | 12/1995 | Blessington et al. |
| 5,501,784 | A | 3/1996 | Lessmo/ Ilmann et al. |
| 5,512,162 | A | 4/1996 | Sachs et al. |
| 5,512,163 | A | 4/1996 | Warfield |
| 5,513,430 | A | 5/1996 | Yanof et al. |
| 5,560,837 | A | 10/1996 | Trueba |
| 5,596,504 | A | 1/1997 | Tata et al. |
| 5,605,614 | A | 2/1997 | Bornand |
| 5,614,075 | A | 3/1997 | Andre |
| 5,641,391 | A | 6/1997 | Hunter et al. |
| 5,686,689 | A | 11/1997 | Snedeker et al. |
| 5,700,607 | A | 12/1997 | Rath et al. |
| 5,766,441 | A | 6/1998 | Arndt et al. |
| 5,772,451 | A | 6/1998 | Dozier et al. |
| 5,805,971 | A | 9/1998 | Akedo |
| 5,806,181 | A | 9/1998 | Khandros et al. |
| 5,820,014 | A | 10/1998 | Dozier et al. |
| 5,829,128 | A | 11/1998 | Eldridge et al. |
| 5,832,834 | A | 11/1998 | Nishino et al. |
| 5,874,011 | A | 2/1999 | Ehrlich |
| 5,876,424 | A | 3/1999 | O |
| 5,917,707 | A | 6/1999 | Khandros et al. |
| 5,945,058 | A | 8/1999 | Manners et al. |
| 5,974,662 | A | 11/1999 | Eldridge et al. |
| 5,994,152 | A | 11/1999 | Khandros et al. |
| 5,999,184 | A | 12/1999 | Smalley et al. |
| 6,016,000 | A | 1/2000 | Moslehi |
| 6,019,784 | A | 2/2000 | Hines |
| 6,023,103 | A | 2/2000 | Chang et al. |
| 6,027,630 | A * | 2/2000 | Cohen ............... B33Y 70/00 205/135 |
| 6,029,096 | A | 2/2000 | Manners et al. |
| 6,043,563 | A | 3/2000 | Eldridge et al. |
| 6,044,548 | A | 4/2000 | Distefano et al. |
| 6,064,213 | A | 5/2000 | Khandros et al. |
| 6,197,180 | B1 | 3/2001 | Kelly |
| 6,208,225 | B1 | 3/2001 | Miller |
| 6,218,910 | B1 | 4/2001 | Miller |
| 6,268,015 | B1 * | 7/2001 | Mathieu .............. H01L 24/11 427/98.5 |
| 6,268,261 | B1 * | 7/2001 | Petrarca ............ H01L 21/764 257/E21.573 |
| 6,289,781 | B1 | 9/2001 | Cohen |
| 6,333,741 | B1 | 12/2001 | Snead et al. |
| 6,413,852 | B1 | 7/2002 | Grill et al. |
| 6,441,315 | B1 | 8/2002 | Eldridge et al. |
| 6,456,099 | B1 | 9/2002 | Eldridge et al. |
| 6,475,369 | B1 | 11/2002 | Cohen |
| 6,482,013 | B2 | 11/2002 | Eldridge et al. |
| 6,483,328 | B1 | 11/2002 | Eldridge et al. |
| 6,499,216 | B1 | 12/2002 | Fjelstad |
| 6,509,751 | B1 | 1/2003 | Mathieu et al. |
| 6,520,778 | B1 | 2/2003 | Eldridge et al. |
| 6,539,531 | B2 | 3/2003 | Miller et al. |
| 6,586,955 | B2 * | 7/2003 | Fjelstad ............ G01R 1/07314 324/754.07 |
| 6,596,624 | B1 | 7/2003 | Romankiw |
| 6,627,483 | B2 | 9/2003 | Ondricek et al. |
| 6,640,415 | B2 | 11/2003 | Eslamy et al. |
| 6,672,875 | B1 | 1/2004 | Mathieu et al. |
| 6,690,185 | B1 | 2/2004 | Khandros et al. |
| 6,690,186 | B2 | 2/2004 | Fjelstad |
| 6,705,876 | B2 | 3/2004 | Eldridge |
| 6,713,374 | B2 | 3/2004 | Eldridge et al. |
| 6,729,019 | B2 | 5/2004 | Grube et al. |
| 6,773,938 | B2 * | 8/2004 | Wood ............... H05K 3/4007 324/756.03 |
| 6,790,377 | B1 | 9/2004 | Cohen |
| 6,817,052 | B2 | 11/2004 | Grube |
| 6,838,893 | B2 | 1/2005 | Khandros, Jr. et al. |
| 6,838,894 | B2 | 1/2005 | MacIntyre |
| 6,913,468 | B2 | 7/2005 | Dozier, II et al. |
| 7,142,000 | B2 | 11/2006 | Eldridge et al. |
| 7,195,989 | B2 | 3/2007 | Lockard et al. |
| 7,239,219 | B2 | 7/2007 | Brown et al. |
| 7,252,861 | B2 | 8/2007 | Smalley |
| 7,265,565 | B2 | 9/2007 | Chen et al. |
| 7,271,888 | B2 | 9/2007 | Frodis et al. |
| 7,287,322 | B2 | 10/2007 | Mathieu et al. |
| 7,412,767 | B2 | 8/2008 | Kim et al. |
| 7,498,714 | B2 | 3/2009 | Lockard et al. |
| 7,527,721 | B2 | 5/2009 | Lembrikov et al. |
| 7,531,077 | B2 | 5/2009 | Cohen et al. |
| 7,533,462 | B2 | 5/2009 | Gleason et al. |
| 7,579,848 | B2 * | 8/2009 | Bottoms ............ G01R 1/07378 324/762.01 |
| 7,640,651 | B2 | 1/2010 | Cohen et al. |
| 7,798,822 | B2 | 9/2010 | Eldridge et al. |
| 8,613,846 | B2 | 12/2013 | Wu et al. |
| 9,671,429 | B2 | 6/2017 | Wu et al. |
| 10,215,775 | B2 | 2/2019 | Wu et al. |

(56) References Cited

U.S. PATENT DOCUMENTS

| | | |
|---|---|---|
| 10,641,792 B2 | 5/2020 | Wu et al. |
| 2003/0143492 A1 | 7/2003 | Sexton |
| 2003/0161750 A1 | 8/2003 | Moxson et al. |
| 2003/0186405 A1 | 10/2003 | Lee et al. |
| 2004/0004001 A1 | 1/2004 | Cohen et al. |
| 2004/0007470 A1 | 1/2004 | Smalley |
| 2004/0072452 A1 | 4/2004 | Eldridge et al. |
| 2004/0112637 A1 | 6/2004 | Kim et al. |
| 2005/0029109 A1 | 2/2005 | Zhang et al. |
| 2005/0029225 A1 | 2/2005 | Zhang |
| 2005/0032375 A1 | 2/2005 | Lockard et al. |
| 2005/0045585 A1 | 3/2005 | Zhang et al. |
| 2005/0067292 A1 | 3/2005 | Thompson et al. |
| 2005/0072681 A1 | 4/2005 | Cohen et al. |
| 2005/0142846 A1 | 6/2005 | Frodis et al. |
| 2005/0148214 A1 | 7/2005 | Mathieu et al. |
| 2005/0162177 A1* | 7/2005 | Chou ............ G01R 1/0675 324/755.02 |
| 2005/0179458 A1 | 8/2005 | Chen et al. |
| 2005/0184748 A1 | 8/2005 | Chen et al. |
| 2005/0202667 A1 | 9/2005 | Cohen et al. |
| 2005/0215023 A1 | 9/2005 | Cohen et al. |
| 2005/0230261 A1 | 10/2005 | Cohen et al. |
| 2006/0006888 A1 | 1/2006 | Kruglick et al. |
| 2006/0030179 A1* | 2/2006 | Van Schuylenbergh ............ H01R 13/6477 257/E23.078 |
| 2006/0071677 A1 | 4/2006 | Feigenbaum et al. |
| 2006/0108678 A1 | 5/2006 | Kumar et al. |
| 2006/0216920 A1 | 9/2006 | Kojima |
| 2006/0226015 A1 | 10/2006 | Smalley et al. |
| 2006/0238209 A1 | 10/2006 | Chen et al. |
| 2008/0050524 A1 | 2/2008 | Kumar et al. |
| 2008/0121343 A1 | 5/2008 | Cohen et al. |
| 2010/0051466 A1 | 3/2010 | Smalley et al. |

OTHER PUBLICATIONS

Adam L. Cohen, et al., "EFAB: Rapid, Low-Cost Desktop Micromachining of High Aspect Ratio True 3-D MEMS", Proc. 12th IEEE Micro Electro Mechanical Systems Workshop, IEEE, Jan. 17-21, 1999, pp. 244-251.

"Microfabrication—Rapid Prototyping's Killer Application", Rapid Prototyping Report, CAD/CAM Publishing, Inc., Jun. 1999, pp. 1-5.

Adam L. Cohen, "3-D Micromachining by Electrochemical Fabrication", Micromachine Devices, Mar. 1999, pp. 6-7.

Gang Zhang, et al., "EFAB: Rapid Desktop Manufacturing of True 3-D Microstructures", Proc. 2nd International Conference on Integrated MicroNanotechnology for Space Applications, The Aerospace Co., Apr. 1999.

F. Tseng, et al., "EFAB: High Aspect Ratio, Arbitrary 3-D Metal Microstructures Using a Low-Cost Automated Batch Process", 3rd International Workshop on High Aspect Ratio Microstructure Technology (HARMST'99), Jun. 1999.

Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.

F. Tseng, et al., "EFAB: High Aspect Ratio, Arbitrary 3-D Metal Microstructures Using a Low-Cost Automated Batch Process", MEMS Symposium, ASME 1999 International Mechanical Engineering Congress and Exposition, Nov. 1999, pp. 55-60.

Adam L. Cohen, "Electrochemical Fabrication (EFABTM)", Chapter 19 of the MEMS Handbook, edited by Mohamed Gad-El-Hak, CRC Press, 2002, pp. 19/1-19/23.

CRC Handbook of Chemistry and Physics, 93rd Ed. 2012-2013, p. (12-41)-(12-42).

Dixit et al., "Chapter 2, Overview of Interconnect-Copper and Low-k Integration" in Handbook of Semiconductor Manufacturing Technology, Second Edition, pp. 2-1 to 2-15, 2007.

Hill, Dr. Steve, "An E-FAB Way for Making the Micro World", Materials World is the journal of the Institute of Materials, Sep. 1999, vol. 7, No. 9, pp. 538-539.

Kumar, et al., "Features of gold having micrometer to centimeter dimensions can be formed through a combination of stamping with an elastomeric stamp . . . " Appln. Phys. Lett., Jul. 1993, 63(14):2002-2004.

Madden, John D. et al., "Three-Dimensional Microfabrication by Localized, Electrochemical Deposition", J. of Micro. Sys., Mar. 1996, 5(1):24-32.

Marques, et al., "Fabrication of High-Aspect-Ratio Microstructures on Planar and Nonplanar Surfaces Using a Modified LIGA Process", Dec. 1997, 6(4):329-336.

Nikolay V. Vasilyev, et al., "Beating-Heart Pach Closure of Muscular Ventricular Septal Defects Under Real-Time Three Dimensional Echocardiographic Guidance: A Preclinical Study", J. Thorac, Cardiovas. Surg., 2008, pp. 603-609, vol. 153, No. 3, The American Association of Thoracic Surgery.

Nikolay V. Vasilyev, et al., "Three Dimensional Echo and Videocardioscopy-Guided Atrial Septal Defect Closure", Ann. Thorac. Surg., 2006, pp. 1322-1326, vol. 82, The Society of Thoracic Surgeons.

Osterberg, Peter M., et al., "MEMBUILDER: An Automated 3D Solid Model Construction Program for Microelectromechanical Structures", The 8th Int'l Conference on Solid-State Sensors and Actuators, and Eurosensors IX; Jun. 25-29, 1995; pp. 21-24; Stockholm, Sweden.

Taylor, et al., "'Spatial Forming' A Three Dimensional Printing Process", IEEE, 1995, pp. 203-208.

* cited by examiner

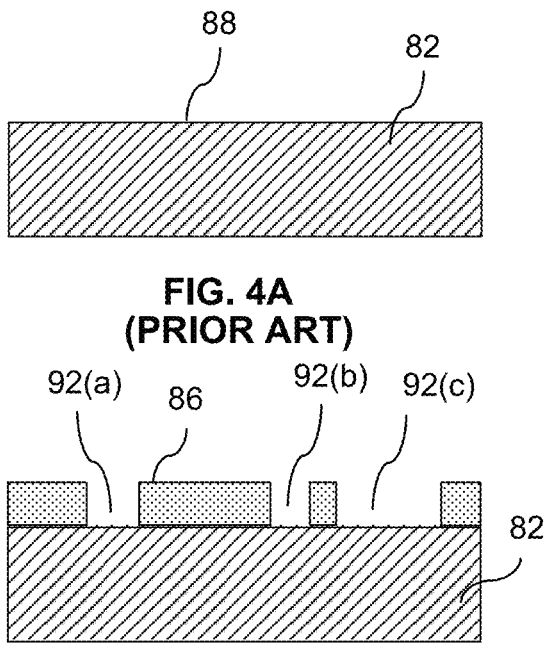
FIG. 4A (PRIOR ART)
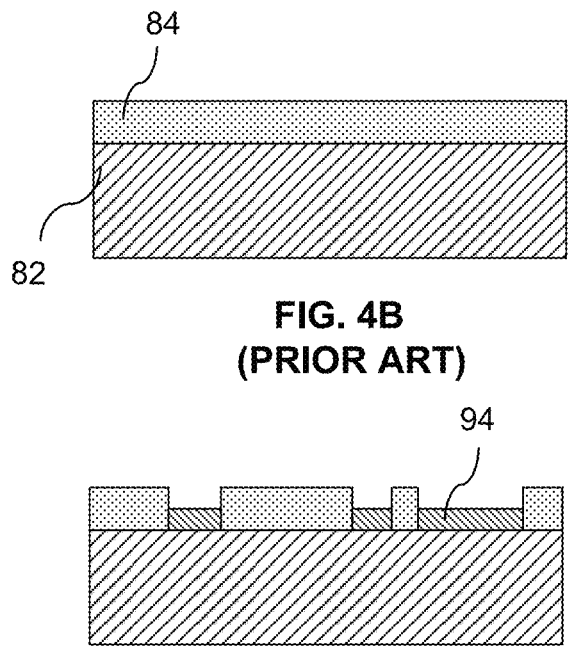
FIG. 4B (PRIOR ART)
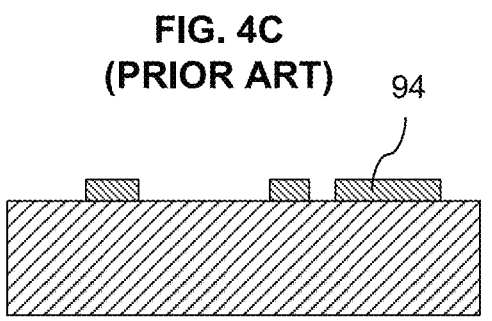
FIG. 4C (PRIOR ART)
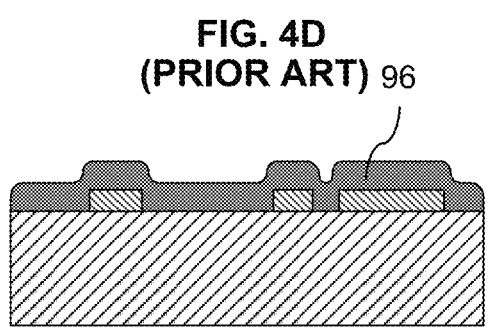
FIG. 4D (PRIOR ART)
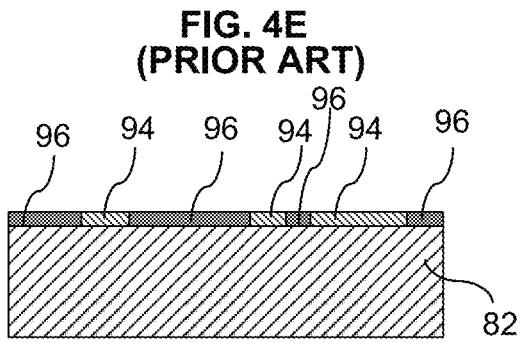
FIG. 4E (PRIOR ART)
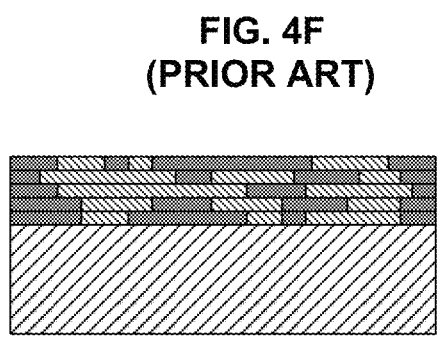
FIG. 4F (PRIOR ART)
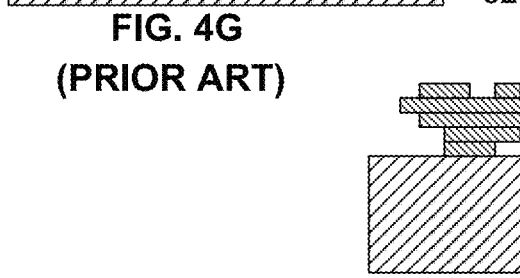
FIG. 4G (PRIOR ART)
FIG. 4H (PRIOR ART)
FIG. 4I (PRIOR ART)

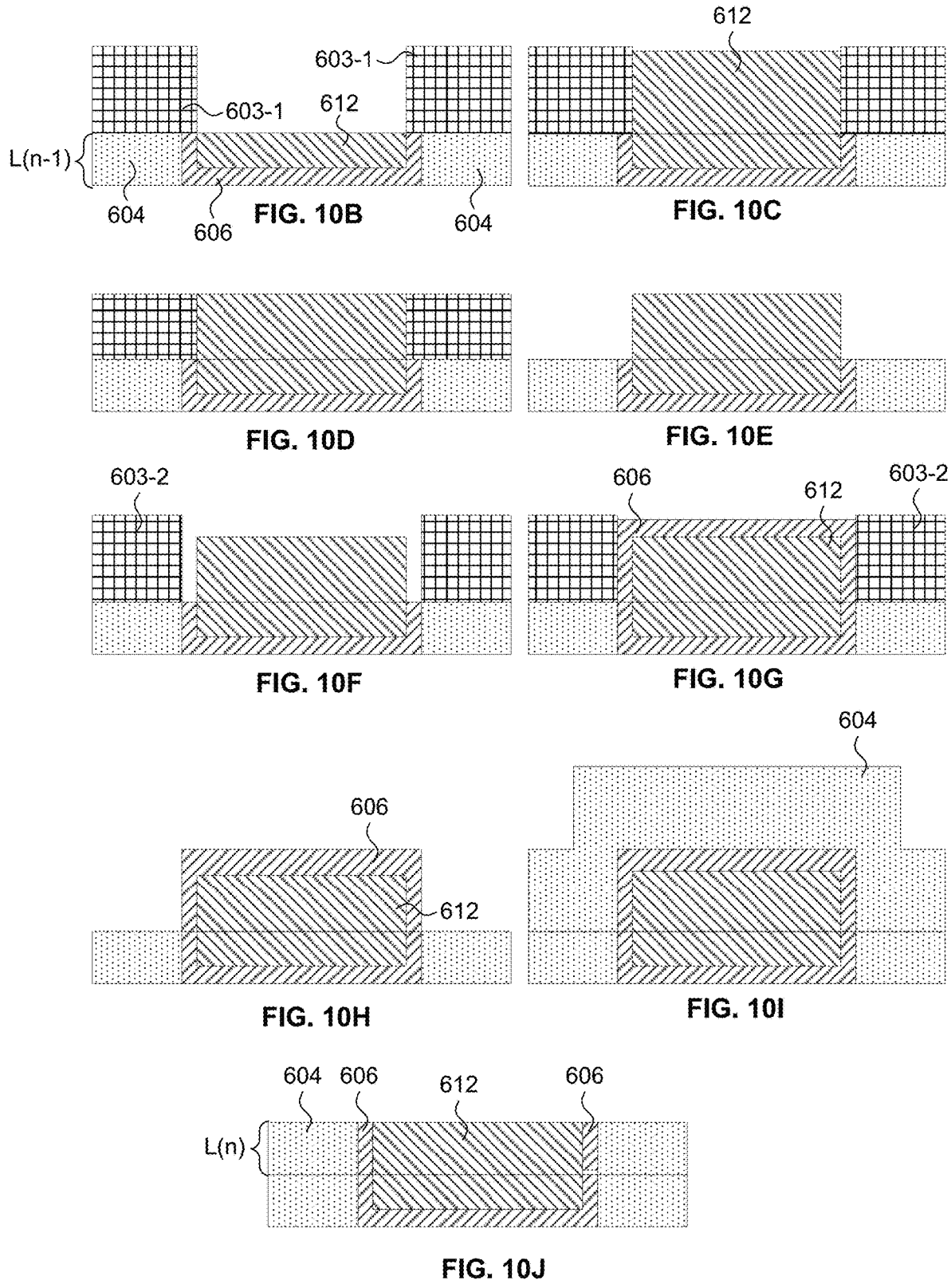

MULTI-LAYER, MULTI-MATERIAL MICRO-SCALE AND MILLIMETER-SCALE DEVICES WITH ENHANCED ELECTRICAL AND/OR MECHANICAL PROPERTIES

RELATED APPLICATIONS

The below table sets forth the priority claims for the instant application along with filing dates, patent numbers, and issue dates as appropriate. Each of these applications, including any appendices attached thereto, is incorporated herein by reference as if set forth in full herein.

| App. No. | Continuity Type | App. No. | Which was Filed (YYYY-MM-DD) | Which is now | Which issued on | Dkt No. Fragment |
|---|---|---|---|---|---|---|
| This application | is a CNT of | 16/236,221 | 2018 Dec. 28 | U.S. Pat. No. 10,641,792 | 2020 May 5 | 296-E |
| 16/236,221 | is a DIV of | 14/986,500 | 2015 Dec. 31 | U.S. Pat. No. 10,215,775 | 2019 Feb. 26 | 296-D |
| 14/986,500 | is a CNT of | 14/017,535 | 2013 Sep. 4 | U.S. Pat. No. 9,671,429 | 2017 Jun. 6 | 296-C |
| 14/986,500 | is a CIP of | 12/431,680 | 2009 Apr. 28 | U.S. Pat. No. 9,244,101 | 2016 Jan. 26 | 138-C |
| 14/017,535 | is a CNT of | 12/906,970 | 2010 Oct. 18 | U.S. Pat. No. 8,613,846 | 2013 Dec. 24 | 296-A |
| 12/906,970 | claims benefit of | 61/252,633 | 2009 Oct. 16 | expired | — | 276-A |

Furthermore, the following U.S. Patent Applications are incorporated herein by reference as if set forth in full: U.S. patent application Ser. No. 11/139,262, filed May 26, 2005; U.S. patent application Ser. No. 12/431,680, filed Apr. 28, 2009, now issued as U.S. Pat. No. 9,244,101; U.S. patent application Ser. No. 11/029,221, filed Jan. 3, 2005, now issued as U.S. Pat. No. 7,531,077; U.S. Patent Application No. 60/574,733, filed May 26, 2004; U.S. Patent Application No. 60/468,979, filed May 7, 2003; U.S. Patent Application No. 60/469,053, filed May 7, 2003; U.S. Patent Application No. 60/533,891, filed Dec. 31, 2003; U.S. Patent Application No. 60/533,897, filed Dec. 31, 2003; U.S. Patent Application No. 60/533,975, filed Dec. 31, 2003; U.S. Patent Application No. 60/533,947, filed Dec. 31, 2003; U.S. Patent Application No. 60/533,948, filed Dec. 31, 2003; and U.S. Patent Application No. 60/540,510, filed Jan. 29, 2004.

FIELD OF THE INVENTION

The present invention relates generally to the field of Electrochemical Fabrication and the associated formation of three-dimensional structures (e.g. microscale or millimeter scale structures). In particular, some embodiments are focused on the electrochemical fabrication of multilayer, multi-material devices (e.g. probe elements for use as compliant electronic contact elements) that are configured to have improved properties (e.g. electrical properties, thermal properties, and/or mechanical properties).

BACKGROUND OF THE INVENTION

An electrochemical fabrication technique for forming three-dimensional structures from a plurality of adhered layers is being commercially pursued by Microfabrica® Inc. (formerly MEMGen Corporation) of Van Nuys, Calif. under the name EFAB®.

Various electrochemical fabrication techniques were described in U.S. Pat. No. 6,027,630, issued on Feb. 22, 2000 to Adam Cohen. Some embodiments of this electrochemical fabrication technique allow the selective deposition of a material using a mask that includes a patterned conformable material on a support structure that is independent of the substrate onto which plating will occur. When desiring to perform an electrodeposition using the mask, the conformable portion of the mask is brought into contact with a substrate, but not adhered or bonded to the substrate, while in the presence of a plating solution such that the contact of the conformable portion of the mask to the substrate inhibits deposition at selected locations. For convenience, these masks might be generically called conformable contact masks; the masking technique may be generically called a conformable contact mask plating process. More specifically, in the terminology of Microfabrica Inc. such masks have come to be known as INSTANT MASKS™ and the process known as INSTANT MASKING™ or INSTANT MASK™ plating. Selective depositions using conformable contact mask plating may be used to form single selective deposits of material or may be used in a process to form multi-layer structures. The teachings of the '630 patent are hereby incorporated herein by reference as if set forth in full herein. Since the filing of the patent application that led to the above noted patent, various papers about conformable contact mask plating (i.e. INSTANT MASKING) and electrochemical fabrication have been published:

(1) A. Cohen, G. Zhang, F. Tseng, F. Mansfeld, U. Frodis and P. Will, "EFAB: Batch production of functional, fully-dense metal parts with micro-scale features", Proc. 9th Solid Freeform Fabrication, The University of Texas at Austin,p 161, August 1998.

(2) A. Cohen, G. Zhang, F. Tseng, F. Mansfeld, U. Frodis and P. Will, "EFAB: Rapid, Low-Cost Desktop Micromachining of High Aspect Ratio True 3-D MEMS", Proc. 12th IEEE Micro Electro Mechanical Systems Workshop, IEEE,p 244, January 1999.

(3) A. Cohen, "3-D Micromachining by Electrochemical Fabrication", Micromachine Devices, March 1999.

(4) G. Zhang, A. Cohen, U. Frodis, F. Tseng, F. Mansfeld, and P. Will, "EFAB: Rapid Desktop Manufacturing of True 3-D Microstructures", Proc. 2nd International Conference on Integrated MicroNanotechnology for Space Applications, The Aerospace Co., April 1999.

(5) F. Tseng, U. Frodis, G. Zhang, A. Cohen, F. Mansfeld, and P. Will, "EFAB: High Aspect Ratio, Arbitrary 3-D Metal Microstructures using a Low-Cost Automated Batch Process", 3rd International Workshop on High Aspect Ratio MicroStructure Technology (HARMST'99), June 1999.

(6) A. Cohen, U. Frodis, F. Tseng, G. Zhang, F. Mansfeld, and P. Will, "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, September 1999.

(7) F. Tseng, G. Zhang, U. Frodis, A. Cohen, F. Mansfeld, and P. Will, "EFAB: High Aspect Ratio, Arbitrary 3-D Metal Microstructures using a Low-Cost Automated Batch Process", MEMS Symposium, ASME 1999 International Mechanical Engineering Congress and Exposition, November, 1999.

(8) A. Cohen, "Electrochemical Fabrication (EFAB™)", Chapter 19 of The MEMS Handbook, edited by Mohamed Gad-El-Hak, CRC Press, 2002.

(9) Microfabrication—Rapid Prototyping's Killer Application", pages 1-5 of the Rapid Prototyping Report, CAD/CAM Publishing, Inc., June 1999.

The disclosures of these nine publications are hereby incorporated herein by reference as if set forth in full herein.

An electrochemical deposition process for forming multilayer structures may be carried out in a number of different ways as set forth in the above patent and publications. In one form, this process involves the execution of three separate operations during the formation of each layer of the structure that is to be formed:

1. Selectively depositing at least one material by electrodeposition upon one or more desired regions of a substrate. Typically this material is either a structural material or a sacrificial material.

2. Then, blanket depositing at least one additional material by electrodeposition so that the additional deposit covers both the regions that were previously selectively deposited onto, and the regions of the substrate that did not receive any previously applied selective depositions. Typically this material is the other of a structural material or a sacrificial material.

3. Finally, planarizing the materials deposited during the first and second operations to produce a smoothed surface of a first layer of desired thickness having at least one region containing the at least one material and at least one region containing at least the one additional material.

After formation of the first layer, one or more additional layers may be formed adjacent to an immediately preceding layer and adhered to the smoothed surface of that preceding layer. These additional layers are formed by repeating the first through third operations one or more times wherein the formation of each subsequent layer treats the previously formed layers and the initial substrate as a new and thickening substrate.

Once the formation of all layers has been completed, at least a portion of at least one of the materials deposited is generally removed by an etching process to expose or release the three-dimensional structure that was intended to be formed. The removed material is a sacrificial material while the material that forms part of the desired structure is a structural material.

One method of performing the selective electrodeposition involved in the first operation is by conformable contact mask plating. In this type of plating, one or more conformable contact (CC) masks are first formed. The CC masks include a support structure onto which a patterned conformable dielectric material is adhered or formed. The conformable material for each mask is shaped in accordance with a particular cross-section of material to be plated (the pattern of conformable material is complementary to the pattern of material to be deposited). In such a process, at least one CC mask is used for each unique cross-sectional pattern that is to be plated.

The support for a CC mask may be a plate-like structure formed of a metal that is to be selectively electroplated and from which material to be plated will be dissolved. In this typical approach, the support will act as an anode in an electroplating process. In an alternative approach, the support may instead be a porous or otherwise perforated material through which deposition material will pass during an electroplating operation on its way from a distal anode to a deposition surface. In either approach, it is possible for multiple CC masks to share a common support, i.e. the patterns of conformable dielectric material for plating multiple layers of material may be located in different areas of a single support structure. When a single support structure contains multiple plating patterns, the entire structure is referred to as the CC mask while the individual plating masks may be referred to as "submasks". In the present application such a distinction will be made only when relevant to a specific point being made.

In preparation for performing the selective deposition of the first operation, the conformable portion of the CC mask is placed in registration with and pressed against a selected portion of (1) the substrate, (2) a previously formed layer, or (3) a previously deposited material forming a portion of a layer that is being formed. The pressing together of the CC mask and relevant substrate, layer, or material occurs occur in such a way that all openings, in the conformable portions of the CC mask contain plating solution. The conformable material of the CC mask that contacts the substrate, layer, or material acts as a barrier to electrodeposition while the openings in the CC mask that are filled with electroplating solution act as pathways for transferring material from an anode (e.g. the CC mask support) to the non-contacted portions of the substrate (which act as a cathode during the plating operation) when an appropriate potential and/or current are supplied.

An example of a CC mask and CC mask plating are shown in FIGS. 1A-1C. FIG. 1A shows a side view of a CC mask 8 consisting of a conformable or deformable (e.g. elastomeric) insulator 10 patterned on an anode 12. The anode has two functions. One is as a supporting material for the patterned insulator 10 to maintain its integrity and alignment since the pattern may be topologically complex (e.g., involving isolated "islands" of insulator material). The other function is as an anode for the electroplating operation. FIG. 1A also depicts a substrate 6, separated from mask 8, onto which material will be deposited during the process of forming a layer. CC mask plating selectively deposits material 22 onto substrate 6 by simply pressing the insulator against the substrate then electrodepositing material through apertures 26a and 26b in the insulator as shown in FIG. 1B. After deposition, the CC mask is separated, preferably non-destructively, from the substrate 6 as shown in FIG. 10.

The CC mask plating process is distinct from a "through-mask" plating process in that in a through-mask plating process the separation of the masking material from the substrate would occur destructively. Furthermore in a through mask plating process, openings in the masking material are typically formed while the masking material is in contact with and adhered to the substrate. As with through-mask plating, CC mask plating deposits material selectively and simultaneously over the entire layer. The plated region may consist of one or more isolated plating regions where these isolated plating regions may belong to a single structure that is being formed or may belong to multiple structures that are being formed simultaneously. In CC mask plating as individual masks are not intentionally destroyed in the removal process, they may be usable in multiple plating operations.

Another example of a CC mask and CC mask plating is shown in FIGS. 1D-1G. FIG. 1D shows an anode 12' separated from a mask 8' that includes a patterned conformable material 10' and a support structure 20. FIG. 1D also depicts substrate 6 separated from the mask 8'. FIG. 1E illustrates the mask 8' being brought into contact with the substrate 6. FIG. 1F illustrates the deposit 22' that results from conducting a current from the anode 12' to the substrate 6. FIG. 1G illustrates the deposit 22' on substrate 6 after separation from mask 8'. In this example, an appropriate electrolyte is located between the substrate 6 and the anode 12' and a current of ions coming from one or both of the solution and the anode are conducted through the opening in the mask to the substrate where material is deposited. This type of mask may be referred to as an anodeless INSTANT MASK™ (AIM) or as an anodeless conformable contact (ACC) mask.

Unlike through-mask plating, CC mask plating allows CC masks to be formed completely separate from the substrate on which plating is to occur (e.g. separate from a three-dimensional (3D) structure that is being formed). CC masks may be formed in a variety of ways, for example, using a photolithographic process. All masks can be generated simultaneously, e.g. prior to structure fabrication rather than during it. This separation makes possible a simple, low-cost, automated, self-contained, and internally-clean "desktop factory" that can be installed almost anywhere to fabricate 3D structures, leaving any required clean room processes, such as photolithography to be performed by service bureaus or the like.

An example of the electrochemical fabrication process discussed above is illustrated in FIGS. 2A-2F. These figures show that the process involves deposition of a first material 2 which is a sacrificial material and a second material 4 which is a structural material. The CC mask 8, in this example, includes a patterned conformable material (e.g. an elastomeric dielectric material) 10 and a support 12 which is made from deposition material 2. The conformal portion of the CC mask is pressed against substrate 6 with a plating solution 14 located within the openings 16 in the conformable material 10. An electric current, from power supply 18, is then passed through the plating solution 14 via (a) support 12 which doubles as an anode and (b) substrate 6 which doubles as a cathode. FIG. 2A illustrates that the passing of current causes material 2 within the plating solution and material 2 from the anode 12 to be selectively transferred to and plated on the substrate 6. After electroplating the first deposition material 2 onto the substrate 6 using CC mask 8, the CC mask 8 is removed as shown in FIG. 2B. FIG. 2C depicts the second deposition material 4 as having been blanket-deposited (i.e. non-selectively deposited) over the previously deposited first deposition material 2 as well as over the other portions of the substrate 6. The blanket deposition occurs by electroplating from an anode (not shown), composed of the second material, through an appropriate plating solution (not shown), and to the cathode/substrate 6. The entire two-material layer is then planarized to achieve precise thickness and flatness as shown in FIG. 2D. After repetition of this process for all layers, the multi-layer structure 20 formed of the second material 4 (i.e. structural material) is embedded in first material 2 (i.e. sacrificial material) as shown in FIG. 2E. The embedded structure is etched to yield the desired device, i.e. structure 20, as shown in FIG. 2F.

Various components of an exemplary manual electrochemical fabrication system 32 are shown in FIGS. 3A-3C. The system 32 consists of several subsystems 34, 36, 38, and 40. The substrate holding subsystem 34 is depicted in the upper portions of each of FIGS. 3A-3C and includes several components: (1) a carrier 48, (2) a metal substrate 6 onto which the layers are deposited, and (3) a linear slide 42 capable of moving the substrate 6 up and down relative to the carrier 48 in response to drive force from actuator 44. Subsystem 34 also includes an indicator 46 for measuring differences in vertical position of the substrate which may be used in setting or determining layer thicknesses and/or deposition thicknesses. The subsystem 34 further includes feet 68 for carrier 48 which can be precisely mounted on subsystem 36.

The CC mask subsystem 36 shown in the lower portion of FIG. 3A includes several components: (1) a CC mask 8 that is actually made up of a number of CC masks (i.e. submasks) that share a common support/anode 12, (2) precision X-stage 54, (3) precision Y-stage 56, (4) frame 72 on which the feet 68 of subsystem 34 can mount, and (5) a tank 58 for containing the electrolyte 16. Subsystems 34 and 36 also include appropriate electrical connections (not shown) for connecting to an appropriate power source (not shown) for driving the CC masking process.

The blanket deposition subsystem 38 is shown in the lower portion of FIG. 3B and includes several components: (1) an anode 62, (2) an electrolyte tank 64 for holding plating solution 66, and (3) frame 74 on which feet 68 of subsystem 34 may sit. Subsystem 38 also includes appropriate electrical connections (not shown) for connecting the anode to an appropriate power supply (not shown) for driving the blanket deposition process.

The planarization subsystem 40 is shown in the lower portion of FIG. 3C and includes a lapping plate 52 and associated motion and control systems (not shown) for planarizing the depositions.

In addition to teaching the use of CC masks for electrodeposition purposes, the '630 patent also teaches that the CC masks may be placed against a substrate with the polarity of the voltage reversed and material may thereby be selectively removed from the substrate. It indicates that such removal processes can be used to selectively etch, engrave, and polish a substrate, e.g., a plaque.

The '630 patent further indicates that the electroplating methods and articles disclosed therein allow fabrication of devices from thin layers of materials such as, e.g., metals, polymers, ceramics, and semiconductor materials. It further indicates that although the electroplating embodiments described therein have been described with respect to the use of two metals, a variety of materials, e.g., polymers, ceramics and semiconductor materials, and any number of metals can be deposited either by the electroplating methods therein, or in separate processes that occur throughout the electroplating method. It indicates that a thin plating base can be deposited, e.g., by sputtering, over a deposit that is insufficiently conductive (e.g., an insulating layer) so as to enable subsequent electroplating. It also indicates that multiple support materials (i.e. sacrificial materials) can be included in the electroplated element allowing selective removal of the support materials.

The '630 patent additionally teaches that the electroplating methods disclosed therein can be used to manufacture elements having complex microstructure and close tolerances between parts. An example is given with the aid of FIGS. 14A-14E of that patent. In the example, elements having parts that fit with close tolerances, e.g., having gaps between about 1-5 um, including electroplating the parts of the device in an unassembled, preferably pre-aligned state. In such embodiments, the individual parts can be moved into operational relation with each other or they can simply fall together. Once together the separate parts may be retained by clips or the like.

Another method for forming microstructures from electroplated metals (i.e. using electrochemical fabrication techniques) is taught in U.S. Pat. No. 5,190,637 to Henry Guckel, entitled "Formation of Microstructures by Multiple Level Deep X-ray Lithography with Sacrificial Metal Layers". This patent teaches the formation of metal structure utilizing through mask exposures. A first layer of a primary metal is electroplated onto an exposed plating base to fill a void in a photoresist (the photoresist forming a through mask having a desired pattern of openings), the photoresist is then removed and a secondary metal is electroplated over the first layer and over the plating base. The exposed surface of the secondary metal is then machined down to a height which exposes the first metal to produce a flat uniform surface extending across both the primary and secondary metals. Formation of a second layer may then begin by applying a photoresist over the first layer and patterning it (i.e. to form a second through mask) and then repeating the process that was used to produce the first layer to produce a second layer of desired configuration. The process is repeated until the entire structure is formed and the secondary metal is removed by etching. The photoresist is formed over the plating base or previous layer by casting and patterning of the photoresist (i.e. voids formed in the photoresist) are formed by exposure of the photoresist through a patterned mask via X-rays or UV radiation and development of the exposed or unexposed areas.

The '637 patent teaches the locating of a plating base onto a substrate in preparation for electroplating materials onto the substrate. The plating base is indicated as typically involving the use of a sputtered film of an adhesive metal, such as chromium or titanium, and then a sputtered film of the metal that is to be plated. It is also taught that the plating base may be applied over an initial layer of sacrificial material (i.e. a layer or coating of a single material) on the substrate so that the structure and substrate may be detached if desired. In such cases after formation of the structure the sacrificial material forming part of each layer of the structure may be removed along with the initial sacrificial layer to free the structure. Substrate materials mentioned in the '637 patent include silicon, glass, metals, and silicon with protected semiconductor devices. A specific example of a plating base includes about 150 angstroms of titanium and about 300 angstroms of nickel, both of which are sputtered at a temperature of 160° C. In another example it is indicated that the plating base may consist of 150 angstroms of titanium and 150 angstroms of nickel where both are applied by sputtering.

Electrochemical Fabrication provides the ability to form prototypes and commercial quantities of miniature objects, parts, structures, devices, and the like at reasonable costs and in reasonable times. In fact, Electrochemical Fabrication is an enabler for the formation of many structures that were hitherto impossible to produce. Electrochemical Fabrication opens the spectrum for new designs and products in many industrial fields. Even though Electrochemical Fabrication offers this new capability and it is understood that Electrochemical Fabrication techniques can be combined with designs and structures known within various fields to produce new structures, certain uses for Electrochemical Fabrication provide designs, structures, capabilities and/or features not known or obvious in view of the state of the art.

A need exists in various fields for miniature devices having improved characteristics, reduced fabrication times, reduced fabrication costs, simplified fabrication processes, greater versatility in device design, improved selection of materials, improved material properties, more cost effective and less risky production of such devices, and/or more independence between geometric configuration and the selected fabrication process.

SUMMARY OF THE INVENTION

It is an object of some embodiments of the invention to provide an enhanced electrochemical process for working with multiple structural materials.

It is an object of some embodiments of the invention to provide an enhanced electrochemical process for forming structures (e.g. compliant electrical contact elements, e.g. microprobes) that include an outer coating of a secondary structural material surrounding or at least partially surrounding a primary structural material.

Other objects and advantages of various embodiments of the invention will be apparent to those of skill in the art upon review of the teachings herein. The various embodiments of the invention, set forth explicitly herein or otherwise ascertained from the teachings herein, may address one or more of the above objects alone or in combination, or alternatively may address some other object ascertained from the teachings herein. It is not necessarily intended that all objects be addressed by any single aspect of the invention even though that may be the case with regard to some aspects.

A first aspect of the invention provides a fabrication process for forming a multi-layer three-dimensional structure, comprising: (a) forming a first layer comprises at least one structural material and at least one sacrificial material; (b) forming at least one additional layer from at least one structural material and at least one sacrificial material wherein the at least one additional layer is formed on and adhered to a previously formed layer, and wherein the first layer and the at least one additional layer together form a multi-layer three-dimensional structure; and (c) after formation of a plurality of layers, separating at least a portion of the sacrificial material on a plurality of layers from the structural materials on those layers, wherein a given one of the layers comprises at least one sacrificial material and at least two structural materials, wherein the at least two structural materials comprise a core structural material located at the upper boundary of level of the given layer but not at the lower boundary level of the given layer and a shell structural material bounding the sides of the core material and located below the core material and above the lower boundary level of the given layer such at the shell structural material bounds the bottom.

A second aspect of the invention provides a fabrication process for forming a multi-layer three-dimensional structure, comprising: (a) forming a first layer comprises at least one structural material and at least one sacrificial material; (b) forming at least one additional layer from at least one structural material and at least one sacrificial material wherein the at least one additional layer is formed on and adhered to a previously formed layer, and wherein the first layer and the at least one additional layer together form a multi-layer three-dimensional structure; and (c) after formation of a plurality of layers, separating at least a portion of the sacrificial material on a plurality of layers from the structural materials on those layers, wherein a given one of the layers comprises at least one sacrificial material and at least two structural materials, wherein the at least two structural materials comprise a core structural material and a shell structural material where the shell structural material has a base and side walls that hold the bottom and sides of the core material.

A third aspect of the invention provides a fabrication process for forming a multi-layer three-dimensional structure, comprising:(a) forming a first layer comprises at least one structural material and at least one sacrificial material; (b) forming at least one additional layer from at least one structural material and at least one sacrificial material wherein the at least one additional layer is formed on and adhered to a previously formed layer, and wherein the first layer and the at least one additional layer together form a multi-layer three-dimensional structure; and (c) after formation of a plurality of layers, separating at least a portion of the sacrificial material on a plurality of layers from the structural materials on those layers, wherein a given one of the layers comprises at least one sacrificial material and at least two structural materials, wherein the at least two structural materials comprise a core structural material located at the lower boundary level of the given layer but not at the upper-boundary level of the given layer and a shell structural material bounding the sides of the core material and providing a cap located above the core structural material and below the upper boundary of the given layer such that the shell material bounds the top of the core structural material.

A fourth aspect of the invention provides a fabrication process for forming a multi-layer three-dimensional structure, comprising: (a) forming a first layer comprises at least one structural material and at least one sacrificial material; (b) forming at least one additional layer from at least one structural material and at least one sacrificial material wherein the at least one additional layer is formed on and adhered to a previously formed layer, and wherein the first layer and the at least one additional layer together form a multi-layer three-dimensional structure; and (c) after formation of a plurality of layers, separating at least a portion of the sacrificial material on a plurality of layers from the structural materials on those layers, wherein a given one of the layers comprises at least one sacrificial material and at least two structural materials, wherein the at least two structural materials comprise a core structural material and a shell structural material where the shell structural material has an upper cap and side walls that hold the top and sides of the core material.

A fifth aspect of the invention provides a fabrication process for forming a multi-layer three-dimensional structure, comprising: (a) forming a first layer comprises at least one structural material and at least one sacrificial material; (b) forming at least one additional layer from at least one structural material and at least one sacrificial material wherein the at least one additional layer is formed on and adhered to a previously formed layer, and wherein the first layer and the at least one additional layer together form a multi-layer three-dimensional structure; and (c) after formation of a plurality of layers, separating at least a portion of the sacrificial material on a plurality of layers from the structural materials on those layers, wherein a given one of the layers comprises at least one sacrificial material and at least two structural materials, wherein the at least two structural materials comprise a core structural material that extends from a lower boundary level of the given layer to an upper boundary level of the given layer and a shell structural material that has side walls that extends from a lower boundary level of the given layer to an upper boundary level of the given layer such that the shell structural material encapsulates the sides of the core material on the given layer.

A sixth aspect of the invention provides a fabrication process for forming a multi-layer three-dimensional structure, comprising: (a) forming a first layer comprises at least one structural material and at least one sacrificial material; (b) forming at least one additional layer from at least one structural material and at least one sacrificial material wherein the at least one additional layer is formed on and adhered to a previously formed layer, and wherein the first layer and the at least one additional layer together form a multi-layer three-dimensional structure; and (c) after formation of a plurality of layers, separating at least a portion of the sacrificial material on a plurality of layers from the structural materials on those layers, wherein a given one of the layers comprises at least one sacrificial material and at least two structural materials, wherein the at least two structural materials comprise a core structural material and a shell structural material where the shell structural material has side walls that encapsulate the sides of the core material on the given layer.

A seventh aspect of the invention provides a fabrication process for forming a multi-layer three-dimensional structure, comprising: (a) forming a first layer comprises at least one structural material and at least one sacrificial material; (b) forming at least one additional layer from at least one structural material and at least one sacrificial material wherein the at least one additional layer is formed on and adhered to a previously formed layer, and wherein the first layer and the at least one additional layer together form a multi-layer three-dimensional structure; and (c) after formation of a plurality of layers, separating at least a portion of the sacrificial material on a plurality of layers from the structural materials on those layers, wherein a process for forming a given layer is based at least in part on a configuration of the given layer relative to the configuration of a layer selected from the group consisting of the immediately preceding layer and the immediately succeeding layer, and wherein the process is selected from the group consisting of (a) forming the given layer with a core structural material and a downward facing shell structural material, (b) forming the given layer with a core structural material and an upward facing shell structural material; and (c) forming the given layer with a core structural material and a continuing shell structural material.

A eighth aspect of the invention provides a fabrication process for forming a multi-layer three-dimensional structure, comprising: (a) forming a first layer comprises at least one structural material and at least one sacrificial material; (b) forming at least one additional layer from at least one structural material and at least one sacrificial material wherein the at least one additional layer is formed on and adhered to a previously formed layer, and wherein the first layer and the at least one additional layer together form a multi-layer three-dimensional structure; and (c) after formation of a plurality of layers, separating at least a portion of the sacrificial material on a plurality of layers from the structural materials on those layers, wherein a process produces a structure from a core structural material and a shell structural material wherein the core material extends unbroken from a given layer to a subsequent layer and is surrounded by an unbroken barrier of shell structural material and wherein the subsequent layer is selected from the group consisting of the layer immediately succeeding the given layer, a layer that is separated from the given layer by an intermediate layer, a layer is separated from the given layer by at least two intermediate layers, and a layer that is separated from the given layer by more than two intermediate layers.

A ninth aspect of the invention provides a fabrication process for forming a multi-layer three-dimensional structure or an array of structures, comprising: (a) forming and adhering a layer of material to a previously formed layer and/or to a substrate, wherein each layer comprises at least one structural material and at least one sacrificial material; (b) repeating the forming and adhering operation of (a) to build up a three-dimensional structure from a plurality of adhered layers, wherein the formation of at least one given layer comprises the deposition of at least one sacrificial material and two structural materials at least one of which at least partially encapsulates the other; and (c) after formation of a plurality of layers, separating at least a portion of the sacrificial material on a plurality of layers from the structural materials on those layers.

A tenth aspect of the invention provides a fabrication process for forming a multi-layer three-dimensional probe structure or array of probe structures, comprising: (a) forming and adhering a layer of material to a previously formed layer and/or to a substrate, wherein the layer comprises at least one structural material and at least one sacrificial material; (b) repeating the forming and adhering operation of (a) to build up a three-dimensional structure from a plurality of adhered layers, wherein the formation of at least a given layer comprises the deposition of at least two structural materials, at least one of which isolates other from the sacrificial material; and (c) after formation of a plurality of layers, separating at least a portion of the sacrificial material on a plurality of layers from the structural materials on those layers, wherein the encapsulated material exists within a lower boundary and an upper boundary of the given layer and wherein the encapsulating material for the given layer has a dimension that is less than a minimum feature size for the given layer.

A eleventh aspect of the invention provides a process for forming a multilayer three-dimensional structure, e.g. a probe structure or an array of probe structures, including: (a) forming and adhering a layer of material to a previously formed layer and/or to a substrate; (b) repeating the forming and adhering operation of (a) to build up a three-dimensional structure from a plurality of adhered layers, wherein the formation of at least a plurality of layers comprises the deposition of at least two structural materials, at least one of which isolates other from the sacrificial material; and (c) after formation of a plurality of layers, separating at least a portion of the sacrificial material on a plurality of layers from the structural materials on those layers.

A twelfth aspect of the invention provides a process for forming a multilayer three-dimensional structure, e.g. a probe structure or an array of probe structures, including: (a) forming and adhering a layer of material to a previously formed layer and/or to a substrate; (b) repeating the forming and adhering operation of (a) to build up a three-dimensional structure from a plurality of adhered layers, wherein the formation of at least a plurality of layers comprises the deposition of at least two structural materials, at least one of which is a dielectric material, and the deposition of a sacrificial material; and (c) after formation of a plurality of layers, separating at least a portion of the sacrificial material on a plurality of layers from the structural materials on those layers.

A thirteenth aspect of the invention provides a process for forming a multilayer three-dimensional structure, e.g. a probe structure or an array of probe structures, including: (a) forming and adhering a layer of material to a previously formed layer and/or to a substrate; (b) repeating the forming and adhering operation of (a) to build up a three-dimensional structure from a plurality of adhered layers, wherein the formation of at least a plurality of layers comprises the deposition of a sacrificial material and at least two structural materials, a first of which encapsulates a second wherein the encapsulating first material does not completely isolate regions of the second material from regions of second material on successive layers when those regions of second material at least partially overlap; and (c) after formation of a plurality of layers, separating at least a portion of the sacrificial material on a plurality of layers from the structural material on those layers.

Other aspects of the invention will be understood by those of skill in the art upon review of the teachings herein. Other aspects of the invention may involve combinations of the above noted aspects of the invention. Other aspects of the invention may involve apparatus that can be used in implementing one or more of the above method aspects of the invention or may be directed to the devices or structures formed by application of such methods. These other aspects of the invention may provide various combinations of the aspects presented above as well as provide other configurations, structures, functional relationships, and processes that have not been specifically set forth above but are taught by other specific teachings set forth herein as taught by the teachings set forth herein as a whole.

BRIEF DESCRIPTION OF THE DRAWINGS

FIGS. 4A-4F schematically depict the formation of a first layer of a structure using adhered mask plating where the blanket deposition of a second material overlays both the openings between deposition locations of a first material and the first material itself FIG. 4G depicts the completion of formation of the first layer resulting from planarizing the deposited materials to a desired level.

FIGS. 4H and 4I respectively depict the state of the process after formation of the multiple layers of the structure and after release of the structure from the sacrificial material.

FIGS. 10B-10J illustrate various states of the process of FIG. 10A as applied to the formation of a particular sample layer of a structure which has a lateral size similar to that of a previous layer on which it is formed with the exception that the previous layer was formed using an up-facing shell and core method (such as that used in one of the first-fourth embodiments) and such that a core is formed starting in and extending from an immediately preceding layer and extending into and through the current layer.

DETAILED DESCRIPTION OF PREFERRED EMBODIMENTS OF THE INVENTION

Figure 1A:
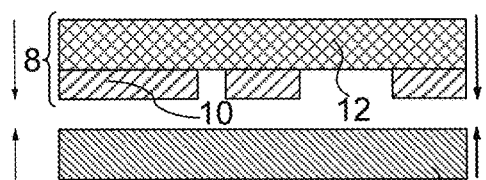
FIGS. 1A-1C schematically depict side views of various stages of a CC mask plating process, while FIGS. 1D-1G schematically depict side views of various stages of a CC mask plating process using a different type of CC mask.
Figure 1B:
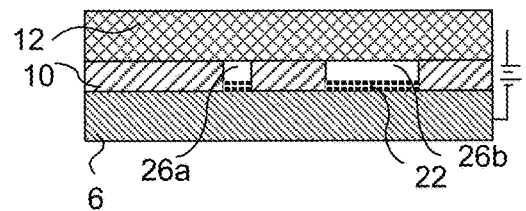
Figure 1C:
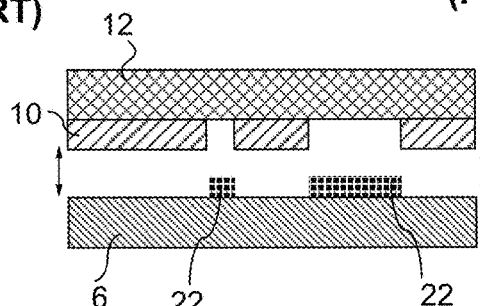
Figure 1D:
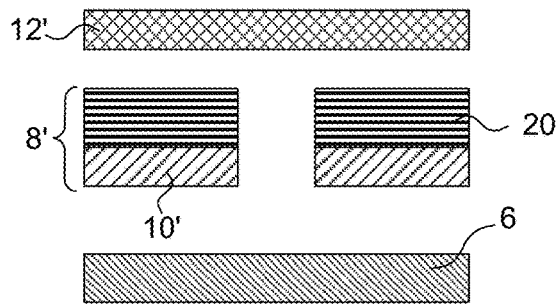
Figure 1E:
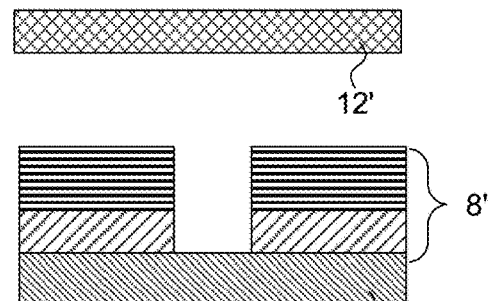
Figure 1F:
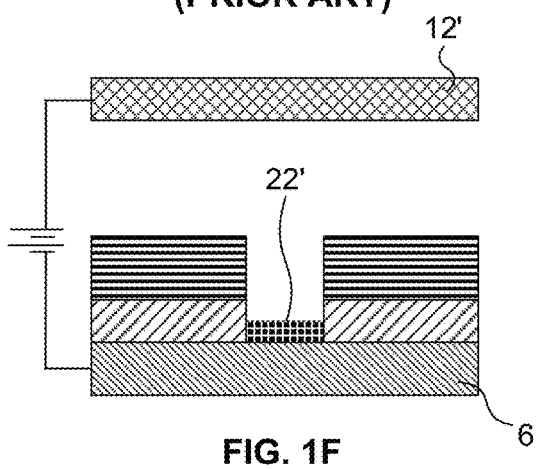
Figure 1G:
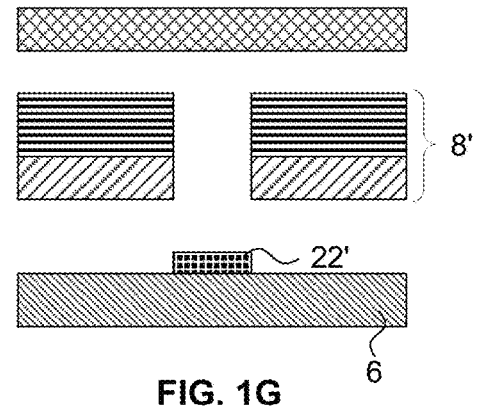
Figure 2A:
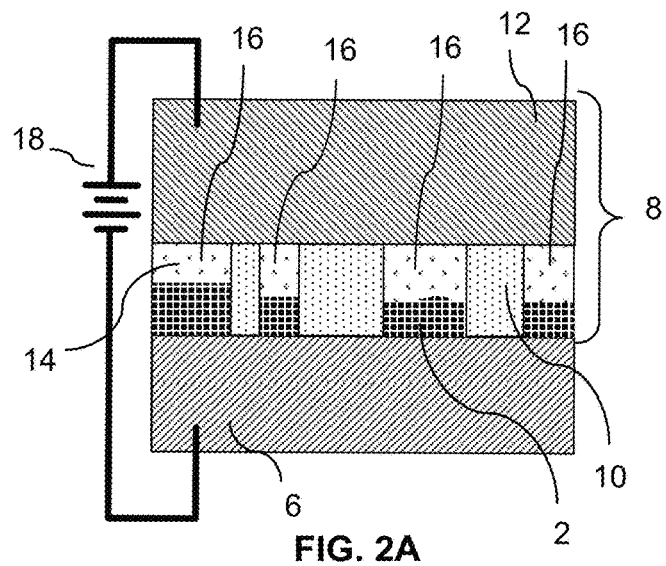
FIGS. 2A-2F schematically depict side views of various stages of an electrochemical fabrication process as applied to the formation of a particular structure where a sacrificial material is selectively deposited while a structural material is blanket deposited.
Figure 2B:
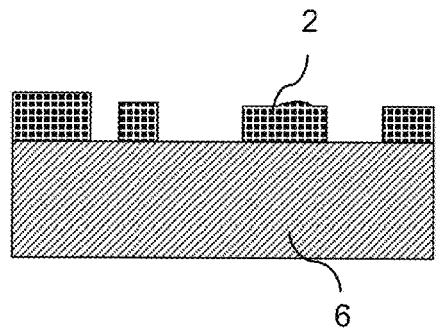
Figure 2C:
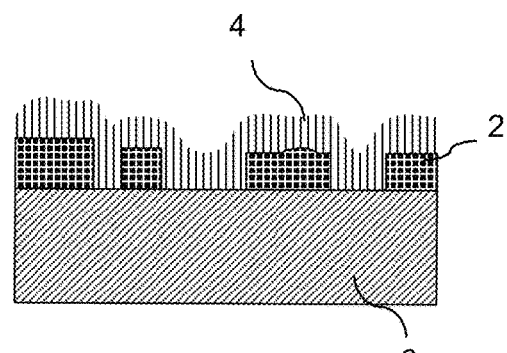
Figure 2D:
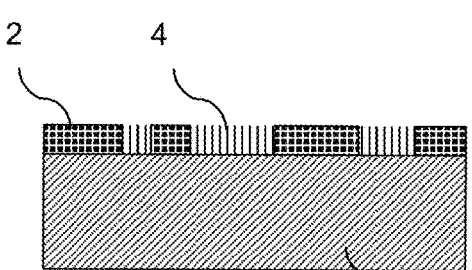
Figure 2E:
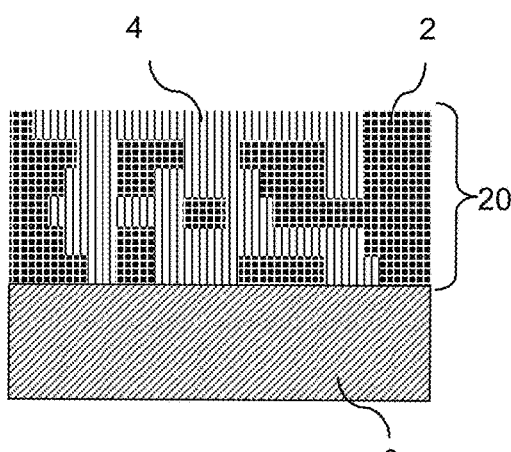
Figure 2F:
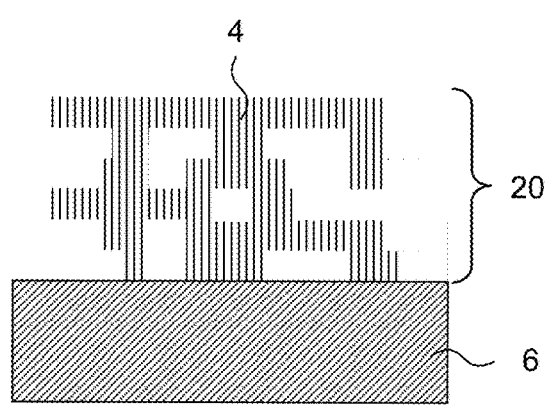
Figure 3A:
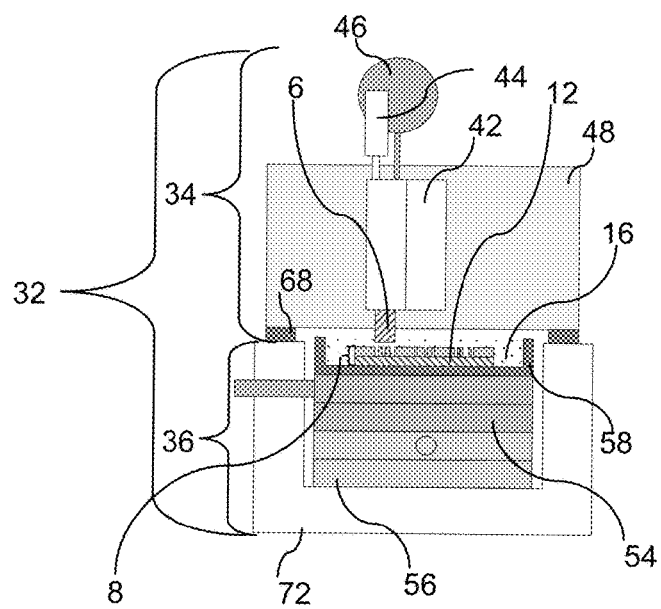
FIGS. 3A-3C schematically depict side views of various example subassemblies that may be used in manually implementing the electrochemical fabrication method depicted in FIGS. 2A-2F.
Figure 3B:
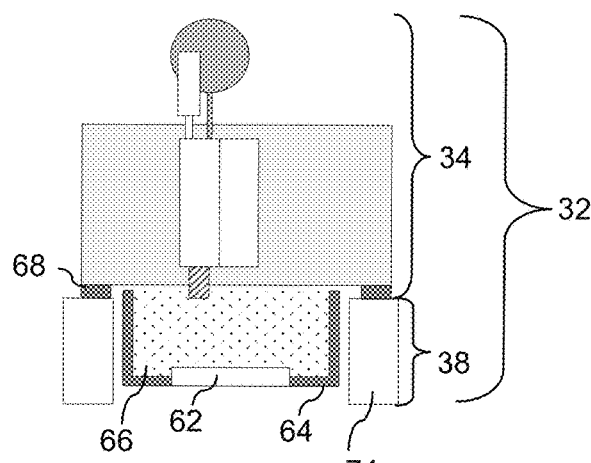
Figure 3C:
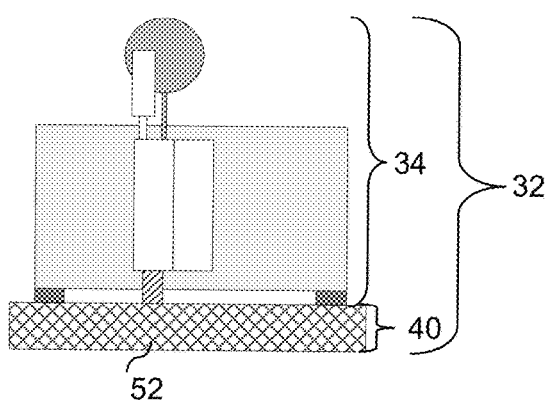

Electrochemical Fabrication in General:

FIGS. 1A-1G, 2A-2F, and 3A-3C illustrate various features of one form of electrochemical fabrication. Other electrochemical fabrication techniques are set forth in the '630 patent referenced above, in the various previously incorporated publications, in various other patents and patent applications incorporated herein by reference. Still others may be derived from combinations of various approaches described in these publications, patents, and applications, or are otherwise known or ascertainable by those of skill in the art from the teachings set forth herein. All of these techniques may be combined with those of the various embodiments of various aspects of the invention to yield enhanced embodiments. Still other embodiments may be derived from combinations of the various embodiments explicitly set forth herein.

FIGS. 4A-4I illustrate side views of various states in an alternative multi-layer, multi-material electrochemical fabrication process. FIGS. 4A-4G illustrate various stages in the formation of a single layer of a multi-layer fabrication process where a second metal is deposited on a first metal as well as in openings in the first metal so that the first and second metal form part of the layer. In FIG. 4A a side view of a substrate 82 having a surface 88 is shown, onto which patternable photoresist 84 is cast as shown in FIG. 4B. In FIG. 4C, a pattern of resist is shown that results from the curing, exposing, and developing of the resist. The patterning of the photoresist 84 results in openings or apertures 92(a)-92(c) extending from a surface 86 of the photoresist through the thickness of the photoresist to surface 88 of the substrate 82. In FIG. 4D a metal 94 (e.g. nickel) is shown as having been electroplated into the openings 92(a)-92(c). In FIG. 4E the photoresist has been removed (i.e. chemically stripped) from the substrate to expose regions of the substrate 82 which are not covered with the first metal 94. In FIG. 4F a second metal 96 (e.g. silver) is shown as having been blanket electroplated over the entire exposed portions of the substrate 82 (which is conductive) and over the first metal 94 (which is also conductive). FIG. 4G depicts the completed first layer of the structure which has resulted from the planarization of the first and second metals down to a height that exposes the first metal and sets a thickness for the first layer. In FIG. 4H the result of repeating the process steps shown in FIGS. 4B-4G several times to form a multi-layer structure is shown where each layer consists of two materials. For most applications, one of these materials is removed as shown in FIG. 4I to yield a desired 3-D structure 98 (e.g. component or device).

Various embodiments of various aspects of the invention are directed to formation of three-dimensional structures from materials some, or all, of which may be electrodeposited (as illustrated in FIGS. 1A-4I) or electroless deposited. Some of these structures may be formed form a single build level formed from one or more deposited materials while others are formed from a plurality of build layers each including at least two materials (e.g. two or more layers, more preferably five or more layers, and most preferably ten or more layers). In some embodiments, layer thicknesses may be as small as one micron or as large as fifty microns. In other embodiments, thinner layers may be used while in other embodiments, thicker layers may be used. In some embodiments structures having features positioned with micron level precision and minimum features size on the order of tens of microns are to be formed. In other embodiments structures with less precise feature placement and/or larger minimum features may be formed. In still other embodiments, higher precision and smaller minimum feature sizes may be desirable. In the present application meso-scale and millimeter scale have the same meaning and refer to devices that may have one or more dimensions extending into the 0.5-20 millimeter range, or somewhat larger and with features positioned with precision in the 10-100 micron range and with minimum features sizes on the order of 100 microns.

The various embodiments, alternatives, and techniques disclosed herein may form multi-layer structures using a single patterning technique on all layers or using different patterning techniques on different layers. For example, various embodiments of the invention may perform selective patterning operations using conformable contact masks and masking operations (i.e. operations that use masks which are contacted to but not adhered to a substrate), proximity masks and masking operations (i.e. operations that use masks that at least partially selectively shield a substrate by their proximity to the substrate even if contact is not made), non-conformable masks and masking operations (i.e. masks and operations based on masks whose contact surfaces are not significantly conformable), and/or adhered masks and masking operations (masks and operations that use masks that are adhered to a substrate onto which selective deposition or etching is to occur as opposed to only being contacted to it). Conformable contact masks, proximity masks, and non-conformable contact masks share the property that they are preformed and brought to, or in proximity to, a surface which is to be treated (i.e. the exposed portions of the surface are to be treated). These masks can generally be removed without damaging the mask or the surface that received treatment to which they were contacted, or located in proximity to. Adhered masks are generally formed on the surface to be treated (i.e. the portion of that surface that is to be masked) and bonded to that surface such that they cannot be separated from that surface without being completely destroyed or damaged beyond any point of reuse. Adhered masks may be formed in a number of ways including (1) by application of a photoresist, selective exposure of the photoresist, and then development of the photoresist, (2) selective transfer of pre-patterned masking material, and/or (3) direct formation of masks from computer controlled depositions of material.

Patterning operations may be used in selectively depositing material and/or may be used in the selective etching of material. Selectively etched regions may be selectively filled in or filled in via blanket deposition, or the like, with a different desired material. In some embodiments, the layer-by-layer build up may involve the simultaneous formation of portions of multiple layers. In some embodiments, depositions made in association with some layer levels may result in depositions to regions associated with other layer levels (i.e. regions that lie within the top and bottom boundary levels that define a different layer's geometric configuration). Such use of selective etching and interlaced material deposition in association with multiple layers is described in U.S. patent application Ser. No. 10/434,519, by Smalley, now U.S. Pat. No. 7,252,861, and entitled "Methods of and Apparatus for Electrochemically Fabricating Structures Via Interlaced Layers or Via Selective Etching and Filling of Voids" which is hereby incorporated herein by reference as if set forth in full.

Temporary substrates on which structures may be formed may be of the sacrificial-type (i.e. destroyed or damaged during separation of deposited materials to the extent they cannot be reused), non-sacrificial-type (i.e. not destroyed or excessively damaged, i.e. not damaged to the extent they may not be reused, e.g. with a sacrificial or release layer located between the substrate and the initial layers of a structure that is formed). Non-sacrificial substrates may be considered reusable, with little or no rework (e.g. replanarizing one or more selected surfaces or applying a release layer, and the like) though they may or may not be reused for a variety of reasons.

Definitions:

This section of the specification is intended to set forth definitions for a number of specific terms that may be useful in describing the subject matter of the various embodiments of the invention. It is believed that the meanings of most if not all of these terms is clear from their general use in the specification but they are set forth hereinafter to remove any ambiguity that may exist. It is intended that these definitions be used in understanding the scope and limits of any claims that use these specific terms. As far as interpretation of the claims of this patent disclosure are concerned, it is intended that these definitions take presence over any contradictory definitions or allusions found in any materials which are incorporated herein by reference.

"Build" as used herein refers, as a verb, to the process of building a desired structure (or part) or plurality of structures (or parts) from a plurality of applied or deposited materials which are stacked and adhered upon application or deposition or, as a noun, to the physical structure (or part) or structures (or parts) formed from such a process. Depending on the context in which the term is used, such physical structures may include a desired structure embedded within a sacrificial material or may include only desired physical structures which may be separated from one another or may require dicing and/or slicing to cause separation.

"Build axis" or "build orientation" is the axis or orientation that is substantially perpendicular to substantially planar levels of deposited or applied materials that are used in building up a structure. The planar levels of deposited or applied materials may be or may not be completely planar but are substantially so in that the overall extent of their cross-sectional dimensions are significantly greater than the height of any individual deposit or application of material (e.g. 100, 500, 1000, 5000, or more times greater). The planar nature of the deposited or applied materials may come about from use of a process that leads to planar deposits or it may result from a planarization process (e.g. a process that includes mechanical abrasion, e.g. lapping, fly cutting, grinding, or the like) that is used to remove material regions of excess height. Unless explicitly noted otherwise, "vertical" as used herein refers to the build axis or nominal build axis (e.g. if the layers are not stacking with perfect registration) while "horizontal" refers to a direction within the plane of the layers (i.e. the plane that is substantially perpendicular to the build axis). For convenience of terminology and without implying a particular physical build orientation, successive layers shall be considered to be added above previously formed layers and preceding layers will be considered to exist below later formed layers. For example during electroplating actual build orientation may be vertical up-facing or horizontal while for planarization actual build orientation may be horizontal or down-facing vertical but successive layers will still be considered to be formed on or above previously formed layers unless explicitly indicated otherwise.

"Build layer" or "layer of structure" as used herein does not refer to a deposit of a specific material but instead refers to a region of a build located between a lower boundary level and an upper boundary level which generally defines a single cross-section of a structure being formed or structures which are being formed in parallel. Depending on the details of the actual process used to form the structure, build layers are generally formed on and adhered to previously formed build layers. In some processes the boundaries between build layers are defined by planarization operations which result in successive build layers being formed on substantially planar upper surfaces of previously formed build layers. In some embodiments, the substantially planar upper surface of the preceding build layer may be textured to improve adhesion between the layers. In other build processes, openings may exist in or be formed in the upper surface of a previous but only partially formed build layer or build layers such that the openings in the previous build layer or build layers are filled with materials deposited in association with current build layer which will cause interlacing of build layers and material deposits. Such interlacing is described in U.S. patent application Ser. No. 10/434,519 now U.S. Pat. No. 7,252,861. This referenced application is incorporated herein by reference as if set forth in full. In most embodiments, a build layer includes at least one primary structural material and at least one primary sacrificial material. However, in some embodiments, two or more primary structural materials may be used without a primary sacrificial material (e.g. when one primary structural material is a dielectric and the other is a conductive material). In some embodiments, build layers are distinguishable from each other by the source of the data that is used to yield patterns of the deposits, applications, and/or etchings of material that form the respective build layers. For example, data descriptive of a structure to be formed which is derived from data extracted from different vertical levels of a data representation of the structure define different build layers of the structure. The vertical separation of successive pairs of such descriptive data may define the thickness of build layers associated with the data. As used herein, at times, "build layer" may be loosely referred simply as "layer". In many embodiments, deposition thickness of primary structural or sacrificial materials (i.e. the thickness of any particular material after it is deposited) is generally greater than the layer thickness and a net deposit thickness is set via one or more planarization processes which may include, for example, mechanical abrasion (e.g. lapping, fly cutting, polishing, and the like) and/or chemical etching (e.g. using selective or non-selective etchants). The lower boundary and upper boundary for a build layer may be set and defined in different ways. From a design point of view they may be set based on a desired vertical resolution of the structure (which may vary with height). From a data manipulation point of view, the vertical layer boundaries may be defined as the vertical levels at which data descriptive of the structure is processed or the layer thickness may be defined as the height separating successive levels of cross-sectional data that dictate how the structure will be formed. From a fabrication point of view, depending on the exact fabrication process used, the upper and lower layer boundaries may be defined in a variety of different ways. For example by planarization levels or effective planarization levels (e.g. lapping levels, fly cutting levels, chemical mechanical polishing levels, mechanical polishing levels, vertical positions of structural and/or sacrificial materials after relatively uniform etch back following a mechanical or chemical mechanical planarization process). For example, by levels at which process steps or operations are repeated. At levels at which, at least theoretically, lateral extents of structural material can be changed to define new cross-sectional features of a structure.

"Layer thickness" is the height along the build axis between a lower boundary of a build layer and an upper boundary of that build layer.

"Planarization" is a process that tends to remove materials, above a desired plane, in a substantially non-selective manner such that all deposited materials are brought to a substantially common height or desired level (e.g. within 20%, 10%, 5%, or even 1% of a desired layer boundary level). For example, lapping removes material in a substantially non-selective manner though some amount of recession of one material versus another material may occur (e.g. copper may recess relative to nickel). Planarization may occur primarily via mechanical means, e.g. lapping, grinding, fly cutting, milling, sanding, abrasive polishing, frictionally induced melting, other machining operations, or the like (i.e. mechanical planarization). Mechanical planarization may be followed or preceded by thermally induced planarization (e.g. melting) or chemically induced planarization (e.g. etching). Planarization may occur primarily via a chemical and/or electrical means (e.g. chemical etching, electrochemical etching, or the like). Planarization may occur via a simultaneous combination of mechanical and chemical etching (e.g. chemical mechanical polishing (CMP)).

"Structural material" as used herein refers to a material that remains part of the structure when put into use.

"Supplemental structural material" as used herein refers to a material that forms part of the structure when the structure is put to use but is not added as part of the build layers but instead is added to a plurality of layers simultaneously (e.g. via one or more coating operations that applies the material, selectively or in a blanket fashion, to a one or more surfaces of a desired build structure that has been released from a sacrificial material.

"Primary structural material" as used herein is a structural material that forms part of a given build layer and which is typically deposited or applied during the formation of that build layer and which makes up more than 20% of the structural material volume of the given build layer. In some embodiments, the primary structural material may be the same on each of a plurality of build layers or it may be different on different build layers. In some embodiments, a given primary structural material may be formed from two or more materials by the alloying or diffusion of the two or more materials to form a single material.

"Secondary structural material" as used herein is a structural material that forms part of a given build layer and is typically deposited or applied during the formation of the given build layer but is not a primary structural material as it individually accounts for only a small volume of the structural material associated with the given layer. A secondary structural material will account for less than 20% of the volume of the structural material associated with the given layer. In some preferred embodiments, each secondary structural material may account for less than 10%, 5%, or even 2% of the volume of the structural material associated with the given layer. Examples of secondary structural materials may include seed layer materials, adhesion layer materials, barrier layer materials (e.g. diffusion barrier material), and the like. These secondary structural materials are typically applied to form coatings having thicknesses less than 2 microns, 1 micron, 0.5 microns, or even 0.2 microns. The coatings may be applied in a conformal or directional manner (e.g. via CVD, PVD, electroless deposition, or the like). Such coatings may be applied in a blanket manner or in a selective manner. Such coatings may be applied in a planar manner (e.g. over previously planarized layers of material) as taught in U.S. patent application Ser. No. 10/607,931, now U.S. Pat. No. 7,239,219. In other embodiments, such coatings may be applied in a non-planar manner, for example, in openings in and over a patterned masking material that has been applied to previously planarized layers of material as taught in U.S. patent application Ser. No. 10/841,383, now U.S. Pat. No. 7,195,989. These referenced applications are incorporated herein by reference as if set forth in full herein.

"Functional structural material" as used herein is a structural material that would have been removed as a sacrificial material but for its actual or effective encapsulation by other structural materials. Effective encapsulation refers, for example, to the inability of an etchant to attack the functional structural material due to inaccessibility that results from a very small area of exposure and/or due to an elongated or tortuous exposure path. For example, large (10,000 $\mu m^2$) but thin (e.g. less than 0.5 microns) regions of sacrificial copper sandwiched between deposits of nickel may define regions of functional structural material depending on ability of a release etchant to remove the sandwiched copper.

"Stand alone structural material" or "genuine structural material" is a structural material that is resistive or not substantially removed by a sacrificial material etchant that is used in separating sacrificial and structural materials.

"Sacrificial material" is material that forms part of a build layer but is not a structural material. Sacrificial material on a given build layer is separated from structural material on that build layer after formation of that build layer is completed and more generally is removed from a plurality of layers after completion of the formation of the plurality of layers during a "release" process that removes the bulk of the sacrificial material or materials. In general sacrificial material is located on a build layer during the formation of one, two, or more subsequent build layers and is thereafter removed in a manner that does not lead to a planarized surface. Materials that are applied primarily for masking purposes, i.e. to allow subsequent selective deposition or etching of a material, e.g. photoresist that is used in forming a build layer but does not form part of the build layer, or that exist as part of a build for less than one or two complete build layer formation cycles are not considered sacrificial materials as the term is used herein but instead shall be referred as masking materials or as temporary materials. Sacrificial material removal or separation processes are sometimes referred to as a release process and may or may not involve the separation of structural material from a build substrate. In many embodiments, sacrificial material within a given build layer is not removed until all build layers making up the three-dimensional structure have been formed. Of course sacrificial material may be, and typically is, removed from above the upper level of a current build layer during planarization operations during the formation of the current build layer. Sacrificial material is typically removed via a chemical etching operation but in some embodiments may be removed via a melting operation or electrochemical etching operation. In typical structures, the removal of the sacrificial material (i.e. release of the structural material from the sacrificial material) does not result in planarized surfaces but instead results in surfaces that are dictated by the boundaries of structural materials located on each build layer. Sacrificial materials are typically distinct from structural materials by having different properties therefrom (e.g. chemical etchability, hardness, melting point, etc.) but in some cases, as noted previously, what would have been a sacrificial material may become a structural material by its actual or effective encapsulation by other structural materials. Similarly, structural materials may be used to form sacrificial structures that are separated from a desired structure during a release process via the sacrificial structures being only attached to sacrificial material or potentially by dissolution of the sacrificial structures themselves using a process that is insufficient to reach structural material that is intended to form part of a desired structure. It should be understood that in some embodiments, small amounts of structural material may be removed, after or during release of sacrificial material. Such small amounts of structural material may have been inadvertently formed due to imperfections in the fabrication process or may result from the proper application of the process but may result in features that are less than optimal (e.g. layers with stairs steps in regions where smooth sloped surfaces are desired. In such cases the volume of structural material removed is typically minuscule compared to the amount that is retained and thus such removal is ignored when labeling materials as sacrificial or structural. Sacrificial materials are typically removed by a dissolution process, or the like, that destroys the geometric configuration of the sacrificial material as it existed on the build layers. In many embodiments, the sacrificial material is a conductive material such as a metal. As will be discussed hereafter, masking materials though typically sacrificial in nature are not termed sacrificial materials herein unless they meet the required definition of sacrificial material.

"Supplemental sacrificial material" as used herein refers to a material that does not form part of the structure when the structure is put to use and is not added as part of the build layers but instead is added to a plurality of layers simultaneously (e.g. via one or more coating operations that applies the material, selectively or in a blanket fashion, to a one or more surfaces of a desired build structure that has been released from an initial sacrificial material. This supplemental sacrificial material will remain in place for a period of time and/or during the performance of certain post layer formation operations, e.g. to protect the structure that was released from a primary sacrificial material, but will be removed prior to putting the structure to use.

"Primary sacrificial material" as used herein is a sacrificial material that is located on a given build layer and which is typically deposited or applied during the formation of that build layer and which makes up more than 20% of the sacrificial material volume of the given build layer. In some embodiments, the primary sacrificial material may be the same on each of a plurality of build layers or may be different on different build layers. In some embodiments, a given primary sacrificial material may be formed from two or more materials by the alloying or diffusion of the two or more materials to form a single material.

"Secondary sacrificial material" as used herein is a sacrificial material that is located on a given build layer and is typically deposited or applied during the formation of the build layer but is not a primary sacrificial material as it individually accounts for only a small volume of the sacrificial material associated with the given layer. A secondary sacrificial material will account for less than 20% of the volume of the sacrificial material associated with the given layer. In some preferred embodiments, each secondary sacrificial material may account for less than 10%, 5%, or even 2% of the volume of the sacrificial material associated with the given layer. Examples of secondary structural materials may include seed layer materials, adhesion layer materials, barrier layer materials (e.g. diffusion barrier material), and the like. These secondary sacrificial materials are typically applied to form coatings having thicknesses less than 2 microns, 1 micron, 0.5 microns, or even 0.2 microns). The coatings may be applied in a conformal or directional manner (e.g. via CVD, PVD, electroless deposition, or the like). Such coatings may be applied in a blanket manner or in a selective manner. Such coatings may be applied in a planar manner (e.g. over previously planarized layers of material) as taught in U.S. patent application Ser. No. 10/607,931, now U.S. Pat. No. 7,239,219. In other embodiments, such coatings may be applied in a non-planar manner, for example, in openings in and over a patterned masking material that has been applied to previously planarized layers of material as taught in U.S. patent application Ser. No. 10/841,383, now U.S. Pat. No. 7,195,989. These referenced applications are incorporated herein by reference as if set forth in full herein.

"Adhesion layer", "seed layer", "barrier layer", and the like refer to coatings of material that are thin in comparison to the layer thickness and thus generally form secondary structural material portions or sacrificial material portions of some layers. Such coatings may be applied uniformly over a previously formed build layer, they may be applied over a portion of a previously formed build layer and over patterned structural or sacrificial material existing on a current (i.e. partially formed) build layer so that a non-planar seed layer results, or they may be selectively applied to only certain locations on a previously formed build layer. In the event such coatings are non-selectively applied, selected portions may be removed (1) prior to depositing either a sacrificial material or structural material as part of a current layer or (2) prior to beginning formation of the next layer or they may remain in place through the layer build up process and then etched away after formation of a plurality of build layers.

"Masking material" is a material that may be used as a tool in the process of forming a build layer but does not form part of that build layer. Masking material is typically a photopolymer or photoresist material or other material that may be readily patterned. Masking material is typically a dielectric. Masking material, though typically sacrificial in nature, is not a sacrificial material as the term is used herein. Masking material is typically applied to a surface during the formation of a build layer for the purpose of allowing selective deposition, etching, or other treatment and is removed either during the process of forming that build layer or immediately after the formation of that build layer.

"Multilayer structures" are structures formed from multiple build layers of deposited or applied materials.

"Multilayer three-dimensional (or 3D or 3-D) structures" are multilayer structures that are formed from at least two layers where the structural material portion of at least two of the at least two layers at least partially overlap and are bonded together but where at least one of the layers has a portion that does not completely overlap structural material portions of the other. In other words a Boolean intersection of the area covered by the two layers is non-zero and a Boolean subtraction of the area covered by at least one of the layers relative to the other layer is non-zero (i.e. an upper layer has a down-facing portion relative to the lower layer or the lower layer has an up-facing portion relative to the upper layer.

"Complex multilayer three-dimensional (or 3D or 3-D) structures" are multilayer three-dimensional structures formed from at least three layers where, when considering a single structure, a line may be defined that hypothetically extends vertically through at least some portion of the build layers of the structure and extends from structural material through sacrificial material and back through structural material or will extend from sacrificial material through structural material and back through sacrificial material (these might be termed vertically complex multilayer three-dimensional structures). Alternatively, complex multilayer three-dimensional structures may be defined as multilayer three-dimensional structures formed from at least two layers where, when considering a single structure, a line may be defined that hypothetically extends horizontally through at least some portion of a build layer of the structure that will extend from structural material through sacrificial material and back through structural material or will extend from sacrificial material through structural material and back through sacrificial material (these might be termed horizontally complex multilayer three-dimensional structures). Worded another way, in complex multilayer three-dimensional structures, a vertically or horizontally extending hypothetical line will extend from one or structural material or void (when the sacrificial material is removed) to the other of void or structural material and then back to structural material or void as the line is traversed along at least a portion of the line.

"Moderately complex multilayer three-dimensional (or 3D or 3-D) structures are complex multilayer 3D structures for which, when considering a single structure, the alternating of void and structure or structure and void not only exists along one of a vertically or horizontally extending line but along lines extending both vertically and horizontally.

"Highly complex multilayer (or 3D or 3-D) structures are complex multilayer 3D structures for which, when considering a single structure, the structure-to-void-to-structure or void-to-structure-to-void alternating occurs not once but occurs a plurality of times along a definable horizontally or vertically extending line.

"Up-facing feature" is an element dictated by the cross-sectional data for a given build layer "n" and a next build layer "n+1" that is to be formed from a given material that exists on the build layer "n" but does not exist on the immediately succeeding build layer "n+1". For convenience the term "up-facing feature" will apply to such features regardless of the build orientation.

"Down-facing feature" is an element dictated by the cross-sectional data for a given build layer "n" and a preceding build layer "n−1" that is to be formed from a given material that exists on build layer "n" but does not exist on the immediately preceding build layer "n−1". As with up-facing features, the term "down-facing feature" shall apply to such features regardless of the actual build orientation.

"Continuing region" is the portion of a given build layer "n" that is dictated by the cross-sectional data for the given build layer "n", a next build layer "n+1" and a preceding build layer "n−1" that is neither up-facing nor down-facing for the build layer "n".

"Minimum feature size" refers to a necessary or desirable spacing between structural material elements on a given layer that are to remain distinct in the final device configuration. If the minimum feature size is not maintained on a given layer, the fabrication process may result in structural material inadvertently bridging the two structural elements due to masking material failure or failure to appropriately fill voids with sacrificial material during formation of the given layer such that during formation of a subsequent layer structural material inadvertently fills the void. More care during fabrication can lead to a reduction in minimum feature size or a willingness to accept greater losses in productivity can result in a decrease in the minimum feature size. However, during fabrication for a given set of process parameters, inspection diligence, and yield (successful level of production) a minimum design feature size is set in one way or another. The above described minimum feature size may more appropriately be termed minimum feature size of sacrificial material regions. Conversely a minimum feature size for structure material regions (minimum width or length of structural material elements) may be specified. Depending on the fabrication method and order of deposition of structural material and sacrificial material, the two types of minimum feature sizes may be different. In practice, for example, using electrochemical fabrication methods and described herein, the minimum features size on a given layer may be roughly set to a value that approximates the layer thickness to form the layer and it may be considered the same for both structural and sacrificial material widths and lengths. In some more rigorously implemented processes, examination regiments, and rework requirements, it may be set to an amount that is 80%, 50%, or even 30% of the layer thickness. Other values or methods of setting minimum feature sizes may be set.

"Sub-layer" as used herein refers to a portion of a build layer that typically includes the full lateral extents of that build layer but only a portion of its height. A sub-layer is usually a vertical portion of build layer that undergoes independent processing compared to another sub-layer of that build layer. In fact as used herein, use of a sub-layer in the formation of a layer requires use of at least a second sub-layer in formation of that layer and as such, the sub-layers shall be numbered (e.g. first, second, etc., depending on their order of formation) and the layer of which they form a part will be referred to a as a "compound layer" to avoid confusion with normal layer build up processes as set forth herein.

Fabrication Methods for Providing Enhanced Structural Properties

The teachings of the present application are centered around six embodiments, or layer processing methods, and numerous variations thereof which are set forth explicitly herein.

The first-sixth embodiments provide methods for forming devices that include regions of partially or completely encapsulated material whereby the one or more encapsulated materials function as structural materials having different chemical, mechanical, electrical, and/or thermal properties relative to the encapsulating material. Desired mechanical, chemical, electrical, and/or thermal properties for the device as a whole, or for a particular portion of the device, may be achieved by selecting appropriate combinations and quantities of encapsulating and encapsulated materials. For example, one or more of the materials may provide high yield strength or high temperature stability (e.g. the encapsulating material or materials) while one or more other materials (e.g. the encapsulated material or materials) provide higher thermal and/or electrical conductivity where the overall properties are derived from the properties of the two or more structural materials that are utilized, their relative amounts, and their relative positions (e.g. locations and orientations) within the device.

The first embodiment provides a method for forming a multi-layer structure using a shell structural material, a core structural material and at least one sacrificial material with only a single selective patterning needing to occur per layer and wherein under general circumstances only partial encapsulation of the core structural material occurs by the shell structural material but under specific circumstances complete encapsulation can occur. In some variations of this embodiment, the method may allow multiple structural materials to be formed during the creation of individual layers where such modification may be utilized in forming only a portion of the layers (i.e. on one or more of the layers but not all the layers). In this embodiment, the shell structural material forms upward facing pockets (i.e. facing away from previously formed layers) for holding the core structural material. In some variations of this embodiment, multiple masking operations may be used during the formation of individual layers to yield structures with even further enhanced configurations or properties.

Figure 5A:
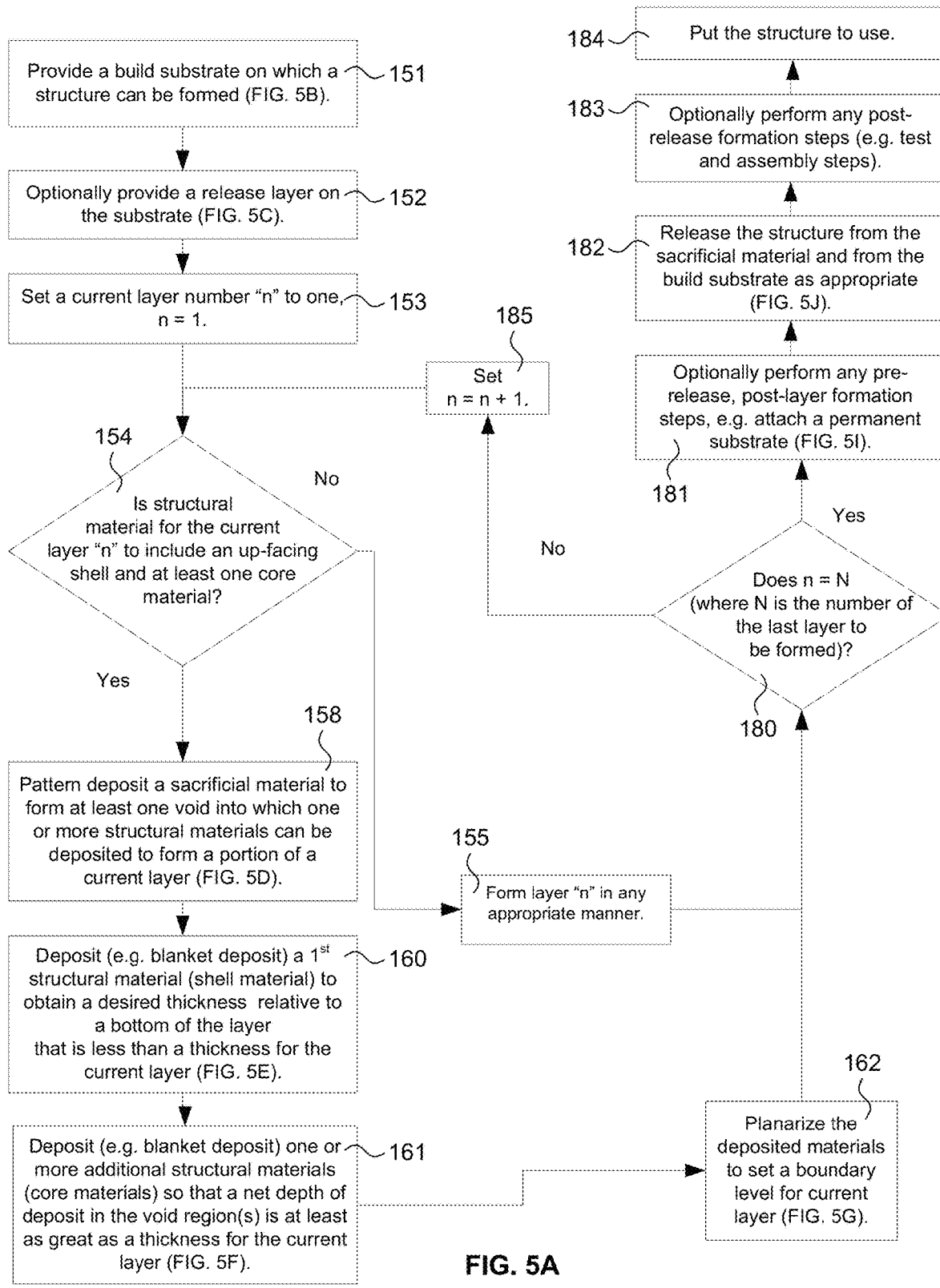
FIG. 5A provides a flowchart for a process according to a first embodiment of the invention where two structural materials are used in the formation of at least a portion of the layers of the structure, wherein a first structural material acts as a shell material and the second structural material acts as a core material, wherein, in general, the shell material does not fully encapsulate the core material, and wherein the sidewalls of the shell may be narrower than a minimum feature size associated with the formation of the layer containing the walls.

FIG. 5A provides a flowchart for a process according to the first embodiment of the invention where two structural materials are used in the formation of at least a portion of the layers of the structure, wherein a first structural material acts as a shell material and the second structural material acts as a core material, wherein, in general, the shell material does not fully encapsulate the core material, and wherein the sidewalls of the shell may be narrower than a minimum feature size associated with the formation of the layer containing the walls.

The process of FIG. 5A starts with step 151 which call for providing a build substrate on which a structure can be formed.

Next the process moves to step 152 which calls for the providing of an optional release layer on the substrate which may, for example, be used to allow removal of the structure from the substrate after formation of the multiple layers of the structure.

Next the process, in step 153, sets a layer count variable equal to one (n=1) in preparation for beginning formation of a first layer of the structure. The process then moves forward to a processing branch or decision block, step 154, where an enquiry is made as to whether or not the particular layer that will be formed is to be formed with an up-facing shell configuration and a corresponding core material. If the answer is "yes" the process moves forward to step 158 but if the answer is "no", the process moves forward to step 155 which calls for the formation of the current layer "n" in any desired manner. If step 155 is implemented the formation of layer "n" may be performed, for example, using one of the layer formation methods set forth in the background section of the current application, one of the layer formation methods set forth in one of the patents or applications that are incorporated in the current application by reference, or one of the alternative methods set forth in this detailed description of this application. A specific example of a formation process includes (1) selectively depositing a first material (e.g. one of a structural material and a sacrificial material) to form part of the current layer "n"; (2) depositing at least one additional material to form another part of the current layer "n" (e.g. the other of a structural material and a sacrificial material); and (3) planarizing the deposited materials to set a boundary level for current layer.

Turning back to step 158, a sacrificial material is deposited by a patterned deposition (e.g. electrodeposition into one or more voids in a masking material). After removal of any masking material that was used in the deposition step, a void is left behind into which a structural material can be deposited in accordance with step 160. The deposited sacrificial material forms a portion of the current layer. In some embodiment variations, the sacrificial material may be deposited by direct deposition, e.g. ink jetting or controlled extrusion, while in other embodiment variations, the sacrificial material may be blanket deposited and then patterned by selective etching.

Next the process moves forward to Step 160 which calls for the deposition of a structural material to a depth or thickness that is less than the desired layer thickness. This deposition will result in a shell of genuine structural material forming a base or floor and side walls along the edges of the sacrificial material. The depth of deposition is selected to provide a desired base thickness a desired wall thickness, and a desired void thickness (i.e. a thickness between the top of the shell material and the overlying boundary level of the layer) which will hold a core material that will be deposited in step 161. The shell material may be deposited in a blanket manner so that it not only fills the void but also overlies the upper surface of the sacrificial material or alternatively it may be deposited selectively (e.g. in one of the manners noted above in association with step 158).

Next the process moves forward to Step 161 which calls for the deposition of a core material. Unless the next layer to be formed provides for completing the encapsulation of the core material deposited in this step, the core material needs to be a genuine structural material like the shell material, otherwise it may be subject to removal when the sacrificial material is removed in a subsequent step.

The process next moves to step 162 which calls for the planarization of the deposited sacrificial and structural materials to set a boundary level of the current layer. The planarization step may involve a variety of different operations or steps that are based on the various planarization processes mentioned elsewhere herein. In some embodiment variations of this step may be implemented using one or more of the methods set forth in U.S. Pat. No. 7,271,888, by Frodis et al., and entitled "Method and Apparatus for Maintaining Parallelism of Layers and/or Achieving Desired Thicknesses of Layers During the Electrochemical Fabrication of Structures" which is hereby incorporated herein by reference.

From step 162 and step 155, the process moves forward to step 180 which enquires as to whether or not layer "n" just formed is the last layer, i.e. does n=N?, wherein N is the number of the last layer. If the answer is "no" the process proceeds to step 185 where the current layer number is incremented by 1, i.e. n=n+1. After step 185 the process loops back to step 154 which was discussed above. If the answer is "yes" from step 180, layer fabrication is complete and the process moves forward to the post layer formation steps 181-184.

Step 181 calls for the, optional performance of any pre-release, post layer formation step. Such a step might, for example, include attaching a permanent substrate, performing diffusion bonding, dicing one or more structures from other structures, performance of testing operations on test structures that may have been formed along with structures and/or application of a barrier material (e.g. photoresist or tape) to provide easy release locations and hard to release (i.e. shielded) locations.

Next the process moves forward to step 182 which calls for the release of the structure or structures (or at least a portion of the structures). This release may occur by a variety of methods. Such methods may include, for example, those steps forth explicitly herein or those incorporated herein by reference (such as those set forth in the '347 application referenced in the table below).

Next the process moves forward to step 183 which calls for the optional performance of any post release formation steps. These steps for example may include coating, testing, and/or assembly steps such as attachment of a released structure to a desired substrate or other component.

Finally the process ends with step 184 which calls for putting the structure to any desired use.

FIGS. 5B-5J schematically depict side views of various states of formation of an example device (e.g. a conductive probe for testing integrated circuits) formed by the process of FIG. 5A where the shell and core process are used in the formation of each layer of the structure. In this illustration of the process of the first embodiment, the device is formed with its longitudinal or vertical axis parallel to that of the build axis. In other examples the device being formed may have a longitudinal or vertical axis that lies in the plane of the layers in others it may be directed in a non-vertical or non-horizontal direction.

Figure 5B:
FIGS. 5B-5J schematically depict side views of various states of formation of an example device (e.g. a conductive probe for testing integrated circuits) formed by the process of FIG. 5A where the shell and core process are used in the formation of each layer of the structure.

In FIG. 5B, a temporary substrate 102 is provided according to step 151 of FIG. 5A.

Figure 5C:
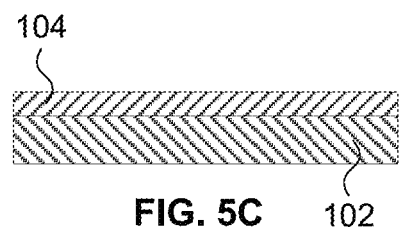

In FIG. 5C the state of the process is shown after a release layer of sacrificial material 104, e.g. Cu, is supplied (e.g. applied) according to step 152 of FIG. 5A. This application may occur in a variety of ways, such as, for example, via application and bonding of a sheet material or via deposition followed by planarization wherein the deposition process may include one or more of electroplating, electroless deposition, sputtering or other PVD process, or CVD.

Figure 5D:
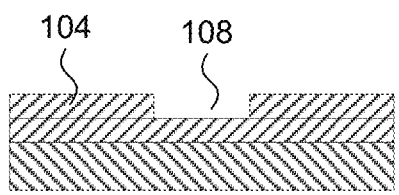

In FIG. 5D, a second level of the sacrificial material 104 has been selectively plated to form a portion of a first layer according to step 158 of FIG. 5A.

Figure 5E:
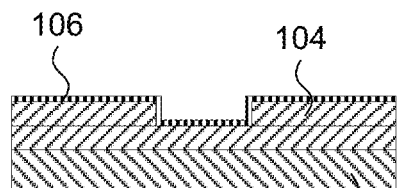
Figure 5F:
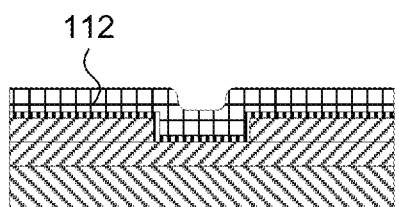

In FIG. 5E, a structural material or coating 106 (e.g., Au, Ag, Ni, Ni—Co, Ni—Mn, Ni—P, Pd, Pd—Co, or the like) is shown after blanket depositing has occurred according to step 160 of FIG. 5A. The thickness of this coating may be thin compared to the layer thickness or may be relative thick but does not reach or exceed the layer thickness. For example, layer thicknesses may range from 1-50 microns, or more, while coating thicknesses may range from less than 10% to something more than 90% of the layer thickness. In many implementations the coating thicknesses will typically be less than 25-50% of the layer thicknesses. In some embodiments these thicknesses may range from 1-20 microns and may more specifically be in the range of 5-20 microns or even 10-15 microns depending on the thickness of the shell desired. In some variations of the present embodiment the deposition of a first structural material or coating material 106 may occur in a selective manner by use of a mask that leaves openings over the void regions 108 in the sacrificial material. The thickness of the deposited coating material 106 is less than an intended thickness of the layer (i.e. its upper surface is located below the upper boundary level for the current layer so that it provides a cup or bowl like configuration which can hold a second structural material 112 to be deposited as is shown in FIG. 5F according to step 161 of FIG. 5A. The second structural material 112 may be any of a variety of materials depending on the purpose the core is to serve and the properties of the material. Example materials include gold (Au), silver (Ag), nickel (Ni), nickel-phosphor (Ni—P), nickel-cobalt (Ni—Co), nickel-manganese (Ni—Mn), palladium (Pd), Palladium-cobalt (Pd—Co), and tin (Sn), or the like. In some variations of the present embodiment, the deposition of the second structural material 112 may occur in a selective manner (e.g. into voids within a patterned masking material or via a direct writing method).

Figure 5G:
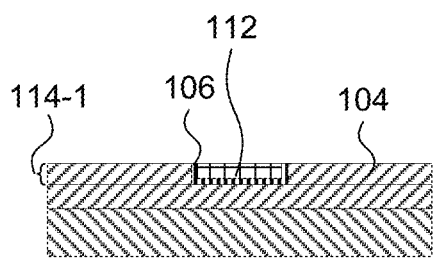

FIG. 5G shows the state of the process after the deposited materials have been planarized according to step 162 of FIG. 5A to define a layer 114-1 which includes regions of a second structural material 112, and regions of sacrificial material 104 which are separated by one or more regions of structural material 106. Structural material 106 provides a shell of structural material while material 112 provides a core of structural material and depending on the configuration, positioning, and internal structure of the next layer, the core material 112 may or may not become fully encapsulated by the shell material.

Figure 5H:
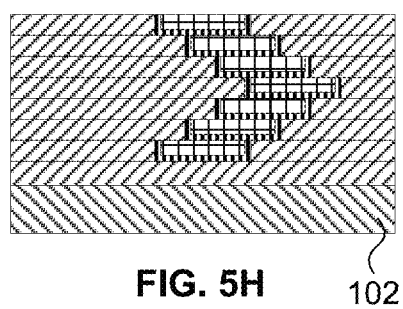

FIG. 5H shows the state of the process after multiple layers have been formed using operations similar to those used in forming the first layer (i.e. by repeating the steps of FIGS. 5D-5G six times) but wherein the device design calls for the structural material located on successive layers to have different configurations and/or locations.

Figure 5I:
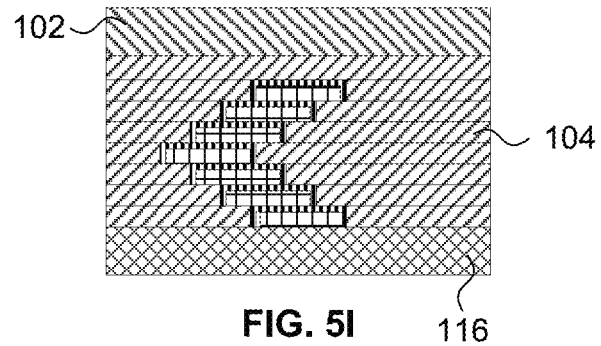

In FIG. 5I, the build, or fabricated sacrificial material encased device, has been transferred to and bonded (using solder or other bonding means not shown) to a space transformer or other substrate 116 as an example of step 181 of FIG. 5A.

Figure 5J:
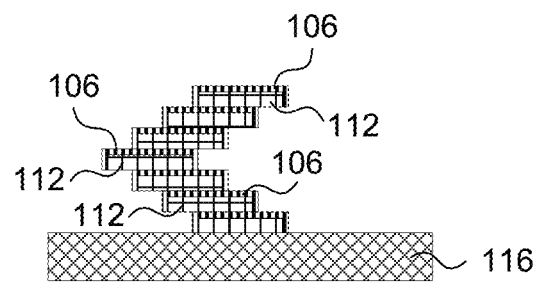

In FIG. 5J, the formed structure, comprised of the second structural material 112 and the first structural material (i.e. coating material) 106 has been released from the sacrificial material 104 and from substrate 102 while remaining attached to substrate 116.

Since the coating material 106 only envelops or entraps the structural material on three sides (as shown in FIGS. 5G-5J) out of four for general structure configurations, the etchant used to attack the sacrificial material must not more than minimally attack both the shell structural material 106 and the core structural material 112 which forms the device (e.g. a probe structure). In some embodiments, a sacrificial material may be copper. Examples of electrodepositable structural materials that are compatible with copper (Cu) etchants include, for example, gold (Au), silver (Ag), nickel (Ni), nickel-phosphor (Ni—P), nickel-cobalt (Ni—Co), nickel-manganese (Ni—Mn), palladium (Pd), Palladium-cobalt, (Pd—Co) and tin (Sn).

Devices, such as probes, made primarily with a Ni or Ni alloy core and a thin Au coating will have mechanical properties similar to those made purely from Ni/Ni alloy (i.e., without a coating), but with lower overall resistance due to the Au coating.

Devices, such as probes, made with an Au core and a Ni/Ni alloy coating, on the other hand, may have a lower spring constant than those made with Ni/Ni alloy cores, but may have a particularly low resistivity.

In some alternative embodiments the compressive direction or tensional direction of a spring probe device when in use may be parallel, perpendicular, or at some other angle relative to the stacking direction of the layers from which the device is formed. In some embodiments, e.g. in the example of FIG. 5J, the device may be configured and fabricated so that its primary movement direction (i.e. the active compressional or tensional direction during use) and stacking direction are largely coincident. In some other alternative embodiments, the device (e.g. spring probe) may be configured to have a particular movement direction (e.g. compressional or tensional working direction) which may lie in the plane of the layers that are used to form the device.

Ability to vary the structural material used in forming a structure and its distribution throughout the structure leads to more flexibility in achieving a desired set of functional objectives for a particular device configuration. When an immediately succeeding layer (i.e. a next layer) includes a structural material region that is identical to, or otherwise largely or completely overlays the structural material on an immediately preceding layer (i.e. the current layer), complete encapsulation of structural material on the current layer will occur once the first structural material for the succeeding layer is deposited. The complete encapsulation of a second structural material for the current layer within one or more different shell materials (e.g. a first structural material) will occur by the base and side walls formed on the current layer and by the base of the deposit of the shell material on the immediately succeeding layer. In some embodiment variations, the shell material may be different on different layers as might be the core material. In particular, core material may be different for different layers and may be dependent on whether complete encapsulation occurs or not.

In some implementations of the process of FIGS. 5A-5J, not all layers, or all portions of each layer, may be formed with two or more structural materials and as such the deposition of and partial or complete encapsulation of a second structural material may be limited to only a portion of the layers (i.e. to one or more layers). Such selective utilization of layers, or layer portions, can provide an enhanced range of functional variations so that better balances of properties can be achieved, e.g. balances of conductivity, probe width, and spring force. In some alternative embodiments, the last layer may be formed with only a first structural material so that this material completely encapsulates the second structural material of the preceding layer and doesn't result in a second structural material that requires a separate capping layer.

In some implementations of the embodiment of FIGS. 5A-5J, the process may have particularly usefulness when the width of a region of second structural material (i.e. the encapsulated or partially encapsulated material) is to be less than a minimum feature size for the process being used or when the wall thickness of the shell material is less than a minimum feature size of the process. In such cases it will not be possible to make a mask having a width that is small enough to reliably cover the region of second structural material or may not be openable (e.g. developable in the case of photoresist) so as to form a reliable opening that can be plated into to form walls of desired width. In such cases, the base and walls of the structural material region on a given layer may be formed with a first structural material by depositing it into a region that was originally defined by an opening having much larger width, i.e. the width of the second material region plus twice the width of the wall region that is being formed, which would be larger than the minimum feature size. After deposition of the first structural material, the second structural material can be deposited to the narrowed region thus achieving an effective deposit of the first structure material that is narrower than the minimum features size (at least in the wall areas) and possibly a width of deposit of the second structural material that is also effectively less than that of the minimum feature size.

The width of the coating in the wall regions relative to the width and thickness of the core material may be adjusted to tailor the mechanical and electrical properties of the device. In applications where high frequency signals will be carried, it may be desirable to use a low resistance material (e.g. Au) as the coating material and a different material as the core material. It should also be noted that use of a high modulus material (e.g. Ni or NiCo) as a coating material may bring an enhanced modulus to the structure as a whole due to the larger distance of the high modulus material from a neutral bending axis when the structure is put to use.

A second embodiment as discussed herein next provides a method that is similar to the method of the first embodiment in many ways but has a difference in that each layer that includes a core material is fully encapsulated on the bottom, sides, and top by a shell of structural material regardless of layer-to-layer configuration variations. In this embodiment, a core along with a shell that encapsulates the bottom and sides of the core are formed in association with a single layer, or what may be considered a first sub-layer of the current layer, and then capping occurs in association with an immediately succeeding dedicated capping layer, or what may be termed a second sub-layer of the current layer. As with the first embodiment, the formation of the core and the partially surrounding shell material occurs via the use of a single patterning operation (e.g. using a single photoresist mask). In this embodiment, the core material may be the same material as is used for a sacrificial material or may be some other material. The core material may be prevented from being removed from the structure during release of the structure from the sacrificial material by the presence of the completely encapsulating structural material (i.e. the shell material). Sometimes the core material is referred to as a functional structural material in that is included in the final structure but in the absence of the protective shell material, the functional structural material would have been removed during the process of releasing the structure from surrounding sacrificial material as the etchant that removes the sacrificial material would have also removed the functional structure material. In this embodiment, individual layers may be viewed as individually planarized thicknesses of structural and sacrificial materials in which case complete encapsulation of core material requires two layers with the top layer being a capping layer. Alternatively in this embodiment, individual layers may be viewed (i.e. when core regions exist) as compound layers that include at least a first lower sub-layer portion and a upper, second sub-layer portion. As used hereafter "layer" by itself will refer to a non-compound layer while "compound layer" will refer to a layer that is made up of a plurality of vertically stacked sub-layers. In some variations of this embodiment, a structure may be formed from one or more compound layers and one or more non-compound layers. As with the first embodiment, in this embodiment, the shell structural material forms upward facing pockets on the first sub-layer portions (i.e. facing away from previously formed layers) for holding the core structural material. In some variations of this embodiment, multiple masking operations may be used during the formation of individual non-compound layers and compound layers to yield structures with enhanced configurations or properties.

Figure 6A:
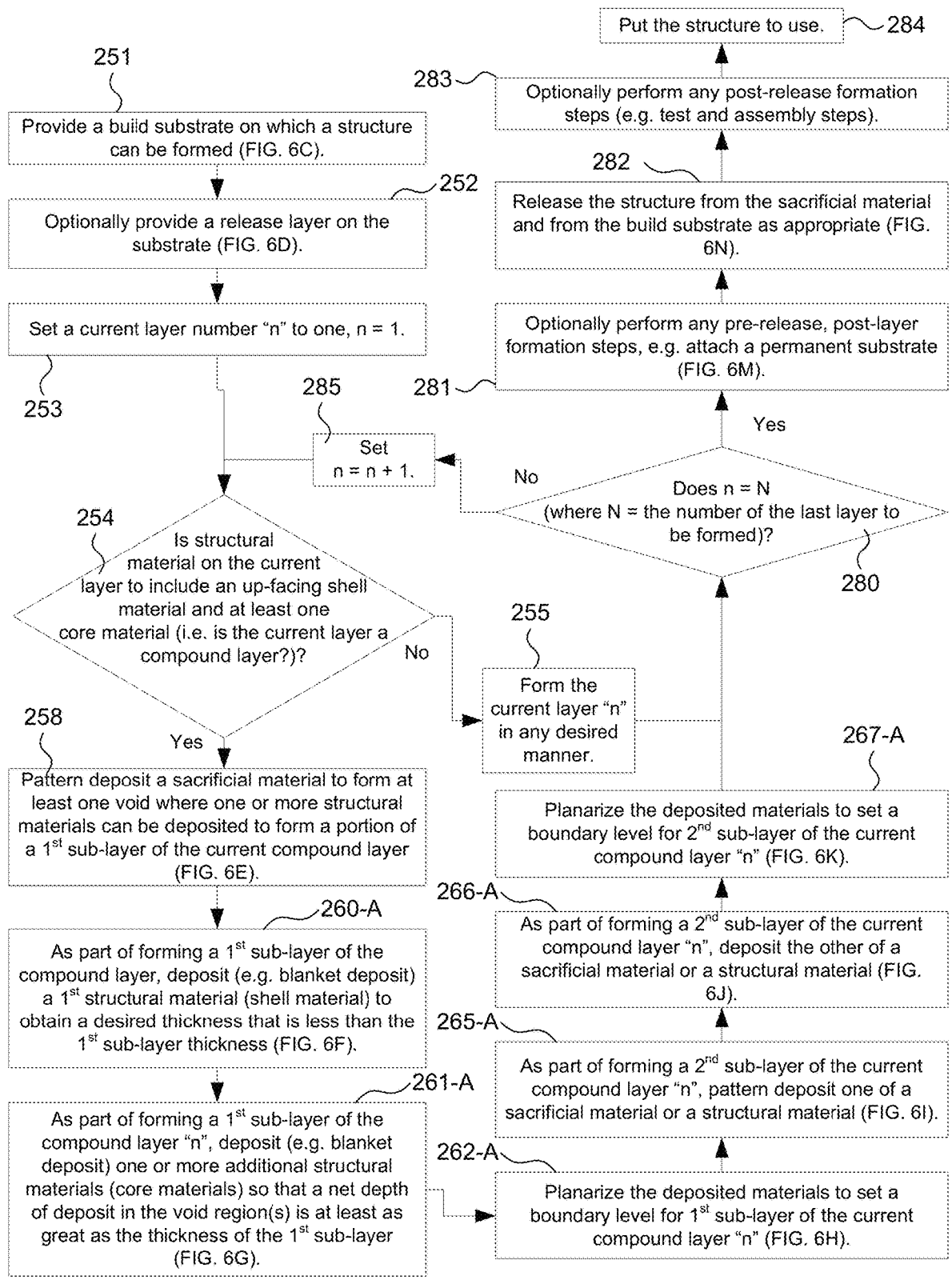
FIG. 6A provides a flowchart for a process according to a second embodiment of the invention where the structure is formed from at least a first structural material that provides a shell material that fully encapsulates at least a second structural material that is a core structural material and may also be a functional structural material and wherein some layers used in forming the structure are compound layers formed of a plurality of stacked sub-layers wherein a first sub-layer of each compound layer provides an up-facing shell structural material and a core structural material and a second sub-layer of each compound layer provides a capping structural material for the core structural material located on the immediately preceding sub-layer, and wherein the sidewalls of the shell may be narrower than a minimum feature size associated with the formation of the sub-layer containing the walls.

FIG. 6A provides a flowchart for a process according to a second embodiment of the invention where the structure is formed from at least a first structural material that provides a shell material that fully encapsulates at least a second structural material that is a core structural material and may also be a functional structural material and wherein some layers used in forming the structure are compound layers formed of a plurality of stacked sub-layers wherein a first sub-layer of each compound layer provides an up-facing shell structural material and a core structural material and a second sub-layer of each compound layer provides a capping structural material for the core structural material located on the immediately preceding layer, and wherein the sidewalls of the shell may be narrower than a minimum feature size associated with the formation of the layer containing the walls.

Figure 6B:
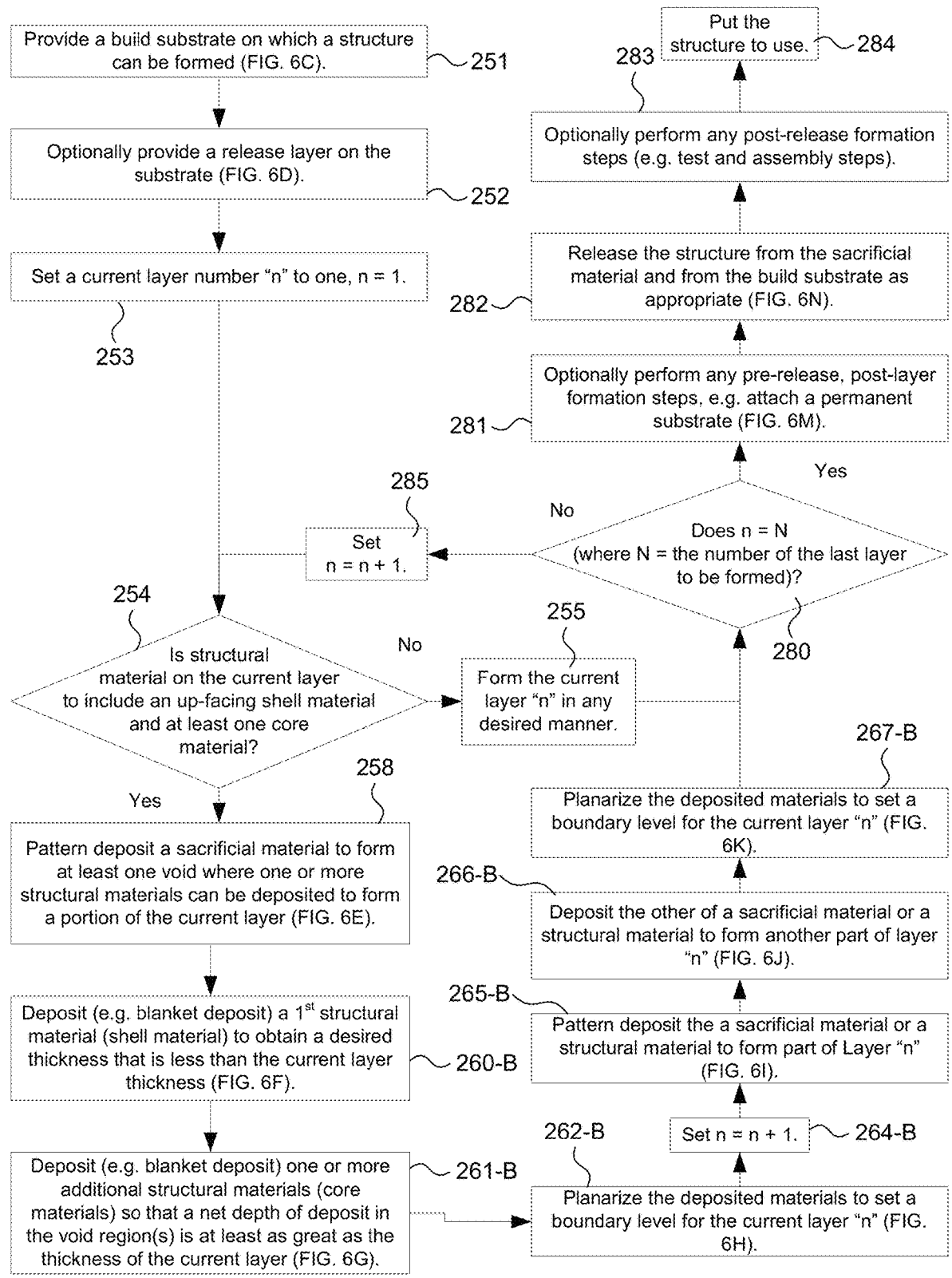
FIG. 6B provides a flowchart for the same process as set forth in FIG. 6A with the exception that instead of viewing the up-facing encapsulating shell material and the core material as being formed on a first sub-layer and a capping material being formed on an immediately succeeding second sub-layer of a compound layer, each fully planarized level of structural and sacrificial material is considered a separate layer and thus up-facing shell and core material formed on a particular layer are followed by the formation of a corresponding capping layer.

FIG. 6B provides a flowchart for the same process as set forth in FIG. 6A with the exception that instead of viewing the up-facing encapsulating shell material and the core material as being formed on a first sub-layer and a capping material being formed on an immediately succeeding second sub-layer of the compound layer, each fully planarized level of structural and sacrificial material is considered a separate layer and thus up-facing shell and core material formed on a particular layer are followed by the formation of a corresponding capping layer.

The processes of FIGS. 6A & 6B have many steps in common with the process of FIG. 5A. In particular, steps 251-258 and 280-285 of FIGS. 6A & 6B are substantially identical to steps 151-158 and 180-185 of FIG. 5A, respectively, and will be minimally discussed hereafter as the comments provided with regard to the FIG. 5A steps are believed equally applicable to the corresponding reference numbers in FIGS. 6A and 6B. Step 258 uses the expression a "$1^{st}$ sub-layer of the current compound layer" in association with FIG. 6A and just "current layer" in association with FIG. 6B. For the reasons noted above, the steps are otherwise substantially identical.

Steps 260-A to 262-A of FIG. 6A are similar to steps 160-162 of FIG. 5A but instead of applying to an "n" layer as a whole they apply to the formation of a first sublayer that forms a portion of the current compound layer "n". Steps 265-A to 267-A have no equivalents in the process of FIG. 5A. Step 265-A calls for the forming of a part of a second sub-layer of current compound layer "n" by selectively depositing one of a structural material or a sacrificial material while step 266-A calls for the deposition of the other of the sacrificial or structural material to form another part of the second sub-layer of compound layer "n". Step 267-A calls for the planarization of the materials deposited in steps 265-A and 266-A to set a boundary level for the second sub-layer of current compound layer "n". As a whole, steps 265-A to 267-a result in the capping of the core material region of the first sub-layer with a genuine structural material. In variations of this embodiment the first and second sub-layers may have the same heights or they may have different heights. Unlike the first embodiment, where complete encapsulation only occurs under certain geometric constraints, in this second embodiment, complete encapsulation is ensured by the formation of the second sub-layer which selectively places capping material on a first sub-layer containing an up-facing shell material and associated core material. Many of the alternatives discussed above in association with the first embodiment are also applicable to this embodiment.

As noted above, the flowchart of FIG. 6B sets forth a process that is substantially identical to the process of FIG. 6A with the exception that different terminology is used to describe what is being created. In particular in the process of FIG. 6B, instead of considering shell/core material sub-layers and subsequent capping sub-layers as sub-layers of a single compound layer "n', this variation considers the shell/core material sub-layer to be a layer and the subsequent capping layer to be an adjacent but distinct layer. Due to this two-layer vs. one compound layer distinction, the method of FIG. 6B includes an additional step 264-B which causes an incrementing of the layer number "n" after completion of steps 260-B-262-B which are similar to steps 260-A-262-A in their effective result. Steps 265-B to 267-B are likewise similar to steps 265-A-267-A of FIG. 6A in their effective result.

FIGS. 6C-6N schematically depict side views of various states of formation of an example device (e.g. a conductive probe for testing integrated circuits) formed by the process of FIG. 6A or 6B.

FIGS. 6C-6N schematically depict side views of various states during the formation of a device (e.g. a probe) being formed by a process according to the second embodiment of the invention where the device is formed from a core material and a material that completely defines the bottom, sides, and top surfaces of each layer of the probe where each layer, in the terminology of FIG. 6A is a considered a compound or multi-part layer that includes a plurality of sub-layers. As illustrated each compound layer includes a first sub-layer portion and a second sub-layer portion. The first sub-layer portion includes an encapsulating structural material in the form of a shell that bounds the bottom and sides of a core structural material region where the core structural material may be a functional structural material (i.e. a material that would be removed with removal sacrificial material or significantly damaged by the removal of the sacrificial material if a releasing etchant had access to it) that occupies at least a portion of the region defined by the bounding walls of the encapsulating (shell) structural material. The second sub-layer portion is formed above the first sub-layer and provides a selective region of a capping material for bounding the top of the encapsulated material to trap it within the shell of the first structural material (or in some variations with a shell of a plurality of structural materials that are not attacked by an etchant that is used in the release of the structure from sacrificial material). Looked at from the perspective of FIG. 6B, this embodiment builds up a structure from a plurality of adhered layers where layers that contain a core material are followed by the formation of capping layers that complete the entrapment or encapsulation of the core material within a shielding or shell of a different structural material.

In this second process embodiment a two-material device (e.g. a probe or body of a probe) may be formed while using only two materials in the build process (i.e. a first structural material and a material that functions as a sacrificial material at times and as a second structural material at other times, i.e. a functional structural material). In some variations of this embodiment one or more additional materials may be included, for example as a hardened tip material This may be accomplished by fully encapsulating what would otherwise be a sacrificial material within a surrounding envelope or shell of a first structural material in regions that are to form solid parts of a structure.

In some variations of this embodiment, the devices may be formed in a batch manner (e.g. multiple devices may be formed simultaneously or in series on a common substrate) and then separated from the sacrificial material but not separated from the build substrate. In still other embodiments, the device may be separated from the build substrate without first bonding them to another substrate. The devices may be used as released or bonded to other substrates, components, or the like after initial separation from the build substrate which may occur before or after release from the sacrificial material. In some variations of this embodiment, attachment to other components or substrates may occur before or after release from the build substrate.

Figure 6C:
FIGS. 6C-6N schematically depict side views of various states of formation of an example device (e.g. a conductive probe for testing integrated circuits) formed by the process of FIG. 6A or 6B.

In FIG. 6C, the state of the process is illustrated after a temporary substrate 202 is provided.

Figure 6D:

In FIG. 6D, the state of the process is illustrated after an optional layer of a sacrificial material 204 (e.g. Cu) has been applied or deposited and planarized. This layer of sacrificial material 204 may be applied to act as a means for readily releasing the devices or structures from the build substrate.

Figure 6E:

In FIG. 6E, the state of the process is shown after a second level of sacrificial material (e.g. Cu) has been selectively deposited and any patterned mask used in the selective deposition step removed. An alternative to this selective deposition step, for this embodiment and for the embodiment of FIGS. 5A-5I, is to blanket deposit the sacrificial material and then selective etch material away (e.g. via an opening in a patterned mask).

Figure 6F:
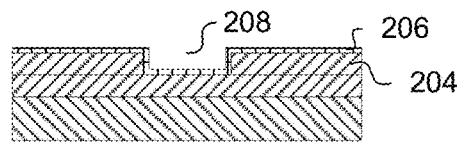
Figure 6G:
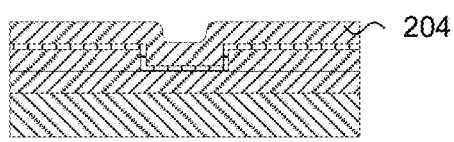
Figure 6H:
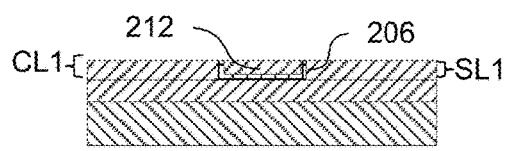
Figure 6I:
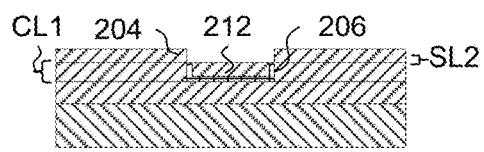
Figure 6J:
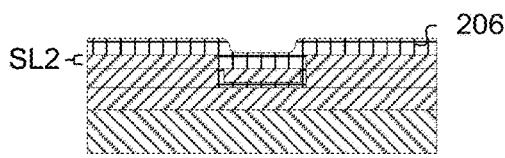
Figure 6K:
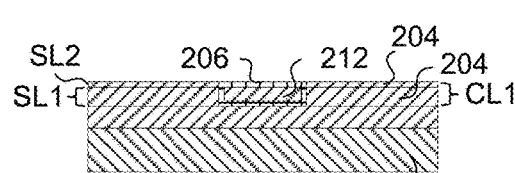

In FIG. 6F, the state of the process is shown after a coating material or structural material 206 is deposited as a thin shell or coating. In some implementations of the present embodiment, the same structural material may be used on a plurality of adhered layers or different structural materials may be used on different layers. Examples of structural materials include those noted above with regard to FIGS. 5B-5J. The first structural material may be blanket deposited to form a coating of a desired thickness that is less than the layer thickness in the base area of the shell and in the horizontally extending sidewall regions of the shell as well. In some implementations of this embodiment, thicknesses of such coatings may similar to the example thicknesses noted above with regard to FIGS. 5B-5J. As with variations of the first embodiment, in variations of this embodiment, the first structural material or coating material may be deposited in a selective manner. The thickness of the deposited structural material 206 is made less than the intended thickness or first sub-layer so that a quantity of what would otherwise be the sacrificial material 204 may be deposited into the remaining portion of void 208 to form a second structural material 212 (see FIG. 6H) within the pocket of the first structural material 206. The deposition of the sacrificial material 204 that becomes functional structural material 212 is shown in FIG. 6G (as 204) and is shown in FIG. 6H (as 212) after planarization completes formation of the first sub-layer (SL1) for a first compound or multi-part layer (CL1). FIG. 6I depicts the state of the process after a deposition of a sacrificial material 204 forms part of the second sub-layer (SL2) for the first compound or multi-part layer (CL1). As the sacrificial material 204 of SL2 will eventually undergo a planarization operation that will set the height or upper boundary of SL2, SL2 and CL1 are depicted in FIG. 6I as having boundary levels below the height of the deposited material 204. FIG. 6J shows the state of the process after an additional coating of structural material 206 is blanket deposited to fill the void formed in the sacrificial material 204 for SL2 of CL1 while FIG. 6K shows the state of the process after planarizing sets the height of the deposited structural material 206 and sacrificial material 204 of the second sub-layer (SL2) of the first compound layer (CL1) to a height matching the desired boundary level of the second sub-layer (SL2) and the first compound layer (CL1) as a whole.

Figure 6L:
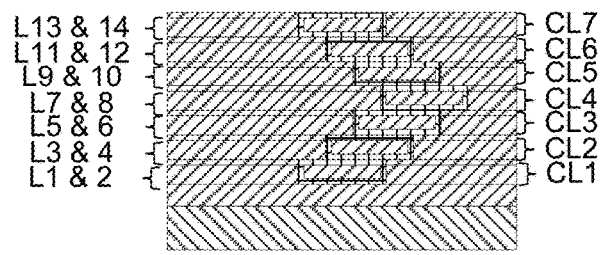

In FIG. 6L, in terms of the method of FIG. 6A, the state of the process is shown after multiple compound layers (CL1-CL7) have been completed. Every compound layer is formed from a first sub-layer and a second sub-layer, where the first sub-layers provides for an encapsulating structural material and a partially surrounded (i.e. on the bottom and sides) functional structural material while the second sub-layers provide for capping of functional structural material associated with the immediately preceding first sub-layer that is bounded by the encapsulating structural material of that immediately preceding first sub-layer. Alternatively considered, FIG. 6L shows the state of the process after 14 layers of the structure have been formed with alternating layers with odd ones providing functional structural material within pockets of a different structural material and even ones providing a capping layer of the different structural material.

In this embodiment, the capping layers, or second sub-layers, are formed from at least one structural material and at least one sacrificial material that are planarized. In this example, the formation of the additional compound layers occurs via the same processes used in forming the layer of FIGS. 6E-6K. The last layer of the structure may or may not be followed by the formation of a complete capping layer (L14) or second sub-layer (CL7) as shown in FIG. 6L. Instead of a complete final capping layer or second sublayer, a selective deposition of the structural material may be used which in turn may or may not be followed by planarization.

Figure 6M:
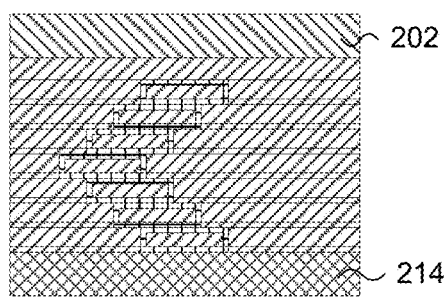

In FIG. 6M, the state of the process is shown after the structure, substrate, and surrounding sacrificial material have been transferred to and bonded to a space transformer 214 or other permanent substrate (by solder or other bonding means not shown).

Figure 6N:
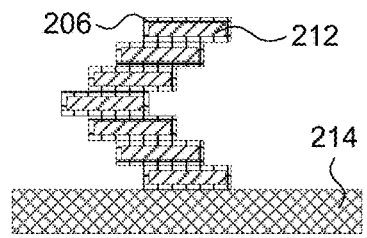

In FIG. 6N, the non-encapsulated sacrificial material 204 has been separated from the structure leaving behind the shell of structural material 206 that encapsulates the functional structural material 212. As with the embodiment of FIGS. 5A-5I, the thickness of the structural material relative to the thickness of the core sacrificial material 112 may be adjusted to tailor the mechanical and electrical properties of the structure.

It is important to ensure that no gap exists in the structural material that surrounds a functional structural material 212 (i.e. the "core" sacrificial material as distinguished from the sacrificial material 204 that will eventually be removed). Such a gap could allow etching of the functional structural material 212 or core sacrificial material 212. Since the only function of the second sub-layer is as a cap, the second sub-layer SL2 may be thinner than first sub-layer and in fact in some embodiments its thickness may approximate the thickness of the deposited encapsulating material used in forming the sub-layer.

In some variations of this second embodiment, instead of there being only a first (i.e. encapsulating) structural material and a second (i.e. encapsulated structural material) used during the formation of a first sub-layer, more than two structural materials may be deposited to provide more than one encapsulating and/or encapsulated material. In still other variations, structural material regions may be filled with different encapsulating materials and/or encapsulated materials and even some structural material regions formed only of a single structural material (e.g. a primary structural material). In some embodiments, the order of depositing sacrificial and structural materials may be varied from layer to layer.

In variations of this embodiment, instead of the cap, or structural material on the second sub-layer, being made to be identical in configuration to the structural material region of the previous layer, or the corresponding first sub-layer, it may be made to extend beyond the region of the structural material if such an extension exists in the subsequent layer or subsequent first sub-layer. However, as noted above with regard to the application of the first embodiment to the formation of two identical layers, the formation of the subsequent shell/core layer will automatically cap the second structural material on a previous layer without need for a separate capping layer or second sub-layer and as such recognition of such situations may allow a reduction in the number of layers or sub-layers that need to be formed while still achieving complete encapsulation.

In a variation of this embodiment, the plating of the capping material (i.e. structural material on a subsequent layer or on the second sub-layer) may be by pattern-plating of the structural material, instead of by pattern plating the sacrificial material, followed by blanket plating of the structural material. In some variations (e.g. when the cap is made thin enough, e.g. 1-2 microns in thickness, the plating of the sacrificial material and the planarizing of the cap layer may become unnecessary. The slight topography induced by patterned plating of the capping material may not significantly interfere with fabrication of a next layer. In such variations the plating of the capping material may be considered part of the formation of the previously layer that takes the otherwise planar layer slightly out of planarity but at a level that does not impact the normal formation of a next layer. This variation is, in part, the subject of the third embodiment that will be discussed hereafter.

In some variations of this embodiment, the deposition of capping material (i.e. structural material) during the formation of a capping layer may not result in the capping material being deposited over all regions of the preceding first sub-layer that contained the functional structural material. Instead the deposition of capping material may be limited to only those regions where no structural material exists on the first sub-layer of the next compound layer. In such a case, the additional structural material needed may be deposited during formation of this next layer. In still further alternatives, other capping material deposition patterns can be advantageously defined.

The third embodiment set forth herein is a modified version of the first and second embodiments. It modifies the first embodiment in that it provides full encapsulation of core material associated with the formation of individual layers and it modifies the second embodiment in that the capping of the core material is not provided by formation of a complete "capping" layer as a second sub-layer. In this embodiment, after formation of a layer containing a core material and a shell material that bounds the bottom and sides of the core material, a selective deposition of structural material, which may be relatively thin compared to the overall layer thickness, is provided to cap the core material and then a next layer of structural material and sacrificial material is formed over the bump made by the cap. In this embodiment, the capping material is not planarized in conjunction with a surrounding quantity of sacrificial material as it would be as part of a second sublayer. As with the first embodiment not all layers need include deposits of core structural material.

Like the method of the second embodiment, the full encapsulation result of this embodiment may allow the core structural material to be selected from a broader group of materials. As discussed above, the ability of the core structural material to withstand attack from sacrificial material etchants becomes moot if the coating or shell material provides such protection. For example, copper may be used as a structural material with a gold coating while nickel may be used as a sacrificial material since etchants that may be used to remove nickel do not attack gold but do tend to attack copper. The encapsulation may serve one or more of the following purposes: a) protect the core structural material during etching of sacrificial material; b) improve interlayer adhesion; c) decrease interlayer resistance; and d) prevent oxidation or other corrosion of surfaces of the core structural material. As with the previous embodiment, the method of this embodiment allows a single material to act as a core structural material and as a sacrificial material simultaneously. This embodiment may have particular usefulness for applications where electrical conductive is important such as in RF applications and in microprobe applications.

Figure 7A:
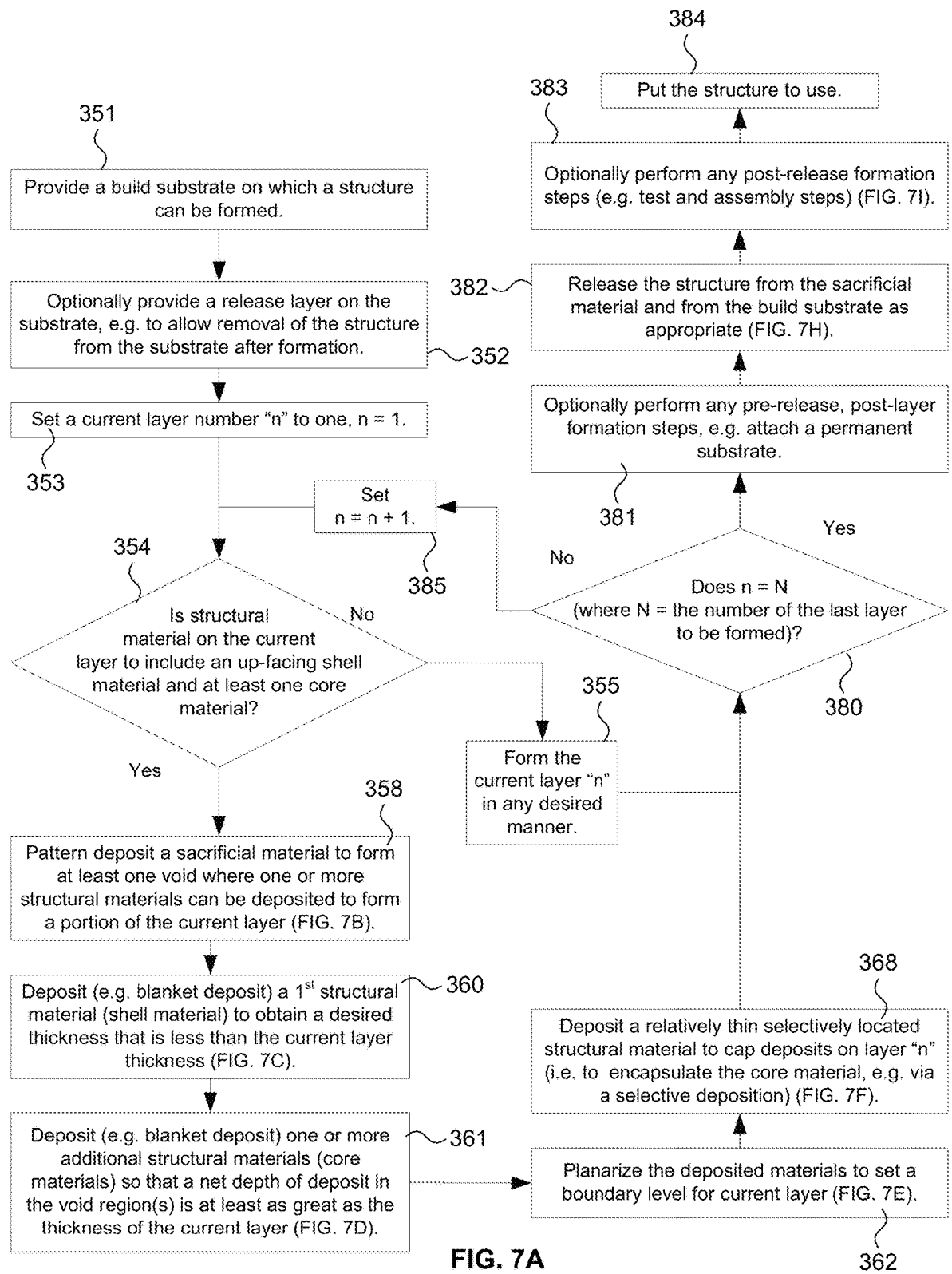
FIG. 7A provides a flowchart for a process according to a third embodiment of the invention where the structure is formed from at least a first structural material that provides a shell material that fully encapsulates at least a second structural material that is a core structural material and may also be a functional structural material and wherein some layers are formed with an up-facing shell structural material and a core structural material located within a pocket formed by the shell material, wherein an immediately succeeding layer includes an initial deposition of a structural material that caps the core material and has a relatively thin height compared to the layer thickness, wherein continued formation of the immediately succeeding layer occurs according to the intended configuration of that layer itself, and wherein the sidewalls of the shell may be narrower than a minimum feature size associated with the formation of the layer containing the walls.

FIG. 7A provides a flowchart for a process according to the third embodiment of the invention where the structure is formed from at least a first structural material that provides a shell material that fully encapsulates at least a second structural material that is a core structural material and may also be a functional structural material and wherein some layers are formed with an up-facing shell structural material and a core structural material located within a pocket formed by the shell material, wherein an immediately succeeding layer includes an initial deposition of a structural material that caps the core material and has a relatively thin height compared to the layer thickness, wherein continued formation of the immediately succeeding layer occurs according to the intended configuration of that layer itself, and wherein the sidewalls of the shell may be narrower than a minimum feature size associated with the formation of the layer containing the walls.

The process of FIG. 7A has number steps that are substantially identical to steps in the process of FIGS. 5A, 6A and 6B. In particular, steps 351-355 and 380-385 of FIG. 7A are substantially identical to steps 251-255 and 280-285 of FIGS. 6A & 6B, respectively, and are also substantially identical to steps 151-155 and 180-185 of FIG. 5A, respectively, and will be minimally discussed further herein as the comments provided with regard to the FIG. 5A steps are believed equally applicable to the corresponding reference numbers in FIG. 7A.

Steps 358-362 are very similar to steps 258-A-262-A of FIG. 6A and 258-B-262-B of FIG. 6B as discussed above and result in the formation of a layer that includes an up-facing shell of structural material that bounds the base and sides of a core material. As compared to the process of FIG. 6B steps 264-B to 267-B are replaced, in FIG. 7A, with a single step 368 that calls for the deposition of a relatively thin selectively located cap of structural material to complete the encapsulation of the core material deposited in association with the immediately preceding layer. This cap of structural material is intended to occupy a thin portion of the next layer to be formed. In some variations of this embodiment, the structural material of Step 368 may or may not be planarized, and the planarization may include planarization of any remaining masking material which may thereafter be completely removed. After this step the process moves forward to enquiry step 380 which determines whether just completed layer "n" and the overlaying cap was the last layer of the structure or whether the process should loop back to 354 for the formation of additional layers.

FIGS. 7B-7I schematically depict side views of various formation states that occur during the formation of a sample structure according to the third embodiment of the invention. In this embodiment, a shell or secondary structural material fully encapsulates each layer of a core or primary structural material. As with the other embodiments discussed herein, only the major steps or operations involved are explicitly set forth. It is understood that those of skill in the art may elect to perform additional standard or common steps such as cleaning operations, activation operations, surface roughening operations, inspection operations, and the like. Though, as with the other embodiments, the description to follow deposits the sacrificial material first during the formation of a layer containing shell and core material, it is understood that alternative embodiments are possible that would deposit the structural material first.

Figure 7B:
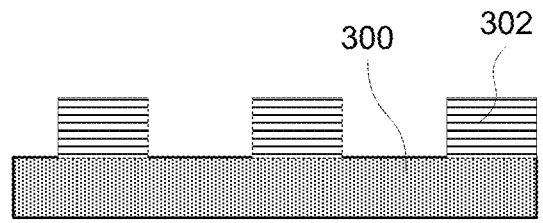
FIGS. 7B-7I schematically depict side views of various states of the process of FIG. 7A as applied to the formation of a particular example structure according to the third embodiment of the invention.

FIG. 7B depicts the state of the process after a patterned deposition of a sacrificial material 302 occurs on a substrate 300. This may be performed using standard lithography steps through which a photoresist pattern is created. In this embodiment, the deposition of sacrificial material preferably occurs by electrodeposition. The sacrificial material may, for example, be copper or nickel in thicknesses ranging from 0.5 μm to 30 μm. However, in alternative embodiments other metals and different deposition thicknesses may be used.

Figure 7C:
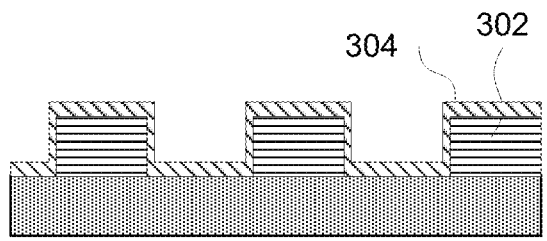

FIG. 7C depicts the state of the process after a thin blanket deposition of encapsulating material 304 (e.g. a secondary structural material) occurs. This step deposits a relatively thin, conforming layer of material (e.g. gold, nickel, nickel cobalt, palladium). In this implementation of the method, the deposit or coating may be applied by sputtering, for example at a thickness of about 500 Å. In other embodiments other materials may be used and other thicknesses may be used (e.g. from 50 Å to 2 μm). In other embodiments, other deposition techniques may be used and much thicker depositions obtained. Other depositions methods include, for example, evaporation, electroless deposition, electrolytic deposition, or even electroplating. In some embodiment variations, it may be advantageous to deposit an adhesion layer before or after application of the encapsulating material. Such an adhesion layer may have a thickness ranging from, for example, 10 Å-100 Å and may be of Ti or Cr. In still other alternative embodiments, other materials may alternatively or additionally be deposited, for example to act as diffusion barriers. For example, before or after a gold encapsulant is deposited (depending, for example, on which side copper is to be located), 10 Å to 100 Å of nickel may be deposited to act as a barrier to prevent the diffusion of the copper into the gold.

Figure 7D:
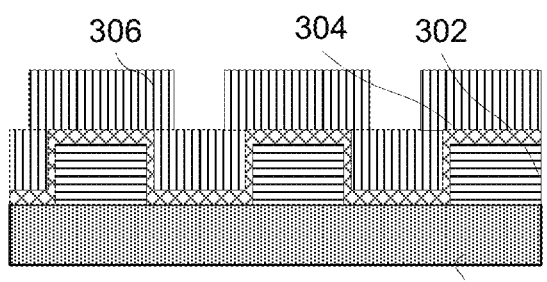

FIG. 7D depicts the state of the process after a blanket deposition of structural material 306 (e.g. copper, nickel, nickel cobalt, or palladium) occurs. The deposition may occur via an electrodeposition process or it may occur through other means (e.g., sputtering, evaporation, etc.). In some embodiments, a typical range of deposition thickness may be from 0.5 µm to 30 µm or more. As noted above, in some alternative embodiments, the structural and sacrificial materials may be the same (e.g., copper may act as a sacrificial material in general and as a functional structural material when encapsulated by nickel and/or gold).

Figure 7E:
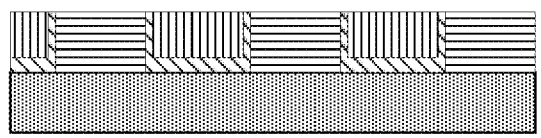

FIG. 7E depicts the state of the process after planarization occurs. This planarization step may take different forms, for example (1) lapping with a free abrasive, (2) lapping with a fixed abrasive, (3) grinding, or (4) fly cutting. This planarization may occur in one or more steps (e.g. in a progressive fashion using different abrasives or cutting methods) and may include intermediate height and parallelism measurements as, for example, taught in U.S. patent application Ser. No. 11/029,220, now U.S. Pat. No. 7,271,888.

Figure 7F:
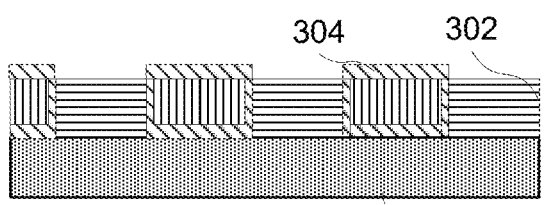

FIG. 7F depicts the state of the process after a thin patterned deposition of encapsulating material 304 occurs over the regions on the just planarized layer. A mask for performing the patterned deposition may be obtained photolithographically from development of a photoresist using a photomask that has substantially the inverse pattern to that used in operation leading to FIG. 7B. If on the other hand, the structural material is pattern deposited then the same pattern may be used for creating photoresist masks for both depositions. In still another variation, if a positive photoresist is used for one of the depositions and a negative resist used for the other, it may be possible to use the same photomasks to produce photoresist masks for both depositions even though one applies to the deposition of sacrificial material and the other applies to the deposition of structural material. The amount deposited should be kept as thin as possible (consistent with other objectives). In some alternative embodiments, excess thickness of the encapsulant, may be removed by fly cutting or another planarization process. If necessary, masking material could remain during the planarization process or additional sacrificial material could be deposited to help protect the sidewalls of the encapsulation material from damage during abrasive planarization and thereafter removal of the masking material could occur.

Figure 7G:
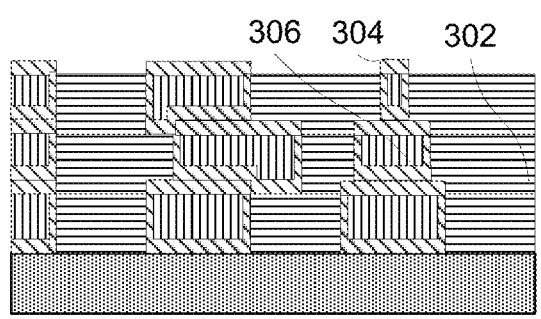

FIG. 7G depicts the state of the process after the operations of FIGS. 7B-7F are repeated two more times so as to produce the desired structure. In some embodiment variations, a structure may be formed in three layers as illustrated in this example, but in many situations additional layers may be required (e.g. a total of 5 to 10 to 20 or even 40 layers or more may be necessary to form a structure of desired height and configuration. In this embodiment, it is assumed that the thickness of the encapsulant that is located on top of each layer is thin enough to not interfere with operations used in forming the next layer. As such, in embodiments where photoresist will be used as a masking material, it is assumed that photoresist material can be applied over the transition from sacrificial material to encapsulating material and that patterning and development can occur without undue interference by the stepped surface. In the illustration of FIG. 7G, the coating formed to cap off core material on a previously formed layer, results in some visual distortion of the core material thicknesses for any succeeding layer.

Figure 7H:
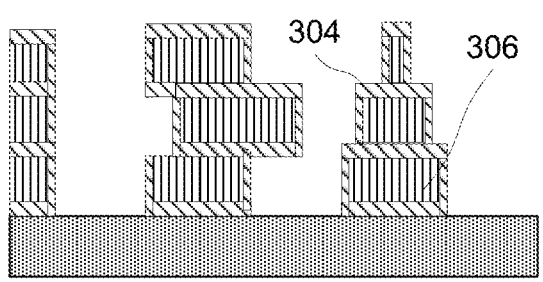

FIG. 7H depicts the state of the process after sacrificial material 302 is removed, e.g. by chemical etching. In this example, the structure(s) are shown as being formed in direct contact with a substrate while in some variations, the structures may actually be separated from the substrate by a layer of sacrificial material so that separation of the structure(s) from the substrate can readily occur. In still other variations, separation of the structures from the substrate may occur in other ways.

Figure 7I:
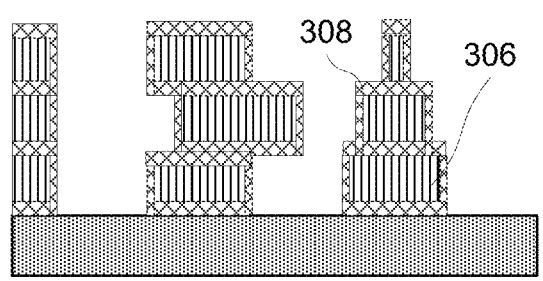

FIG. 7I depicts the state of the process after an optional process step causes inter-diffusion of the shell and core materials to form a modified coating 308. In some embodiment variations, it may be desirable to produce this inter-diffusion result while in other embodiments it may be something to be avoided (e.g. by using barrier layers and/or selection of substantially non-inter-diffusing material pairs, e.g. such as nickel and copper, or the like. If inter-diffusion is desired, those of skill in the art can empirically determine most appropriate treatment conditions and application times based on their objectives, the materials involved, and the like. In some embodiment variations, for example, desirable material properties may be obtained by heating to 600° C. for fifteen minutes in a reducing atmosphere.

As with the previously presented embodiments, numerous additional variations of this embodiment are possible. Some of these variations may involve the alternatives associated with previously presented embodiments while others may involve some of the features presented as part of those embodiments themselves. An examples of such variations includes replacing the thin secondary structural material with a thicker deposition of a shielding structural material that remains thin enough to provide a recess within a single layer for receiving a core structural material that may or may not be a functional structural material.

A fourth embodiment of the invention provides method for processing layers identical to that of the first embodiment but with certain geometric constraints placed on the structure to be formed. In particular each layer that includes an up-facing shell of genuine structural material that is filled with a core of functional structural material has its core material encapsulated by the formation of the next layer whether the next layer is formed as a core/up-facing shell layer or as a layer formed from a single genuine structural material. As such, in this embodiment, any layer "n" that contains a core material will be followed by the formation of an immediately succeeding layer "n+1" that has a lateral configuration (i.e. a configuration in the plane that is perpendicular to the build axis upon which layer stacking occurs) that sufficiently overlays the lateral configuration of the core and surrounding shell material of layer "n" so that its formation from structural material will provide sufficient capping of the layer "n". To provide adequate encapsulation a minimum overlap delta, δ, of shell-quality structural material must occur from layer-to-layer and as such, layer "n+1" must not have a configuration that provides layer "n" with an up-facing feature that would reduce the overlap to less than delta. Of course on layers "n" where only a single structural material is to exist or on layers "n" where complete encapsulation of structural material is not necessary, the configuration of layer "n+1" is not of significance.

Figure 8A:
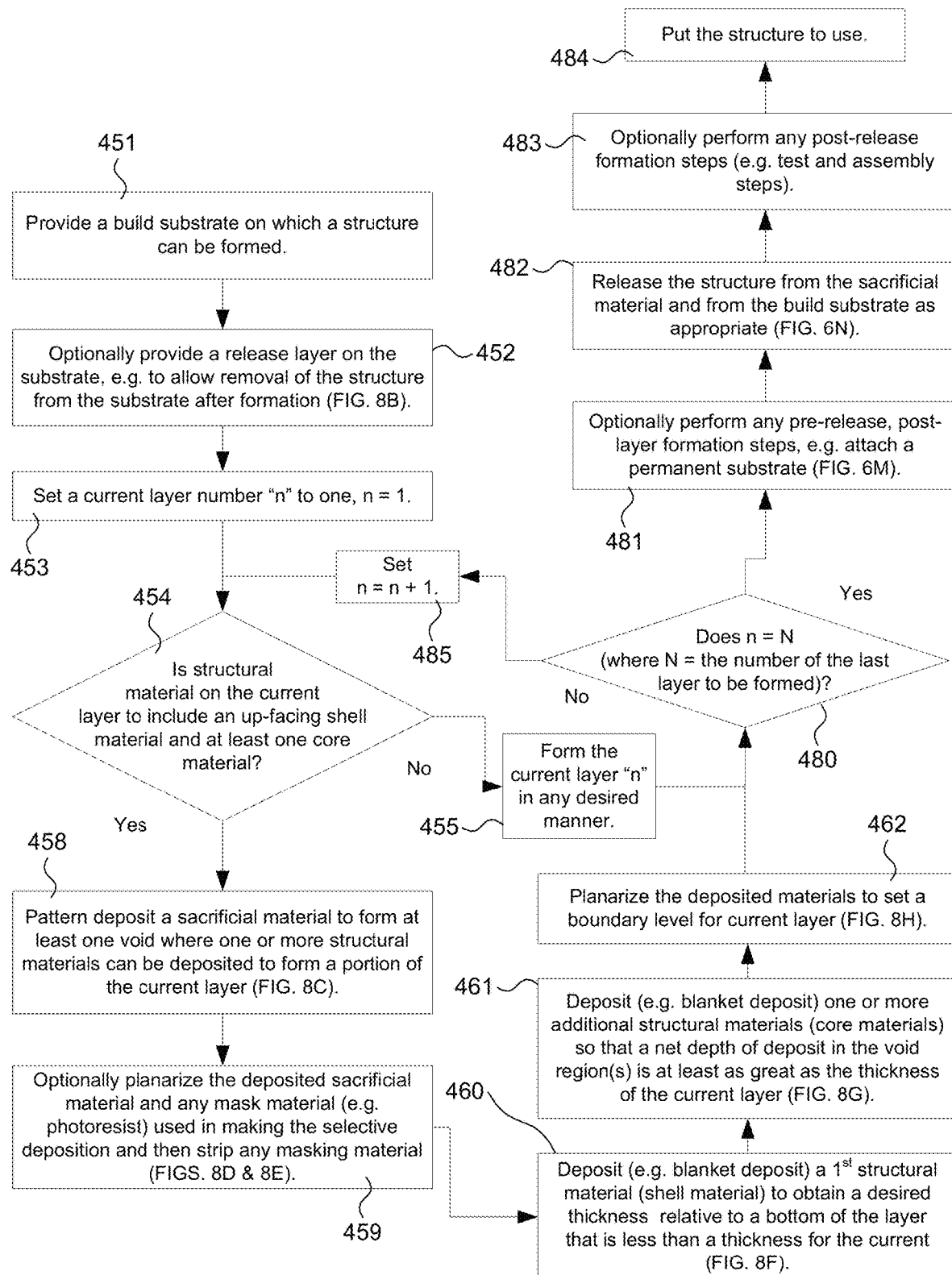
FIG. 8A provides a flowchart for forming a structure according to a fourth embodiment of the invention, which is a combination of the first-third process embodiments as applied to a simplified structural configuration where all or a portion of the layers are formed using a core material that may be a functional structural material that is encapsulated by a shell material and wherein the bottom and sides of the shell are formed for an nth layer as part of the nth layer while the top of the shell for the nth layer is formed by a capping material (e.g. the structural shell material) that is effectively provided by the formation of the $(n+1)^{th}$ layer, and wherein the sides of the shell may be narrower than a minimum feature size associated with the formation of the layer.

FIG. 8A provides a flowchart for forming a structure according to a fourth embodiment of the invention, which is substantially identical to that of FIG. 5A but with the simplified structure requirement noted above and with the core material being a functional structural material. The steps of the process of FIG. 8A are labeled with reference numbers similar to their corresponding steps in FIG. 5A with the exception they begin with 400 instead of 100. All or a portion of the layers are formed using a core material that may be a functional structural material that is encapsulated by a shell material wherein the bottom and sides of the shell are formed for an nth layer as part of the nth layer while the top of the shell for the nth layer is formed by a capping material (e.g. the structural shell material) that is effectively provided by the formation of the layer "n+1". As with the other embodiments, the sides of the shell may be narrower than a minimum feature size associated with the formation of the layer. This narrowing capability, as in the other embodiments, comes from the fact that the width of the side walls is not dictated on all sides by edges of a masking material or sacrificial material that forms a void that is to be completely filled but instead is based on only partially filling of a conductive void. Since the void has conductive walls, the buildup of deposited material not only grows upward from the bottom (to form a base) but also from the sides to form walls. When the base thickness is sufficient, but less than the layer thickness, and the wall width is sufficient, deposition ceases and deposition of a different material (i.e. a core material) can begin.

FIGS. 8B-8J illustrate various states of the process of FIG. 8A as applied to the formation of a particular example structure. In this example the structure is formed from five layers while laying on its side with the cross-sectional figuration of the second layer being larger than that of the first layer (at least along the cut as shown), that of the third layer matching that of the second layer, and with that of the fifth layer matching that of the fourth layer which in turn is smaller than that of the third. In this example, the first, second, and fourth layers can be formed with a genuine structural material forming the sides and bottom of a shell that in turn holds a functional structural core material. The core material on each of the first, second and forth layers becomes fully encapsulated by a structural material that forms the immediately succeeding layer.

Figure 8B:
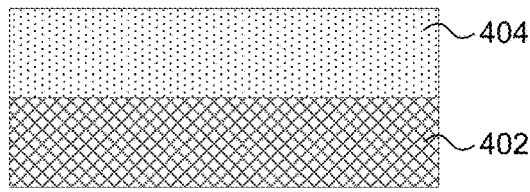
FIGS. 8B-8J illustrate various states of the process of FIG. 8A as applied to the formation of a particular example structure (e.g. a probe structure formed from five layers while laying on its side with the cross-sectional figuration of the second layer matching or being larger than that of the first layer, that of the third layer matching or being larger than that of the second layer, and with that of the fifth layer matching or being larger than the fourth layer such that the first, second, and fourth layers can be formed with a structural material forming the sides and bottom of a shell that supports a functional structural material core which in turn is capped and fully encapsulated by a structural material forming the immediately succeeding layer.

FIG. 8B shows the state of the process after a substrate 402 is covered with a release layer of sacrificial material 404.

Figure 8C:
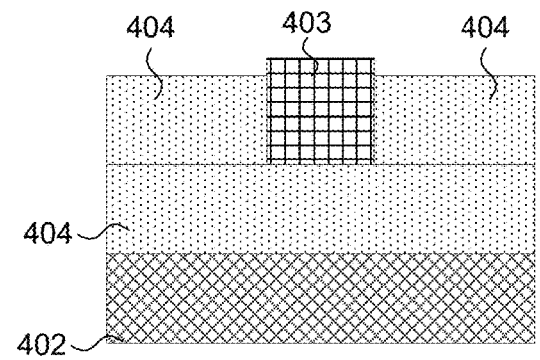
Figure 8D:
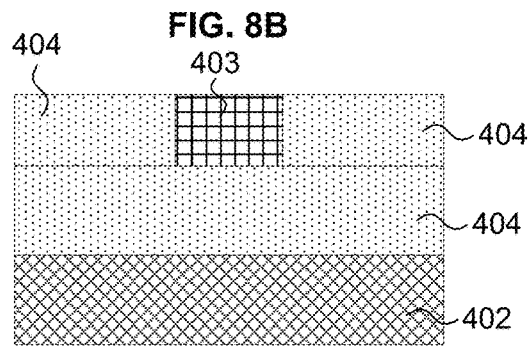

FIG. 8C shows the state of the process after a photoresist 403 is deposited and patterned to form a mask around which a layer of sacrificial material is deposited (masking material, additional structures being formed, or other deposition inhibiting material around the edges of the build are not shown) while FIG. 8D shows the state of the process after the sacrificial material and photoresist of the first layer are optionally planarized (typically to a height that is somewhat above the boundary level for the current layer).

Figure 8E:
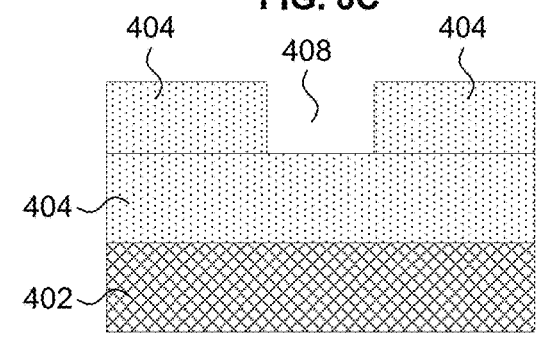

FIG. 8E shows the state of the process after the photoresist is stripped so as to leave a void 408 that can receive structural material.

Figure 8F:
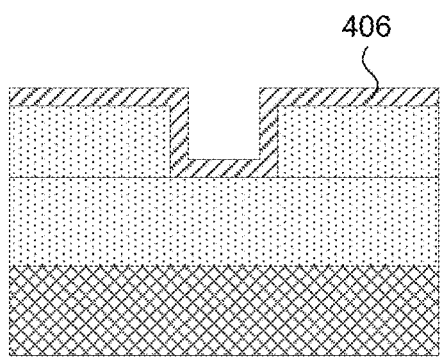

FIG. 8F shows the state of the process after a first, shell, and genuine structural material 406 is deposited to a depth of less than one layer thickness which causes formation of a base and sidewalls for a shell structure.

Figure 8G:
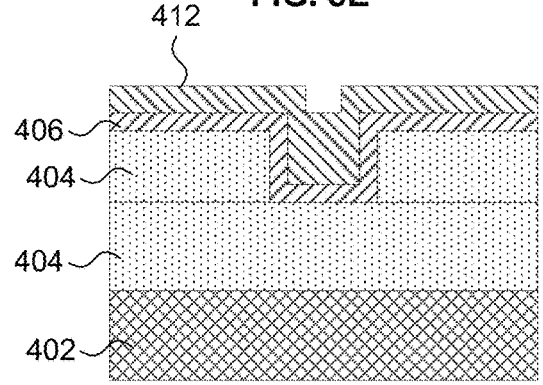

FIG. 8G shows the state of the process after deposition of a second, core, and possibly functional structural material 412.

Figure 8H:
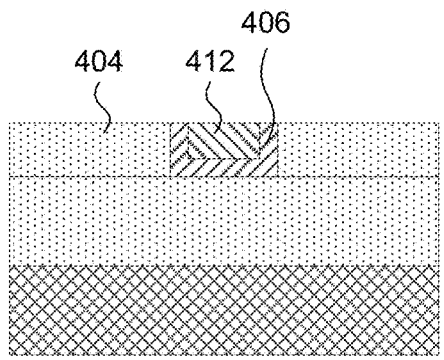

FIG. 8H shows the state of the process after the first layer is completed by the planarization of the sacrificial material and the two structural materials.

Figure 8I:
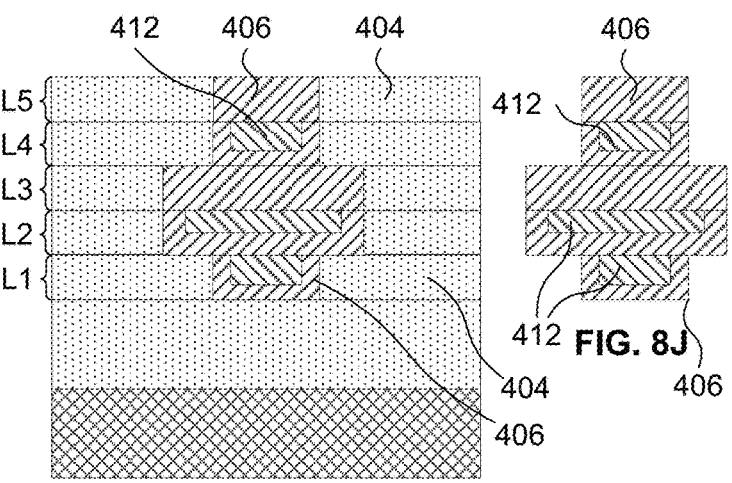

FIG. 8I shows the state of the process after formation of an additional four layers (L2-L5) some of which are formed using the steps illustrated in FIGS. 8C-8H while others use different steps (e.g. the steps illustrated in FIGS. 8C-8F and 8H with the deposition of FIG. 8F being continued to a height at least as great as the layer thickness.

Figure 8J:
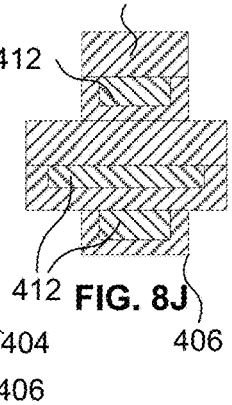

FIG. 8J illustrates the state of the process after the five layer structure, having two regular layers and three shell/core layers, has been released from the sacrificial material and from the substrate.

As with the other embodiments discussed above numerous variations of this process are possible and include, for example, variations that incorporate additional materials into shell/core layers, variations that add additional materials to non-shell/core layers, variations that modify the layer thickness between shell/core layers and non-shell/core layers, variations that have fewer layers (e.g. as few as two) and variations that have more layers as many as 10, 20, 40 or even more, variations that use a non-conductive core material (that may be coated with a seed layer to allow deposition of additional layers according to the methods set forth in some of the patents and applications incorporated herein by reference), variations that include a conductive core material and a non-conductive shell material on at least some layers, variations that leave the formed structure attached to the build substrate or transferred to a different substrate, variations that extend core material to more than one layer when allowed by the geometry of the structure being formed, variations that form some layers of some structures with more than one shell/core region, variations that reverse the order of structural material and sacrificial material deposition on at least some layers, variations that use a non-conductive sacrificial material, variations that mix the shell/core formation method of the other embodiments with those of this embodiment, and the like. Additional variations will be understood by those of skill in the art upon review of the teachings herein.

A fifth embodiment of the invention provides a method for processing layers to create encapsulated quantities of core material within a single layer where a partially encapsulating shell material provides a downward facing configuration. As with the first four embodiments, the steps of this process do not require the use of mask dimensions, or voids, that extend through masking material that would violate any minimum feature size constraints that exist for the build process. As with the previous embodiments, the core and shell defining steps of the present method need not be applied during the formation of each layer. In fact in some implementations the steps of this embodiment may be used on layers immediately following layers that used the shell/core formation steps of any of the first-fourth embodiments. Such combined usage can yield structures with core regions that are joined across layer boundaries. In some other variations of this embodiment, the shell/core forming steps of this embodiment may be applied to the cap forming steps of the second or third embodiments. In one such variation, the capping layers of the second embodiment would be formed prior to forming the corresponding shell/core layers of the present embodiment. In another such variation, the capping material of the third embodiment would be formed on the bottom of the layer before performing the shell/coring layer steps of the present embodiment so as to provide complete encapsulation within a single layer. In the above noted variations the capping material is located below the cores that they encapsulate.

Figure 9A:
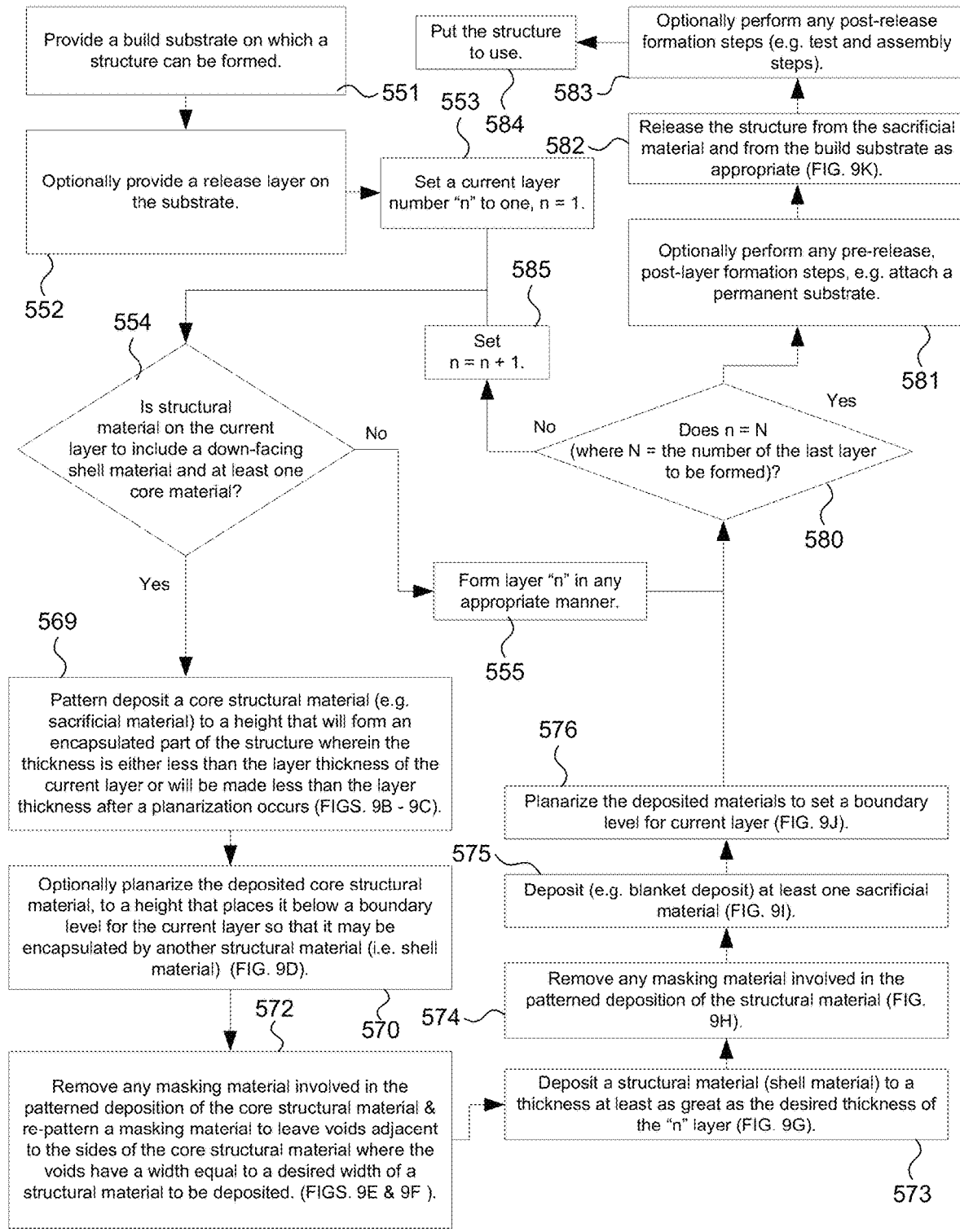
FIG. 9A provides a flowchart for forming a structure according to a fifth embodiment of the invention, which unlike the first-fourth embodiments, creates a down-facing shell that encapsulates the sides and top of a core material and may be used to create structures with enhanced properties depending on geometric configuration of the current layer with respect to a preceding layer, the type of shell and core material being used, the type of coring and shelling, if any, used on the preceding layer, and the like, and wherein the shell side walls may be narrower than a minimum feature size associated with the formation of a layer.

FIG. 9A provides a flowchart for forming a structure according to a fifth embodiment of the invention, which unlike the first-fourth embodiments, creates a down-facing shell that encapsulates the sides and top of a core material which may be used to create structures with enhanced properties. With regard to the process applied on a current layer, the core material is not encapsulated on its lower side, unless such encapsulation is supplied by structural material applied in other preceding steps or by the immediately preceding layer. As with the other embodiments, the shell side walls may be narrower than a minimum feature size associated with the formation of the given layer.

Like the other embodiments, some of the steps of the embodiment of FIG. 9A are similar to those of the previous embodiments and are labeled with similar numbers with the exception that the series number now starts with 500 instead of 100-400. In particular, steps 551-555 and 580-585 are similar to the corresponding steps in the earlier embodiments with the exception that the enquiry of step 554 is concerned about whether the current layer "n" is to be formed with a down-facing shell material instead of an up-facing shell material. In the present embodiment steps 569, 570 and 572-576 provide the unique down-facing shell/core material combination.

Step 569 follows step 554 when the answer to the enquiry of step 554 is "yes". Step 569 calls for the patterning of deposit of a functional structural material (e.g. sacrificial material) to a location that will form an encapsulated part of the structure wherein the thickness is either less than the layer thickness of the current layer or will be made less than the layer thickness after a planarization occurs. This step assumes that the width of the functional structural material that is deposited is not less than the minimum feature size of the current layer, or at least of a layer of the thickness required for the height of the structural material that needs to be deposited, since a mask of appropriate height and with voids of appropriate lateral dimensions must be created.

Step 570 follows step 569 and calls for the optional planarization of the deposited functional structural material, to a height that places it below a boundary level for the current layer so that it may be encapsulated by another structural material (i.e. shell material) to be deposited in a later step.

Step 572 follows step 570 and calls for removal of any masking material involved in the patterned deposition of the functional structural material and the re-patterning of a masking material to leave voids adjacent to the sides of the functional structural material where the voids between the functional structural material and the masking material have a width equal to a desired width of a structural material to be deposited.

Step 573 follows step 572 and calls for the deposition of a 1$^{st}$ structural material (shell material) to a thickness at least as great as the desired thickness of the "n" layer so as to form the encapsulating sidewalls and the encapsulating top cap.

Step 574 follows step 573 and calls for removing any masking material involved in the patterned deposition of the shell structural material deposited in Step 573.

Step 575 follows step 574 and calls for deposition (e.g. blanket deposit) of at least one sacrificial material.

Step 576 follows step 575 and calls for the planarization of the deposited materials to set a boundary level for current layer From step 576 the process moves to the enquiry of step 580 and either continues on to the post-layer formation steps 581-584 if the last layer was just completed or loops back to step 554 after the layer number incrementing step of 585.

FIGS. 9B-9K illustrate various states of the process of FIG. 9A as applied to the formation of a particular sample layer of a structure which has a lateral size similar to that of a previous layer on which it is formed with the exception that the previous layer (according to this illustration) was formed using an up-facing shell and core method (such as that used in one of the first-fourth embodiments) and such that a core material region is formed starting in and extending from an immediately preceding layer and extending into and ending in the current layer.

Figure 9B:
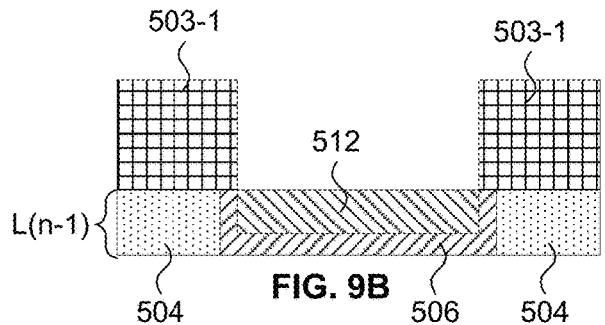
FIGS. 9B-9K illustrate various states of the process of FIG. 9A as applied to the formation of a particular sample layer of a structure which has a lateral size similar to that of a previous layer on which it is formed with the exception that the previous layer was formed using an up-facing shell and core method (such as that used in one of the first-fourth embodiments) and such that a core is formed starting in and extending from an immediately preceding layer and extending into and ending in the current layer.

FIG. 9B shows the state of the process after a previously formed layer L(n−1) containing a shell region of a structural material 506, a core region of a structural material 512, and region of sacrificial material 504 is provided with a photoresist 503-1 that is patterned to form a mask with voids into which a current layer "n" of core structural material, e.g. functional structural material, may be deposited.

Figure 9C:
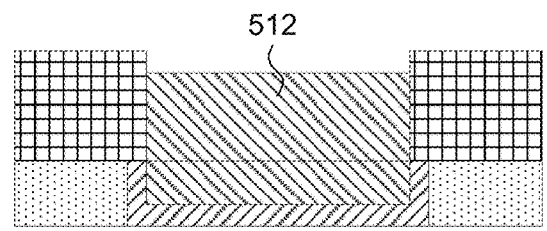

FIG. 9C shows the state of the process after the core structural material 512 is deposited to a height greater than a desired height for the core material in anticipation of a subsequent planarization process that will bring the effective height down to a desired height. In some variations of this embodiment, the height of deposit of the core material may be set to the desired height which may eliminate the need for the subsequent planarization process.

Figure 9D:

FIG. 9D depicts the state of the process after the structural material 512 and photoresist 503-1 of the current layer "n" is planarized to a desired height which is less than the height or thickness of layer "n".

Figure 9E:

FIG. 9E shows the state of the process after the photoresist 503-1 is stripped.

Figure 9F:
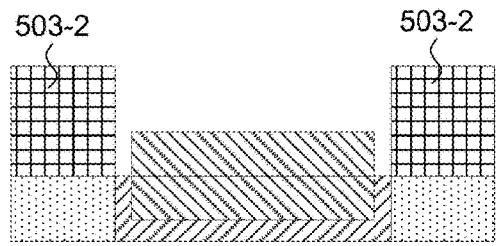

FIG. 9F shows the state of the process after additional photoresist 503-2 is applied and patterned to form a void containing the core material and a surrounding void where a genuine structural material 506 may be deposited to form the walls of the shell.

Figure 9G:
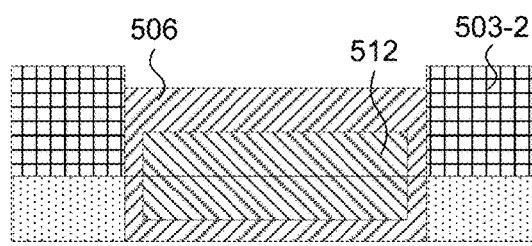

FIG. 9G shows the state of the process after deposition of the genuine structural material 506 to a height that forms walls around the core structural material 512 and forms a cap over the core material. The height of deposition of the shell material is at least as great as the thickness of the layer "n" that is being formed.

Figure 9H:
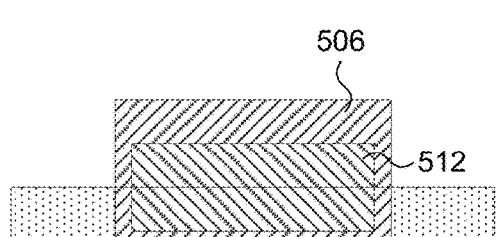

FIG. 9H shows the state of the process after the photoresist 503-2 is stripped in preparation for depositing a sacrificial material. In some variations of this embodiment, the deposited structural material 506 may be planarized before removal of the photoresist but this is generally not considered necessary as it will undergo subsequent planarization anyway.

Figure 9I:
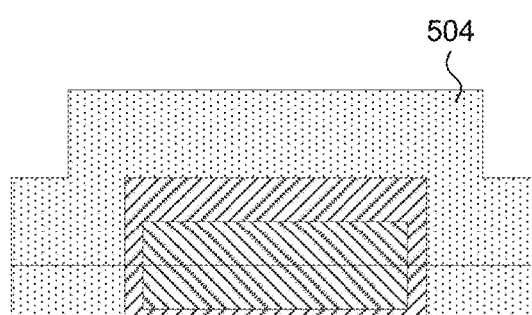

FIG. 9I shows the state of the process after deposition of a sacrificial material 504 raises the net height of material for all regions of the current layer "n" to at least the desired thickness, boundary height, or level of the current layer "n".

Figure 9J:
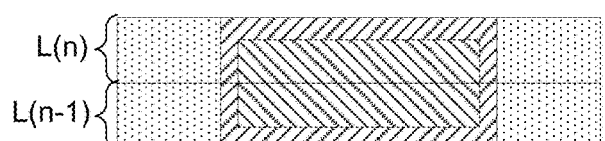

FIG. 9J shows the state of the process after the sacrificial material 504 and the structural material 506 have been planarized to a height that sets the thickness of layer "n" (i.e. is within a desired tolerance of the intended layer thickness or upper boundary level of the current layer "n").

Figure 9K:
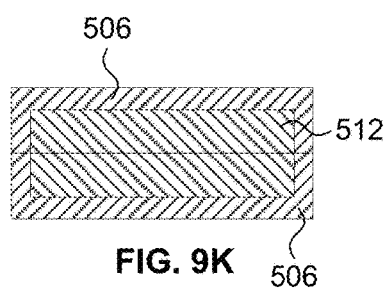

FIG. 9K shows the state of the process after removal of the sacrificial material from the two layers "n−1" and "n" forming the structure and release from any build substrate (not shown in this series of FIGS.). In this illustration it can be seen that core material on the "n−1" layer and core material on the "n" layer are joined together and that this combined core region is encapsulated by the shell material deposited in association with the "n−1" layer and in association with the formation of the "n" layer. In other variations of this embodiment additional layers could have been added if required to complete formation of the structure and additional layers could have been formed before the "n−1"

layer. In still other variations, the overall configuration and shell/core figuration, if any, of layer "n−1" could have been different than that indicated.

As with the other embodiments discussed above, numerous variations of this process are possible and include, for example, variations that incorporate additional materials into shell/core layers, variations that add additional materials to non-shell/core layers, variations that modify the layer thickness between shell/core layers and non-shell/core layers, variations that have more layers as many as 10, 20, 40 or even more, variations that use a non-conductive core material (that may be coated with a seed layer to allow deposition of additional layers according to the methods set forth in some of the patents and applications incorporated herein by reference), variations that include a conductive core material and a non-conductive shell material on at least some layers, variations leave the formed structure attached to the build substrate or to a different substrate that is attached after layer formation, variations that extend core material to more than one layer when allowed by the geometry of the structure being formed, variations that form some layers of some structures with more than one shell/core region, variations that reverse the order of structural material and sacrificial material deposition on at least some layers, variations that use a non-conductive sacrificial material, variations that mix the shell/core formation method of the other embodiments with those of this embodiment, and the like. Additional variations will be understood by those of skill in the art upon review of the teachings herein.

A sixth embodiment provides a method for providing core material that extends completely through a given layer, i.e. continuing core regions, while still providing for the formation of shell material wall thicknesses that are less than the minimum feature size without using mask features or voids that are smaller than that allowed by the minimum feature size. In some implementations of this embodiment, the layers containing continuing core regions may be preceded by other continuing core region layers or by up-facing core configurations, as produced by the first-fourth embodiments, and be proceeded by other continuing core region layers or by down-facing core configurations as produced by the fifth embodiment. In still other embodiments, layers containing continuing core regions may be bounded from below and/or above by non-shell/core layers, bounded from below and/or above by capping structures such as those of the third embodiment, capping layers such as those of the second embodiment, or bounded from below and/or above by other configurations that continue or terminate the extension of core material. In still other embodiment variations multiple continuing extension regions may be formed on a given layer for a given structure.

Figure 10A:
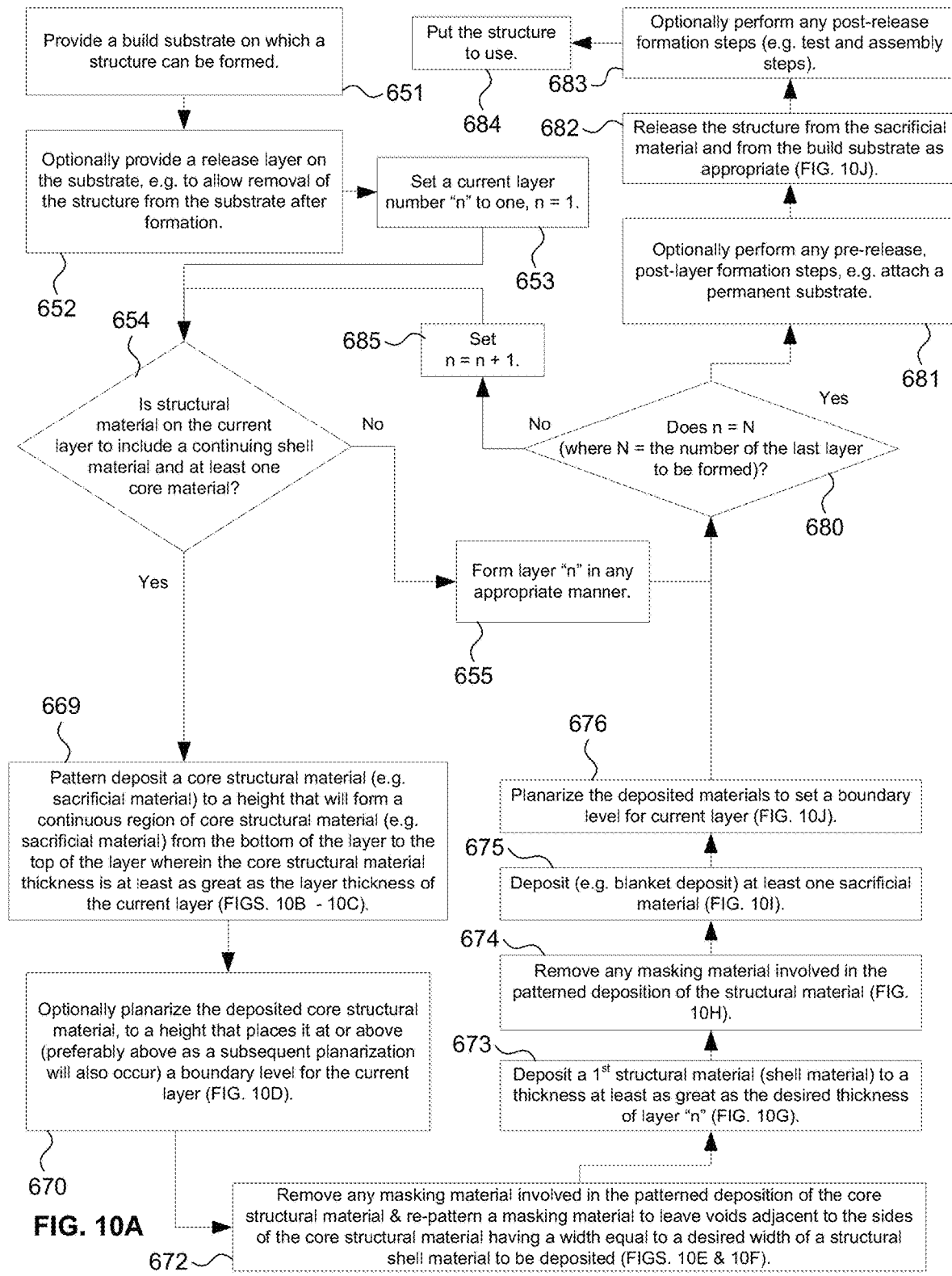
FIG. 10A provides a flowchart for forming a structure according to a sixth embodiment of the invention wherein a structure is formed with at least one layer that includes a shell and core where the core extends from the bottom of the nth layer to the top of the nth layer with shell walls surrounding the sides of the core and wherein the shell walls may be narrower than a minimum feature size associated with the formation of the layer.

FIG. 10A provides a flowchart for forming a structure according to the sixth embodiment of the invention wherein a structure is formed with at least one layer that includes a shell and core where the core extends from the bottom of the layer to the top of the layer with shell walls surrounding the sides of the core and wherein the shell walls may be narrower than a minimum feature size associated with the formation of the layer.

Like the other embodiments some of the steps of the embodiment of FIG. 10A are similar to those of the previous embodiments and are labeled with similar numbers with the exception that the series number starts with 600 instead of 100-500. In particular, steps 651-655 and 680-685 are similar to the corresponding steps in the earlier embodiments with the exception that the enquiry of step 654 is concerned about whether the current layer "n" is to be formed with a continuing shell instead of a down-facing or up-facing shell material. However as compared to the embodiment of FIG. 9A all process steps are similar with exception of steps 669 and 670. Step 669 deposits the core structural material to a height at least as great as the intended thickness of layer "n" while step 670 optionally planarizes the deposited core material to a height at, and preferably somewhat above, the boundary level for the current layer "n FIGS. 10B-10J illustrate various states of the process of FIG. 10A as applied to the formation of a particular sample layer of a structure which has a configuration similar to that of a previous layer on which it is formed with the exception that the previous layer was formed using an up-facing shell and core method (such as that used in one of the first-fourth embodiments) and such that the core for the current layer "n" is formed starting in and extending from an immediately preceding layer and extending into and through the current layer.

FIG. 10B shows the state of the process after a previously formed layer L(n−1) containing a shell region of a structural material 606, a core region of a structural material 612, and region of sacrificial material 604 is provided with a photoresist 603-1 that is patterned to form a mask with voids into which a current layer "n" of core structural material, e.g. functional structural material, may be deposited.

FIG. 10C shows the state of the process after the core structural material 612 is deposited to a height greater or equal to a desired height for the current layer "n" in anticipation of one or more subsequent planarizations that will bring the effective height down to a level equal to the boundary level for the current layer (i.e. within a desired tolerance of the upper boundary level for the current layer). In some variations of this embodiment, the height of deposit of the core material may be set to the desired height which may eliminate the need for a subsequent planarization process.

FIG. 10D depicts the state of the process after the structural material 612 and the photoresist 603-1 of the current layer "n" are optionally planarized to a desired height which is at, or more preferably somewhat above, the upper boundary level of the current layer so as to ensure that in the presence of any tolerance errors, the core material will still extend to the final upper boundary level.

FIG. 10E shows the state of the process after the photoresist 603-1 is stripped.

FIG. 10F shows the state of the process after additional photoresist 603-2 is applied and patterned to form a void containing the core material and a surrounding void where a genuine structural material 606 may be deposited to form the walls of the shell for the current layer "n".

FIG. 10G shows the state of the process after deposition of the genuine structural material 606 to a height that forms walls around the core structural material 612 and forms a temporary cap over the core material 612.

FIG. 10H shows the state of the process after the photoresist 603-2 is stripped in preparation for depositing a sacrificial material. In some variations of this embodiment, the deposited structural material 606 may be planarized before removal of the photoresist but this is generally not considered necessary as it will undergo subsequent planarization anyway.

FIG. 10I shows the state of the process after deposition of a sacrificial material 604 raises the net height of material for all regions of the current layer "n" to at least the desired boundary height or level of the current layer "n".

FIG. 10J shows the state of the process after the sacrificial material 604 the shell structural material 606 and the core structural material 612 have been planarized to a height corresponds to the boundary level of the current layer (i.e. in practice this will probably actually be a level that is within a desired tolerance of the boundary level of the current layer "n"). This step completes the formation of the current layer "n" and the structure can either proceed to post layer formation operations if the just formed layer "n" was the last layer of the structure or can have additional layers added on it if it was not the last layer. As can be seen in this figure, the core material 612 extends from the bottom of layer "n" to the top of layer "n" and is surrounded on the sides by shell material 606. It is clear that the core region associated with this layer may begin or end with this layer or may continue from one or more previous layers (as illustrated it started in the middle of the previous layer) and/or continue into one or more subsequent layers depending on the configuration of those previous and subsequent layers and depending on the types of shell/core or non-shell/core processes used in forming those previous and subsequent layers.

As with the other embodiments discussed above numerous variations of this process are possible and include, for example, variations that incorporate additional materials into shell/core layers, variations that add additional materials to non-shell/core layers, variations that modify the layer thickness between shell/core layers and non-shell/core layers, variations that have more layers as many as 10, 20, 40 or even more, variations that use a non-conductive core material (that may be coated with a seed layer to allow deposition of additional layers according to the methods set forth in some of the patents and applications incorporated herein by reference, variations that include a conductive core material and a non-conductive shell material on at least some layers, variations that leave the formed structure attached to the build substrate or to a different substrate that is attached, variations that extend core material to more than one layer when allowed by the geometry of the structure being formed, variations that form some layers of some structures with more than one shell/core region, variations that reverse the order of structural material and sacrificial material deposition on at least some layers, variations that use a non-conductive sacrificial material, variations that mix the shell/core formation method of another embodiment with those of this embodiment, and the like. Additional variations will be understood by those of skill in the art upon review of the teachings herein.

In some variations of the first-sixth embodiments the wall thickness or width may be determined as a percentage of layer thickness, e.g. 10%, 20%, 50%, 75%, or some other value. Assuming that wall width growth is related to base thickness build up during deposition, the base thickness build up may be used to control the wall thickness with the base thickness for example being set to a faction of the layer thickness such as $1/10$, $1/5$, $1/2$, $3/4$, or any other fraction amount less than one. In some embodiments, base thickness and associated wall thickness may be set to a desired value instead of to a fraction of a layer thickness, such as a base thickness of 1, 2, 5, 10, 15 microns or some other appropriate amount that is less than a thickness of the layer being formed. Similar percentages, fractions and thickness are also applicable to caps and capping layers that might be formed in association with some layers.

Additional embodiments of the invention are possible. Some such embodiments may result from the combination of various features of the first-sixth embodiments. For example, the teachings of the fourth-sixth embodiments may be combined to yield encapsulated core material extending unbroken through any desired number of layers wherein an initial layer is formed using the up-facing shelling method of the fourth embodiment, one or more intermediate layers are formed using the continuing encapsulation method of the sixth embodiment, and a final layer provides for encapsulation using a down-facing shelling method as set forth in the fifth embodiment.

Other such alternative embodiments may result from combining the teachings of any one of the first-sixth embodiments with teachings from the various patents and applications incorporated herein by reference. For example during the formation of one or more layers of a structure using one or more of the methods of the first-sixth embodiments one or more of the stress reductions methods set forth in U.S. patent application Ser. No. 11/733,195, filed Apr. 9, 2007, now abandoned, and entitled "Methods of Forming Three-Dimensional Structures Having Reduced Stress and/or Curvature" may be incorporated into the process. As another example, where probes or other structures (e.g. probes for performing wafer level testing or burn-in of semiconductor devices) are being formed it may be desirable to have a contact tip element, or other feature, formed from a different material (e.g. rhodium) than used for a body of the probe or structure. In such cases the tip formation methods as set forth in FIGS. 20A-20C and 21A-21E of the '195 patent application may be combined with the methods of any of the first to sixth embodiments set forth herein with or without incorporating the stress reductions methods set forth therein.

In still other embodiment variations, other alternative methods, may be used to provide for complete encapsulation with general layer-to-layer interfaces existing in the structure. In still other embodiments, such generalized encapsulation may be possible without necessarily encapsulating every layer individually but instead allowing core material to extend between successive layers when desired and when allowed by geometric constraints that are associated with layer-to-layer overlap requirements of a shelling material. Such alternative embodiments, may use Boolean layer comparison operations (e.g. unions, intersections, and subtractions) to identify up-facing, continuing, and down-facing regions of individual layers and possibly the use of erosion routines and the like, potentially, in combination with Boolean comparisons to determine region widths and to derive lateral extensions of such down-facing, continuing, or up-facing regions and more so to determine what regions require special depositions of genuine structural material to form cap or cap portions and/or to avoid formation of such caps where continuation of core material is possible. For example, in a situation where it is known that a wall width, or thickness, of shell material of 15 microns exists and that a minimum wall width, or thickness, of shell material of at least 5 microns is required, and it is found that a higher or lower layer has region boundaries that are no more than 10 microns offset relative to the region boundaries of the current layer, the up-facing, down-facing, or continuing shell/core material embodiments of the fourth to sixth embodiments may be used without variation. However, if an offset of greater than 10 microns exists and the offset includes a region of core material, an additional or modified deposition of shelling material may be required to ensure full encapsulation. In fact, if the offset is greater than both 10 microns and a minimum feature size, an additional relatively thin deposition may be made using a mask corresponding to the offset region in combination with the appropriate steps of the fourth to sixth embodiment. On the other hand, if the offset is between 10 microns and the minimum feature size it may be necessary to either form a capping layer corresponding to the configuration of the entire layer having the offset (assuming it is the layer with the offset that would otherwise contain exposed core material) or to create and use a mask having a revised deposition region that can be defined by a mask that doesn't have features less than the minimum feature size.

In the most preferred implementations of the present invention, though not necessarily all implementations, structures will not be formed one at a time but instead in batch processes that may build up tens, hundreds, or even thousands of identical or differing structures simultaneously as each successive layer is formed on and adhered to previously formed layers where the only requirements are that (1) the layer levels be sufficiently compatible for each structure to allow simultaneous build up and (2) associated coring/shelling operations are compatible. In some embodiments, layers or groups of layers may be formed separate from other layers, or groups of layers, and then the separate layers or groups aligned and bonded to one another to form complete structures.

Further Comments and Conclusions

Various other embodiments of the present invention exist. Some of these embodiments may be based on a combination of the teachings herein with various teachings incorporated herein by reference. For example some embodiments may not use any blanket deposition process. Some embodiments may use selective deposition processes or blanket deposition processes on some layers that are not electrodeposition processes. Some embodiments may use nickel as a structural material while other embodiments may use different materials. For example, preferred spring materials include nickel (Ni), copper (Cu), beryllium copper (BeCu), nickel phosphorous (Ni—P), tungsten (W), aluminum copper (Al—Cu), steel, P7 alloy, palladium, molybdenum, manganese, brass, chrome, chromium copper (Cr—Cu), and combinations of these. Some embodiments may use copper as the structural material with or without a sacrificial material.

Some embodiments may apply the fabrication processes disclosed herein to the production of microprobes while other embodiments may apply these methods in the fabrication of other devices for other applications.

Some embodiments may employ diffusion bonding or the like to enhance adhesion between successive layers of material. Various teachings concerning the use of diffusion bonding in electrochemical fabrication processes are set forth in U.S. patent application Ser. No. 10/841,384, which was filed May 7, 2004, by Cohen et al. now abandoned, which is entitled "Method of Electrochemically Fabricating Multilayer Structures Having Improved Interlayer Adhesion" and which is hereby incorporated herein by reference as if set forth in full. This application is hereby incorporated herein by reference as if set forth in full.

Further teaching about microprobes and electrochemical fabrication techniques are set forth in a number of prior US Patent Applications. These Filings include: (1) U.S. patent application Ser. No. 10/949,738 (P-US119-A-MF), filed Sep. 24, 2004, by Kruglick et al., now abandoned, and which is entitled "Electrochemically Fabricated Microprobes"; (2) U.S. patent application Ser. No. 11/028,945 (P-US134-A-MF), filed Jan. 3, 2005, by Cohen et al., now U.S. Pat. No. 7,640,651, and which is entitled "A Fabrication Method for Co-Fabricating a Probe Array and a Space Transformers". (3) U.S. patent application Ser. No. 11/029,180, filed Jan. 3, 2005, by Chen et al., now abandoned, and entitled "Pin-Type Probes for Contacting Electronic Circuits and Methods for Making Such Probes"; (4) U.S. patent application Ser. No. 11/325,404 (P-US153-A-MF), filed Jan. 3, 2005, by Chen et al., now abandoned, and entitled "Vertical Microprobes for Contacting Electronic Components and Method for Making Such Probes"; (5) U.S. patent application Ser. No. 11/029,217 (P-US122-A-MF), filed Jan. 3, 2005, by Kim et al., now U.S. Pat. No. 7,412,767, and entitled "Microprobe Tips and Methods For Making; and (6) U.S. patent application Ser. No. 11/173,241 (P-US137-A-MF), filed Jun. 30, 2005, by Kumar et al., now abandoned, and entitled "Probe Arrays and Methods for Making". These patent filings are each hereby incorporated herein by reference as if set forth in full herein.

Additional teachings concerning the formation of structures on dielectric substrates and/or the formation of structures that incorporate dielectric materials into the formation process and possibility into the final structures as formed are set forth in a number of patent applications: (1) U.S. patent application Ser. No. 11/028,957 (P-US127-A-SC), by Cohen, which was filed on Jan. 3, 2005, now abandoned, and which is entitled "Incorporating Dielectric Materials and/or Using Dielectric Substrates"; (2) U.S. patent application Ser. No. 10/841,300 (P-US099-A-MF), by Lockard et al., which was filed on May 7, 2004, now abandoned, and which is entitled "Methods for Electrochemically Fabricating Structures Using Adhered Masks, Incorporating Dielectric Sheets, and/or Seed Layers that are Partially Removed Via Planarization"; (3) U.S. patent application Ser. No. 10/841,378 (P-US106-A-MF), by Lembrikov et al., which was filed on May 7, 2004, now U.S. Pat. No. 7,527,721, and which is entitled "Electrochemical Fabrication Method for Producing Multi-layer Three-Dimensional Structures on a Porous Dielectric"; (4) U.S. patent application Ser. No. 11/029,216 (P-US128-A-MF), filed Jan. 3, 2005 by Cohen et al., now abandoned, and entitled "Electrochemical Fabrication Methods Incorporating Dielectric Materials and/or Using Dielectric Substrates"; and (5) U.S. patent application Ser. No. 11/325,405 (P-US152-A-MF), filed Jan. 3, 2006 by Dennis R. Smalley, now abandoned, and entitled "Method of Forming Electrically Isolated Structures Using Thin Dielectric Coatings". These patent filings are each hereby incorporated herein by reference as if set forth in full herein.

The patent applications and patents set forth below are hereby incorporated by reference herein as if set forth in full. The teachings in these incorporated applications can be combined with the teachings of the instant application in many ways: For example, enhanced methods of producing structures may be derived from some combinations of teachings and enhanced structures may be obtainable.

| U.S. patent application No., Filing Date U.S. application Pub. No., Pub Date U.S. Pat. No., Pub Date | First Named Inventor, Title |
|---|---|
| 09/493,496 - Jan. 28, 2000 — U.S. Pat. No. 6,790,377 - Sep. 14, 2004 | Cohen, "Method For Electrochemical Fabrication" |
| 10/434,295 - May 7, 2003 2004-0004001A - Jan. 8, 2004 Lapsed | Cohen, "Method of and Apparatus for Forming Three-Dimensional Structures Integral With Semiconductor Based Circuitry" |
| 10/434,519 - May 7, 2003 2004-0007470A - Jan. 15, 2004 U.S. Pat. No. 7,252,861 - Aug. 7, 2007 | Smalley, "Methods of and Apparatus for Electrochemically Fabricating Structures Via Interlaced Layers or Via Selective Etching and Filling of Voids" |

-continued

| U.S. patent application No., Filing Date U.S. application Pub. No., Pub Date U.S. Pat. No., Pub Date | First Named Inventor, Title |
|---|---|
| 10/607,931 - Jun. 27, 2003 2004-0140862 - Jul. 22, 2004 U.S. Pat. No. 7,239,219 - Jul. 3, 2007 | Brown, "Miniature RF and Microwave Components and Methods for Fabricating Such Components" |
| 10/841,006 - May 7, 2004 2005-0067292 - May 31, 2005 Lapsed | Thompson, "Electrochemically Fabricated Structures Having Dielectric or Active Bases and Methods of and Apparatus for Producing Such Structures" |
| 10/841,347 - May 7, 2004 2005-0072681 - Apr. 7, 2005 Lapsed | Cohen, "Multi-step Release Method for Electrochemically Fabricated Structures" |
| 10/949,744 - Sep. 24, 2004 2005-0126916 - Jun. 16, 2005 U.S. Pat. No. 7,498,714 - Mar. 3, 2009 | Lockard, "Three-Dimensional Structures Having Feature Sizes Smaller Than a Minimum Feature Size and Methods for Fabricating" |
| 11/733,195 - Apr. 9, 2007 2008-0050524 - Feb. 28, 2008 Lapsed | Kumar, "Methods of Forming Three-Dimensional Structures Having Reduced Stress and/or Curvature" |

Though various portions of this specification have been provided with headers, it is not intended that the headers be used to limit the application of teachings found in one portion of the specification from applying to other portions of the specification. For example, it should be understood that alternatives acknowledged in association with one embodiment, are intended to apply to all embodiments to the extent that the features of the different embodiments make such application functional and do not otherwise contradict or remove all benefits of the adopted embodiment. Various other embodiments of the present invention exist. Some of these embodiments may be based on a combination of the teachings set forth herein with various teachings incorporated herein by reference.

In view of the teachings herein, many further embodiments, alternatives in design and uses of the embodiments of the instant invention will be apparent to those of skill in the art. As such, it is not intended that the invention be limited to the particular illustrative embodiments, alternatives, and uses described above but instead that it be solely limited by the claims presented hereafter.

We claim:

1. A spring probe for use as an electronic contact element, comprising:
   a) a first tip; and
   b) a body portion connected to the first tip wherein at least a portion of the body portion provides spring compliance when the first tip contacts an electronic component;
   wherein the first tip and the body portion, as a whole, comprise at least two planar layers with a first planar layer joined to a second planar layer, wherein the first planar layer has a first and a second planar boundary separated by a thickness of the first planar layer, wherein the second planar layer has a first and second planar boundary separated by a thickness of the second layer, and wherein each of the first and second boundaries are substantially planar and parallel to one another,
   wherein a boundary of one of the at least one first planar layer joins the first boundary of the second planar layer,
   wherein the second layer comprises a core structural material and a shell structural material, wherein both the core and shell structural materials are located at the first boundary of the second layer;
   wherein the core structural material has side walls and has a planar intermediate surface that is located between, and parallel to, the first and second boundaries of the second layer, wherein the core structural material is bounded by the shell structural material located between the core structural material and the second boundary of the second layer and is also bounded along at least a portion of core structural material sides by the shell structural material,
   wherein the shell structural material on the sides of the core structural material is not planarized at a level that is coplanar with the intermediate surface,
   wherein the core structural material and the shell structural material are different materials, and
   wherein both the core structural material and the shell structural materials comprise metals.

2. The spring probe of claim 1 additionally comprising a second tip that is joined to the body portion on an opposite side relative to the first tip.

3. The spring probe of claim 1 wherein the at least one first layer comprises a first structural material which is the same material as the shell structural material.

4. The spring probe of claim 1 wherein the at least one first layer comprises at least two first layers that are joined to one another.

5. The spring probe of claim 1 wherein the bounding along at least a portion of the core structural material sides provides full encapsulation of the sides of the core structural material.

6. The spring probe of claim 1 wherein the first tip and the body portion, as a whole, additionally comprise at least one third planar layer of structural material with at least one of the at least one third planar layer of structural material joined to the second boundary of the second layer.

7. The spring probe of claim 1 wherein the shell structural material comprises an electrodeposited material.

8. The spring probe of claim 1 wherein the core structural material comprises an electrodeposited material.

9. The spring probe of claim 1 wherein the core structural material comprises a material selected from the group consisting of: (1) nickel (Ni), (2) copper (Cu), (3) beryllium copper (BeCu), (4) nickel phosphor (Ni—P), (5) tungsten (W), (6) aluminum copper (Al—Cu), (7) steel, (8) P7 alloy, (9) palladium, (10) molybdenum, (11) manganese, (12) brass, (13) chrome, (14) chromium copper (Cr—Cu), (15) gold (Au), (16) silver (AG), (17) nickel-cobalt (Ni—Co), (18) palladium-cobalt (Pd—Co), and (19) tin (Sn), and
   wherein the shell structural material comprises a material selected from the group consisting of: (1) nickel (Ni), (2) copper (Cu), (3) beryllium copper (BeCu), (4) nickel phosphor (Ni—P), (5) tungsten (W), (6) aluminum copper (Al—Cu), (7) steel, (8) P7 alloy, (9) palladium, (10) molybdenum, (11) manganese, (12) brass, (13) chrome, (14) chromium copper (Cr—Cu), (15) gold (Au), (16) silver (AG), (17) nickel-cobalt (Ni—Co), (18) palladium-cobalt (Pd—Co), and (19) tin (Sn).

10. A spring probe for use as an electronic contact element, comprising:
    a) a first tip; and
    b) a body portion joined with the first tip wherein at least a portion of the body portion provides spring compliance when the first tip contacts an electronic component;

wherein the first tip and the body portion, as a whole, comprise at least one first planar layer joined to a second planar layer, the first planar layer has a first and a second planar boundary separated by a thickness of the first planar layer, wherein the second planar layer has a first and second planar boundary separated by a thickness of the second layer, and wherein each of the first and second boundaries are substantially planar and parallel to one another, wherein a boundary of one of the at least one first planar layer joins the first boundary of the second planar layer, wherein the second layer comprises at least one core structural material and at least one shell structural material wherein, at least one of the at least one core structural material and at least one of the at least one shell structural material are located at the first boundary of the second layer;

wherein at least one of the at least one core structural material has side walls and has a planar intermediate surface that is located between, and parallel to, the first and second boundaries of the second layer, wherein at least one of the at least one core structural material is bounded by at least one of the at least one shell structural material that is located between the core structural material and the second boundary of the second layer and is also bounded along at least a portion of core structural material sides by at least one of the at least one shell structural material, wherein the at least one shell structural material on the sides of the core structural material is not planarized at a level that is coplanar with the intermediate surface, and wherein both the core structural material and the shell structural materials comprise metals.

11. The spring probe of claim 10 additionally comprising a second tip that is joined to the body portion on an opposite side relative to the first tip.

12. The spring probe of claim 10 wherein the at least one first layer comprises a first structural material which is the same material as at least one of the at least one shell structural material.

13. The spring probe of claim 10 wherein the at least one first layer comprises at least two first layers that are joined to one another.

14. The spring probe of claim 10 wherein the bounding along at least a portion of at least one of the at least one core structural material provides full encapsulation of the sides of the at least one of the at least one core structural material.

15. The spring probe of claim 10 wherein the first tip and the body portion, as a whole, additionally comprise at least one third planar layer of structural material with at least one of the at least one third planar layer of structural material joined to the second boundary of the second layer.

16. The spring probe of claim 10 wherein the shell structural material comprises an electrodeposited material.

17. The spring probe of claim 10 wherein the core structural material comprises an electrodeposited material.

18. The spring probe of claim 10 wherein the core structural material comprises a material selected from the group consisting of: (1) nickel (Ni), (2) copper (Cu), (3) beryllium copper (BeCu), (4) nickel phosphor (Ni—P), (5) tungsten (W), (6) aluminum copper (Al—Cu), (7) steel, (8) P7 alloy, (9) palladium, (10) molybdenum, (11) manganese, (12) brass, (13) chrome, (14) chromium copper (Cr-Cu), (15) gold (Au), (16) silver (AG), (17) nickel-cobalt (Ni—Co), (18) palladium-cobalt (Pd—Co), and (19) tin (Sn), and
  wherein the shell structural material comprises a material selected from the group consisting of: (1) nickel (Ni), (2) copper (Cu), (3) beryllium copper (BeCu), (4) nickel phosphor (Ni—P), (5) tungsten (W), (6) aluminum copper (Al—Cu), (7) steel, (8) P7 alloy, (9) palladium, (10) molybdenum, (11) manganese, (12) brass, (13) chrome, (14) chromium copper (Cr-Cu), (15) gold (Au), (16) silver (AG), (17) nickel-cobalt (Ni—Co), (18) palladium-cobalt (Pd—Co), and (19) tin (Sn).

* * * * *